US010050142B2

(12) United States Patent
Nakayama et al.

(10) Patent No.: US 10,050,142 B2
(45) Date of Patent: *Aug. 14, 2018

(54) SEMICONDUCTOR DEVICE AND A METHOD FOR MANUFACTURING A SEMICONDUCTOR DEVICE

(71) Applicant: Renesas Electronics Corporation, Tokyo (JP)

(72) Inventors: Tatsuo Nakayama, Tokyo (JP); Hironobu Miyamoto, Tokyo (JP); Ichiro Masumoto, Tokyo (JP); Yasuhiro Okamoto, Tokyo (JP); Shinichi Miyake, Tokyo (JP); Hiroshi Kawaguchi, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/789,191

(22) Filed: Oct. 20, 2017

(65) Prior Publication Data

US 2018/0061983 A1 Mar. 1, 2018

Related U.S. Application Data

(60) Continuation of application No. 15/632,663, filed on Jun. 26, 2017, now Pat. No. 9,831,339, which is a (Continued)

(30) Foreign Application Priority Data

Aug. 29, 2014 (JP) .................................. 2014-176367

(51) Int. Cl.
*H01L 29/06* (2006.01)
*H01L 29/78* (2006.01)
(Continued)

(52) U.S. Cl.
CPC ...... *H01L 29/7827* (2013.01); *H01L 29/2003* (2013.01); *H01L 29/4236* (2013.01)

(58) Field of Classification Search
CPC ............. H01L 29/7783; H01L 29/7827; H01L 29/1083; H01L 29/207; H01L 29/2003; H01L 29/4236; H01L 29/66462
(Continued)

(56) References Cited

U.S. PATENT DOCUMENTS 9,722,062 B2 * 8/2017 Nakayama .......... H01L 29/7783
2008/0087915 A1 4/2008 Uemto et al.
(Continued)

FOREIGN PATENT DOCUMENTS

JP 2010-109086 A 5/2010
JP 2013-74068 A 4/2013

OTHER PUBLICATIONS

Communication dated Jan. 16, 2018 from the Japanese Patent Office in counterpart application No. 2014-176367.

*Primary Examiner* — Brook Kebede
(74) *Attorney, Agent, or Firm* — Sughrue Mion, PLLC

(57) ABSTRACT

The characteristics of a semiconductor device are improved. A semiconductor device has a potential fixed layer containing a p type impurity, a channel layer, and a barrier layer, formed over a substrate, and a gate electrode arranged in a trench penetrating through the barrier layer, and reaching some point of the channel layer via a gate insulation film. Source and drain electrodes are formed on opposite sides of the gate electrode. The p type impurity-containing potential fixed layer has an inactivated region containing an inactivating element such as hydrogen between the gate and drain electrodes. Thus, while raising the p type impurity (acceptor) concentration of the potential fixed layer on the source electrode side, the p type impurity of the potential fixed layer is inactivated on the drain electrode side. This can improve (Continued)

the drain-side breakdown voltage while providing a removing effect of electric charges by the p type impurity.

12 Claims, 65 Drawing Sheets

Related U.S. Application Data division of application No. 14/837,053, filed on Aug. 27, 2015, now Pat. No. 9,722,062.

(51) Int. Cl.
*H01L 29/423* (2006.01)
*H01L 29/20* (2006.01)

(58) Field of Classification Search
USPC .............................................. 257/20, 77–100
See application file for complete search history.

(56) References Cited

U.S. PATENT DOCUMENTS

| | | |
|---|---|---|
| 2012/0068227 A1 | 3/2012 | Hikita et al. |
| 2013/0075750 A1 | 3/2013 | Minoura |

* cited by examiner

SEMICONDUCTOR DEVICE AND A METHOD FOR MANUFACTURING A SEMICONDUCTOR DEVICE

CROSS-REFERENCE TO RELATED APPLICATIONS

This application is a Continuation of U.S. application Ser. No. 15/632,663, filed Jun. 26, 2017, which is a Divisional of U.S. application Ser. No. 14/837,053, filed Aug. 27, 2017, now U.S. Pat. No. 9,722,062, which claims priority to Japanese Patent Application No. 2014-176367 filed Aug. 29, 2014, the contents of all of which are incorporated herein by reference.

BACKGROUND

The present invention relates to a semiconductor device, and is preferably applicable to, for example, a semiconductor device using a nitride semiconductor.

In recent years, attention has been paid to semiconductor devices each using a III-V group compound having a larger bandgap than that of silicon (Si). Among them, a MISFET using gallium nitride (GaN) has advantages such as 1) large breakdown electric field, 2) large saturated electron velocity, 3) large thermal conductivity, 4) being able to form a favorable hetero junction between AlGaN and GaN, and 5) being a nontoxic and high-safety material.

For example, in Patent Document 1 (Japanese Unexamined Patent Application Publication No. 2010-109086), there is disclosed a nitride semiconductor device in which a p-GaN layer is arranged under a channel layer formed of an undoped GaN layer. Then, the p-GaN layer is electrically coupled with a source electrode, thereby to achieve a high avalanche resistance and high reliability.

Patent Document

[Patent Document 1]
Japanese Unexamined Patent Application Publication No. 2010-109086

SUMMARY

The present inventors have been involved in research and development of the semiconductor devices using a nitride semiconductor as described above, and have conducted a close study on the improvement of the characteristics. During the process thereof, it has been proved that there is room for further improvement of the characteristics of the semiconductor device using a nitride semiconductor.

Other objects and novel features will be apparent from the description of this specification and the accompanying drawings.

Summaries of the representative ones of the embodiments disclosed in the present application will be described in brief as follows.

A semiconductor device shown in one embodiment disclosed in the present application has a potential fixed layer containing an impurity, and a gate electrode. Then, on the opposite sides of the gate electrode, there are formed a source electrode and a drain electrode, respectively. The potential fixed layer including an impurity has an inactivated region containing an inactivating element such as hydrogen between the gate electrode and the drain electrode.

A method for manufacturing a semiconductor device shown in one embodiment disclosed in the present application has a step of forming a potential fixed layer containing an impurity, and a gate electrode. Then, the method has a step of introducing an inactivating element into the potential fixed layer situated on one side of the gate electrode. Further, the method has a step of forming a source electrode over the potential fixed layer on the other side of the gate electrode, and forming a drain electrode over the potential fixed layer on the one side.

In accordance with the semiconductor devices shown in the following representative embodiments disclosed in the present application, it is possible to improve the characteristics of the semiconductor devices.

In accordance with the methods for manufacturing a semiconductor device shown in the following representative embodiments disclosed in the present application, it is possible to manufacture a semiconductor device having favorable characteristics.

DETAILED DESCRIPTION

Figure 1:
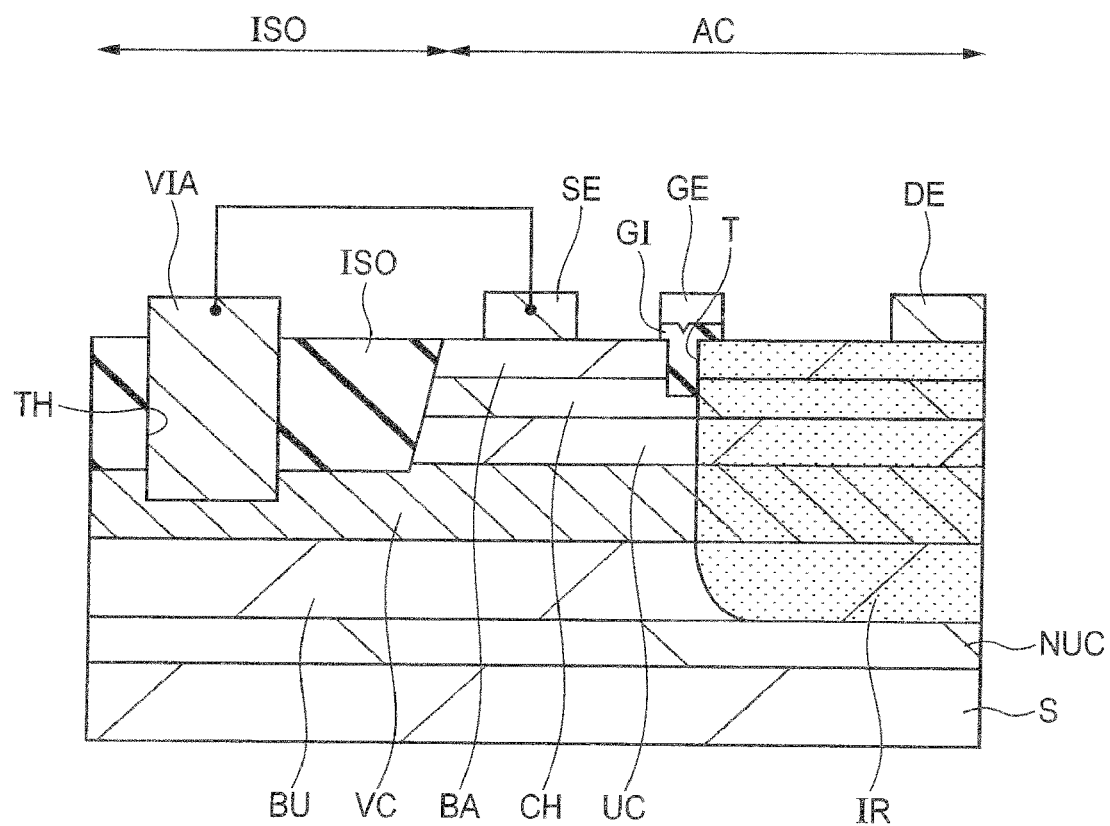
FIG. 1 is a cross sectional view schematically showing a configuration of a semiconductor device of First Embodiment.

In description of the following embodiment, the embodiment may be described in a plurality of divided sections or embodiments for convenience, if required. However, unless otherwise specified, these are not independent of each other, but are in a relation such that one is a modification example, an applied example, a detailed description, complementary explanation, or the like of a part or the whole of the other. Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, or except for other cases.

Further, in the following embodiments, the constitutional elements (including element steps, or the like) are not always essential, unless otherwise specified, except for the case where they are apparently considered essential in principle, or except for other cases. Similarly, in the following embodiments, when a reference is made to the shapes, positional relationships, or the like of the constitutional elements, or the like, it is assumed that they include ones substantially analogous or similar to the shapes or the like, unless otherwise specified, unless otherwise considered apparently in principle, or except for other cases. This also applies to the foregoing numbers and the like (including numbers, numerical values, ranges, and the like).

Below, embodiments will be described in details by reference to the accompanying drawings. Incidentally, in all the drawings for describing the following embodiments, the members having the same function are given the same or related reference signs and numerals, and a repeated description thereon is omitted. Further, when a plurality of similar members (portions) are present, a sign may be added to a generic reference numeral to denote an individual or specific portion. Further, in the following embodiments, unless particularly necessary, the same or similar portions will not be repeatedly described.

Further, in the accompanying drawings used in embodiments, hatching may be omitted even in a cross sectional view for ease of understanding of the drawings. Whereas, hatching may be added even in a plan view for ease of understanding of the drawings.

Further, in a cross sectional view and a plan view, the dimensions of each part are not intended to correspond to those of an actual device. For ease of understanding of the drawing, a specific part may be shown on a relatively larger scale. Further, also when a cross sectional view and a plan view correspond to each other, for ease of understanding of the drawings, a specific part may be shown on a relatively larger scale.

First Embodiment

Below, with reference to the accompanying drawings, a semiconductor device of the present embodiment will be described in details.

[Structure Description]

FIG. 1 is a cross sectional view schematically showing a configuration of a semiconductor device of the present embodiment. The semiconductor device (semiconductor element) of the present embodiment shown in FIG. 1, or the like is a MIS (Metal Insulator Semiconductor) type FET (Field Effect Transistor) using a nitride semiconductor. The semiconductor device can be used as a HEMT (High Electron Mobility Transistor) type power transistor. The semiconductor device of the present embodiment is a so-called recess gate type semiconductor device.

In the semiconductor device of the present embodiment, over a substrate S, there are sequentially formed a nucleation layer NUC, a buffer layer BU, a potential fixed layer VS, a channel base layer UC, a channel layer (also referred to as an electron transit layer) CH, and a barrier layer BA. The nucleation layer NUC is formed of a nitride semiconductor layer. The buffer layer BU is formed of a single layered or multilayered nitride semiconductor layer doped with an impurity for forming a deep level in a nitride semiconductor. Herein, there is used a superlattice structure (also referred to as a superlattice layer) formed of a multilayered nitride semiconductor layer. The potential fixed layer VC is formed of a nitride semiconductor layer doped with an impurity to produce a p type with respect to a nitride semiconductor, and has a conductivity. The channel base layer UC is formed of a nitride semiconductor layer smaller in electron affinity than the channel layer CH, and smaller in average lattice constant in the substrate surface direction than the channel layer CH. The channel layer CH is formed of a nitride semiconductor layer larger in electron affinity than the channel base layer UC. The barrier layer BA is formed of a nitride semiconductor layer smaller in electron affinity than the channel layer CH, and smaller in electron affinity than the channel base layer UC. Over the barrier layer BA, there is formed an insulation film (not shown). Incidentally, a cap layer may be provided between the insulation film (protective film) and the barrier layer BA. The cap layer s formed of a nitride semiconductor layer larger in electron affinity than the barrier layer BA.

The MISFET of the present embodiment has a gate electrode GE formed over the the channel layer CH via a gate insulation film GI, and a source electrode SE and a drain electrode DE formed over the barrier layer BA on the opposite sides of the gate electrode GE, respectively. The MISFET is formed in an active region AC defined by isolation regions ISO. Further, the gate electrode GE is formed in the inside of a trench T penetrating through the barrier layer BA, and reaching some point of the channel layer CH via the gate insulation film GI.

On the channel layer CH side in the vicinity of the interface between the channel layer CH and the barrier layer BA, there is formed a two-dimensional electron gas (2DEG). Whereas, when the gate electrode GE is applied with a positive potential (threshold potential), a channel is formed in the vicinity of the interface between the gate insulation film GI and the channel layer CH.

The two-dimensional electron gas (2DEG) is formed by the following mechanism. The nitride semiconductor layers (herein, gallium nitride type semiconductor layers) forming the channel layer CH and the barrier layer BA respectively have different electron affinities (forbidden band widths (bandgaps)). The barrier layer BA is formed of a nitride semiconductor layer smaller in electron affinity than the channel layer CH. For this reason, at the junction surface of the semiconductor layers, there is formed a well type potential. The accumulation of electrons in the well type potential results in the formation of the two-dimensional electron gas (2DEG) in the vicinity of the interface between the channel layer CH and the barrier layer BA. Particularly, herein, the channel layer CH and the barrier layer BA are epitaxially formed with a gallium (or aluminum) plane grown nitride semiconductor material. For this reason, positive fixed polarization charges are generated at the interface between the channel layer CH and the barrier layer BA. Thus, electrons are accumulated in order to neutralize the positive polarization charges. Accordingly, the two-dimensional electron gas (2DEG) becomes more likely to be formed.

Then, the two-dimensional electron gas (2DEG) formed in the vicinity of the interface between the channel layer CH and the barrier layer BA is divided by the trench T including the gate electrode GE formed therein. For this reason, in the semiconductor device of the present embodiment, with the gate electrode GE not applied with a positive potential (threshold potential), the OFF state can be kept; and with the gate electrode GE applied with a positive potential (threshold potential), the ON state can be kept. Thus, the normally off operation can be performed. Incidentally, in the ON state and the OFF state, the potential of the source electrode SE is, for example, the ground potential.

Further, the channel layer CH is interposed between the barrier layer BA and the channel base layer UC smaller in electron affinity than the channel layer CH, resulting in an improvement of the electron confining effect. This enables the suppression of the short channel effect, the amplification factor improvement, and the improvement of the operation speed. Further, when the channel base layer UC undergoes a tensile strain, to be strained, negative charges due to the piezo polarization and the spontaneous polarization are induced at the interface between the channel base layer UC and the channel layer CH. Accordingly, the threshold potential moves to the positive side. This can improve the normally off operation property. Whereas, when the strain of the channel base layer UC is relaxed, negative charges due to the spontaneous polarization are induced at the interface between the channel base layer UC and the channel layer CH. Accordingly, the threshold potential moves to the positive side. This can improve the normally off operation property.

Herein, in the present embodiment, in the isolation region ISO, there is provided a coupling part (also referred to as a via) VIA penetrating through the isolation region ISO, and reaching the underlying potential fixed layer VC. The coupling part VIA is electrically coupled with the source electrode SE. Thus, the potential fixed layer VC is provided, and coupled with the source electrode SE. As a result, it is possible to reduce the fluctuations in characteristics such as the threshold potential and the ON resistance.

Further, in the present embodiment, the coupling part VIA in the through hole TH is arranged in the isolation region ISO outside the active region AC in which electrons are conducted, and under the formation region of the source pad SP. As a result, it is possible to implement miniaturization and high integration of semiconductor devices. Further, it is possible to ensure a large active region AC in which electrons can be conducted. For this reason, it is possible to reduce the ON resistance per unit area.

Further, in the present embodiment, an inactivated region IR is provided between the gate electrode GE and the drain electrode DE. The inactivated region IR reaches the potential fixed layer VC in the depth direction. Thus, the potential fixed layer VC doped with an impurity to produce a p type situated between the gate electrode GE and the drain electrode DE is inactivated by doping with an inactivating element, to be the inactivated region IR. As a result, it is possible to improve the drain breakdown voltage.

The p type potential fixed layer VC situated between the gate electrode GE and the drain electrode DE contains an inactivating element. Then, the content of the inactivating element of the p type potential fixed layer VC situated between the gate electrode GE and the drain electrode DE is larger than the content of the inactivating element of the p type potential fixed layer VC situated under the source electrode SE. The inactivating element is, for example, hydrogen (H) or fluorine (F).

Herein, inactivation indicates the ratio of the density of the acceptor to the density of the impurity to produce a p type. The activation ratio of the inactivated region IR is smaller than, and is preferably set at 1/10 or less the activation ratio of the region under the source electrode SE. In other words, in the potential fixed layer VC, the activation ratio of the potential fixed layer situated under the drain electrode (also referred to as a drain-side potential fixed layer) VC is smaller than, and is preferably 1/10 or less the activation ratio of the potential fixed layer situated under the source electrode (also referred to as a source-side potential fixed layer) VC. As described later, when as the potential fixed layer VC, there is used a gallium nitride layer epitaxially grown while being doped with magnesium (Mg) which is a p type impurity, the p type impurity is roughly uniformly introduced into the potential fixed layer VC. Then, an inactivating element such as hydrogen (H) is ion-implanted into the drain-side potential fixed layer VC. As a result, the drain-side potential fixed layer VC is inactivated. In such a case, also in the drain-side potential fixed layer VC, a Mg element which is a p type impurity is introduced at a density comparable to that of the source side, but ceases to contribute as an acceptor under the influence of H which is an inactivating element. Thus, in the drain-side potential fixed layer VC, the ratio of the density of the acceptor to the density of the impurity to produce a p type is lower than that of the source side. The activation ratio can be estimated by measuring, for example, the voltage dependency of the capacitance (CV).

Figure 2:
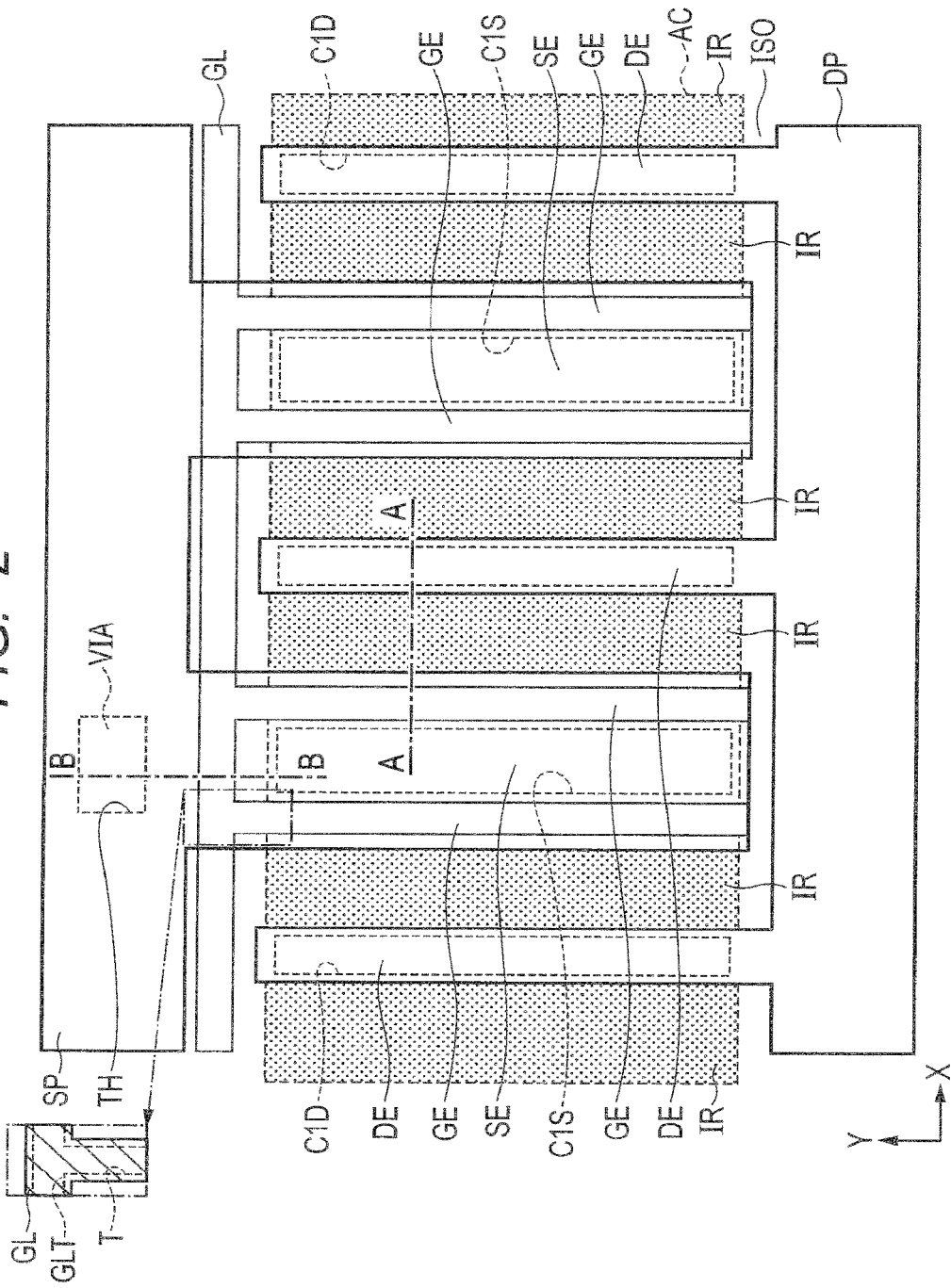
FIG. 2 is a plan view showing a configuration of the semiconductor device of First Embodiment.
Figure 3:
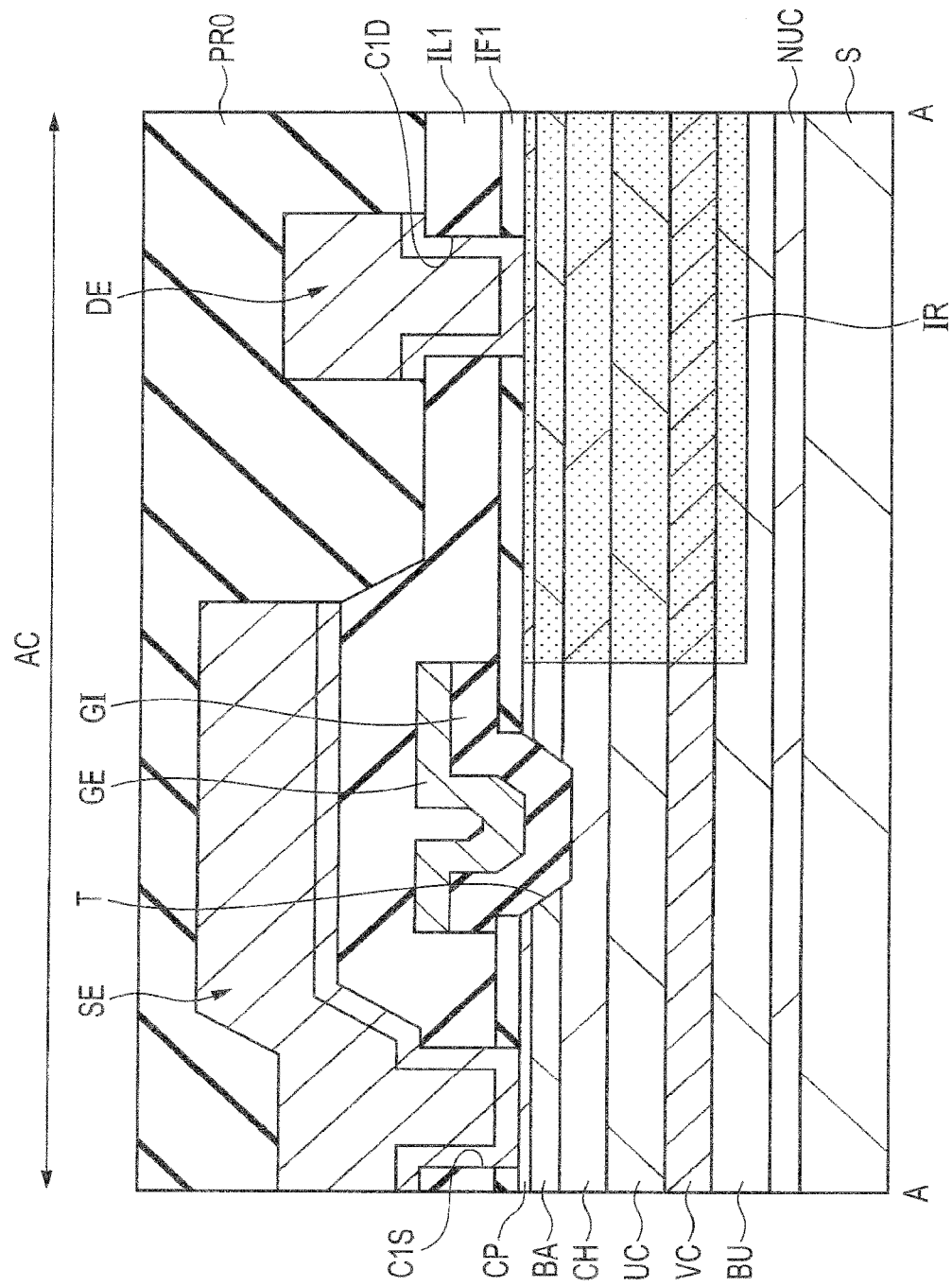
FIG. 3 is a cross sectional view showing a configuration of the semiconductor device of First Embodiment.
Figure 4:
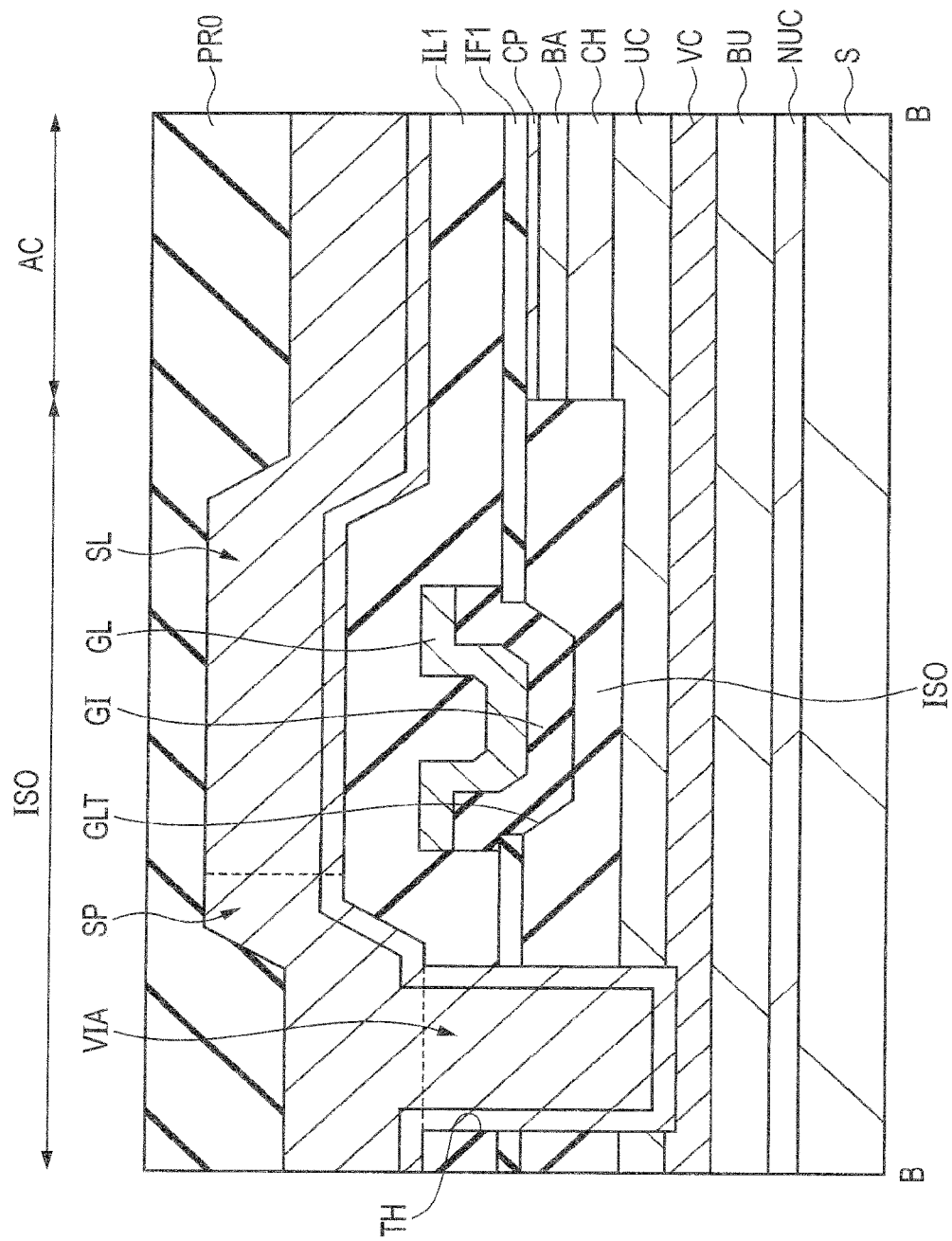
FIG. 4 is a cross sectional view showing a configuration of the semiconductor device of First Embodiment.

With reference to FIGS. 2 to 4, the semiconductor device of the present embodiment will be further described in details. FIG. 2 is a plan view showing a configuration of the semiconductor device of the present embodiment. FIGS. 3 and 4 are each a cross sectional view showing a configuration of the semiconductor device of the present embodiment. FIG. 3 corresponds to a cross section along A-A of FIG. 2. FIG. 4 corresponds to a cross section along B-B of FIG. 2.

As shown in FIG. 2, the planar shape of the drain electrode DE is a rectangular shape having long sides in the Y direction. A plurality of drain electrodes DE each in a line shape are arranged at a given interval in the X direction. Whereas, the planar shape of the source electrode SE is a rectangular shape having long sides in the Y direction. A plurality of source electrodes SE each in a line shape are arranged at a given interval in the X direction. Then, the plurality of source electrodes SE and the plurality of drain electrodes DE are alternately arranged along the X direction, respectively.

Under the drain electrode DE, there is arranged a contact hole C1D serving as the coupling part between the drain electrode DE and the cap layer CP (barrier layer BA). The planar shape of the contact hole C1D is a rectangular shape having long sides in the Y direction. Under the source electrode SE, there is arranged a contact hole C1S serving as the coupling part between the source electrode SE and the cap layer CP (barrier layer BA). The planar shape of the contact hole C1S is a rectangular shape having long sides in the Y direction.

Then, between the contact hole C1D under the drain electrode DE and the contact hole C1S under the source electrode SE, there is arranged a gate electrode GE. The gate electrode GE has a rectangular shape having long sides in the Y direction. Under one source electrode SE, there are arranged two (a pair of) gate electrodes GE. The two gate electrodes GE are arranged on the opposite sides of the contact hole C1S under the source electrode SE, respectively. Thus, two gate electrodes GE are repeatedly arranged for each of the plurality of source electrodes SE.

The plurality of drain electrodes DE are coupled by a drain pad (also referred to as a terminal part) DP. The drain pad DP is arranged in such a manner as to extend in the X direction on one end side of the drain electrode DE (the lower side in FIG. 2). In other words, a plurality of drain electrodes DE are arranged in such a manner as to protrude in the Y direction from the drain pad DP extending in the X direction. Such a shape may be referred to as a comb shape.

The plurality of source electrodes SE are coupled by a source pad (also referred to as a terminal part) SP. The source pad SP is arranged in such a manner as to extend in the X direction on the other end side of the source electrode SE (the upper side in FIG. 2). In other words, the plurality of source electrodes SE are arranged in such a manner as to project in the Y direction from the source pad SP extending in the X direction. Such a shape may be referred to as a comb shape.

The plurality of gate electrodes GE are coupled by a gate line GL. The gate line GL is arranged in such a manner as to extend in the X direction on one end side of the gate electrode GE (the upper side in FIG. 2). In other words, the plurality of gate electrodes GE are arranged in such a manner as to protrude in the Y direction from the gate line GL extending in the X direction. Incidentally, the gate line GL is coupled with, for example, the gate pads (not shown) provided on the opposite sides of the gate line GL in the X direction (the right side and the left side in FIG. 2).

Herein, the source electrode SE, the drain electrode DE, and the gate electrode GE are mainly arranged over the active region AC surrounded by the isolation regions ISO. The planar shape of the active region AC is a rectangular shape having long sides in the X direction (see FIG. 8). On the other hand, the drain pad DP, the gate line GL, and the source pad SP are formed over the isolation region ISO. Between the active region AC and the source pad SP, there is arranged the gate line GL.

Then, under the source pad SP, there is arranged a through hole (also referred to as a hole, opening, or concave part) TH. A conductive film is embedded in the through hole TH, and forms a coupling part VIA. As described later, the coupling part VIA is electrically coupled with the potential fixed layer VC. Accordingly, the source electrode SE and the potential fixed layer VC are electrically coupled with each other via the source pad SP and the coupling part VIA.

Herein, in the present embodiment, an inactivated region IR is provided between the gate electrode GE and the drain electrode DE. The inactivated region IR is a region doped with an element (an inactivating element) for inactivating the impurity in the potential fixed layer VC. Incidentally, the inactivated region IR also extends under the drain electrode DE (see FIG. 17).

As shown in FIGS. 3 and 4, the MISFET of the present embodiment has the gate electrode GE formed over the active region AC of the substrate S, and the source electrode SE and the drain electrode DE formed over the cap layer CP on the opposite sides of the gate electrode GE, and in the formation regions of the contact holes (C1S and C1D), respectively. Over the source electrode SE and the drain electrode DE, there is arranged a protective film (also referred to as an insulation film, a covering film, or a surface protective film) PRO.

Over the substrate S, as described previously, there are sequentially formed the nucleation layer NUC, the buffer layer BU, the potential fixed layer VC, the channel base layer UC, the channel layer (also referred to as an electron transit layer) CH, the barrier layer BA, the cap layer CP, and the insulation film IF1. Then, the gate electrode GE is formed in the inside of a trench T penetrating through the insulation film IF1, the cap layer CP, and the barrier layer BA, and reaching some point of the channel layer CH via the gate insulation film GI.

As the substrate S, there can be used a semiconductor substrate formed of, for example, silicon (Si). As the substrate S, there may be used a substrate formed of a nitride semiconductor such as GaN other than the silicon, or there may be used a substrate formed of AlN, SiC, sapphire, or the like. Especially, when a nitride semiconductor layer such as a GaN layer is formed over a silicon substrate, the buffer layer BU is often used as described later in order to improve the crystallinity thereof, or to relax the strain (internal stress) of the substrate. Accordingly, accumulation of electric charges described later tends to occur. For this reason, when a silicon substrate and a nitride semiconductor are used in combination, the semiconductor device of the present embodiment is effectively used.

The nucleation layer NUC is formed in order to generate the crystalline nucleus for the growth of a layer to be formed thereover such as the buffer layer BU. Further, the nucleation layer NUC is formed in order to prevent the deterioration of the substrate S due to diffusion of the constituent elements (such as Ga) of the layer formed thereover into the substrate S from the layer formed thereover. As the nucleation layer NUC, there can be used, for example, an aluminum nitride (AlN) layer. The film thickness of the AlN layer is about 200 nm. The material and the thickness of the nucleation layer NUC can be appropriately selected according to the material for the substrate S, or the use of the semiconductor device. Alternatively, the nucleation layer NUC can be omitted when a GaN substrate or the like is used as the substrate S, or when not necessary according to the deposition conditions for the buffer layer or the like.

The buffer layer BU is formed in order to adjust the lattice constant, to make favorable the crystallinity of the nitride semiconductor to be formed thereover, and to relax the film stress of the nitride semiconductor to be stacked. This improves the crystallinity of the nitride semiconductor. Further, the strain (internal stress) of the substrate S can be relaxed, so that the substrate S can be inhibited from undergoing warpage or cracks. As the buffer layer BU, there can be used a superlattice structure in which lamination films (AlN/GaN films) each of a gallium nitride (GaN) layer and an aluminum nitride (AlN) layer are deposited a plurality of cycles. The superlattice structure includes two or more laminates of nitride semiconductor layers having different electron affinities repeatedly arranged therein. The superlattice structure is doped with carbon (C). For example, the film thickness of the GaN layer is set at about 20 nm, and the film thickness of the AlN layer is set at about 5 nm. There can be used a superlattice structure including the lamination films deposited 80 cycles. The carbon concentration (dope amount) is, for example, about $1\times10^{19}$ (1E19) $cm^{-3}$. However, the material and the thickness of each film forming the lamination film may be appropriately selected according to the use of the semiconductor device. Further, the buffer layer BU may include a layer other than the superlattice structure. For example, another material film may be formed over the superlattice structure. Alternatively, as the buffer layer BU, there can also be used a single layer film not including a superlattice structure, or the like.

As the materials for the superlattice structure and the single layer film, InN can be used other than AlN and GaN. Alternatively, a mixed crystal of the nitride semiconductors may also be used. For example, as the lamination film of a superlattice structure, an AlGaN/GaN film can be used other than an AlN/GaN film. Whereas, as the monolayer film, there can be used, for example, an AlGaN layer or an InAlN layer.

Further, in the foregoing description, the superlattice structure is doped therein with carbon. However, other doping impurities may be used. As the doping impurities, elements forming a deep level are preferable. Other than carbon, there may be used a transition metal such as iron (Fe), magnesium (Mg), beryllium (Be), or the like. The dope amount and the impurity element may be appropriately selected according to the use of the semiconductor device.

As the potential fixed layer VC, there may be used, for example, a GaN layer doped with an impurity. Other than the GaN layer, there may also be used an AlN layer, an InN layer, or an AlGaN layer. Alternatively, a mixed crystal of the nitride semiconductors may be used.

The potential fixed layer VC is doped with an impurity, and has a conductivity. For example, as the potential fixed layer VC, there can be used a GaN layer doped with Mg in an amount of about $5\times10^{18}$ (5E18) $cm^{-3}$ as an impurity. The film thickness of the potential fixed layer VC is about 200 nm.

Thus, an impurity is required to be doped in an amount sufficient to cause the conductivity (e.g., with the layer structure of the present embodiment, the dope amount is $5\times10^{16}$ (5E16) $cm^{-3}$ or more in terms of the activated impurity concentration). As the doping impurity, there can be used a p type impurity. As the p type impurity, for example, mention may be made of Be, C, or Mg. Whereas, from the viewpoint of the longitudinal breakdown voltage, the dope amount of the impurity is preferably $1\times10^{18}$ (1E18) $cm^{-3}$ or less in terms of the activated impurity concentration. For example, in the layer structure of the present embodiment, in order to ensure 500 V or more as the longitudinal breakdown voltage, the dope amount is preferably set at $5\times10^{17}$ (5E17) $cm^{-3}$ or less in terms of the activated impurity concentration.

As the channel base layer UC, there can be used, for example, an AlGaN layer. The channel base layer UC is not subjected to intentional impurity doping therein. Incidentally, the formation of a deep level by impurity doping causes fluctuations in characteristics such as the threshold potential as described in details later. Accordingly, the dope amount of the impurity is preferably $1\times10^{16}$ (1E16) $cm^{-3}$ or less.

Whereas, the thickness of the AlGaN layer is, for example, 1000 nm, and the composition of Al is about 3%. As the channel base layer UC, other than an AlGaN layer, there can be used an InAlN layer, or the like.

Further, in the present embodiment, the lattice constant in the in-plane direction of the channel base layer UC is taken over to the channel layer CH and the barrier layer BA thereover by epitaxial growth. For example, when at a layer over the channel base layer UC, there is formed a layer having a larger lattice constant than that of the channel base layer (AlGaN layer) UC such as a GaN layer, an $In_XGa_{(1-X)}N$ layer ($0 \leq X \leq 1$), or an InAlN layer, the overlying layer is applied with a compressive strain. Conversely, when at a layer over the channel base layer UC, there is formed a layer having a smaller lattice constant than that of the channel base layer (AlGaN layer) UC such as an InAlN layer with a high Al composition ratio, the overlying layer is applied with a tensile strain.

As the channel layer CH, there can be used, for example, a GaN layer. The channel layer CH is not subjected to intentional impurity doping therein. Whereas, the thickness of the GaN layer is, for example, about 80 nm. As the materials for the channel layer CH, other than GaN, there can be used AlN, InN, and the like. Alternatively, a mixed crystal of the nitride semiconductors may be used. The material and the thickness of the channel layer CH can be appropriately selected according to the use of the semiconductor device. Incidentally, in the present embodiment, the nondoped channel layer CH was used. However, an impurity may be appropriately doped according to the use. As the doping impurity, there can be used an n type impurity or a p type impurity. Examples of the n type impurity may include Si, S, and Se. Examples of the p type impurity may include Be, C, and Mg.

However, the channel layer CH is a layer in which electrons run. For this reason, when the dope amount of the impurity is too large, the mobility may be reduced by the Coulomb scattering. Thus, the dope amount of the impurity into the channel layer CH is preferably $1\times10^{17}$ (1E17) $cm^{-3}$ or less.

Further, for the channel layer CH, it is necessary to use a nitride semiconductor larger in electron affinity than the channel base layer UC or the barrier layer BA. As described above, as the channel base layer UC, there is used an AlGaN layer, and as the channel layer CH, there is used a GaN layer. Thus, when the lattice constants of the layers are different, the film thickness of the channel layer CH is required to be equal to, or smaller than the critical film thickness from which dislocation increases.

As the barrier layer BA, there can be used, for example, an $Al_{0.2}Ga_{0.8}N$ layer. Whereas, the thickness of the $Al_{0.2}Ga_{0.8}N$ layer is, for example, about 30 nm. As the materials for the barrier layer BA, other than the AlGaN layer, there may be used an InAlN layer, and the like. The composition ratio of Al, or the like may be appropriately adjusted. Alternatively, there may also be used a barrier layer BA of a multilayer structure resulting from lamination of films having different Al composition ratios. Further, as the materials for the barrier layer BA, there can be used a GaN layer, an AlN layer, an InN layer, and the like. Alternatively, a mixed crystal of the nitride semiconductors may be used. The material and the thickness of the barrier layer BA, and the like can be appropriately selected according to the use of the semiconductor device. Incidentally, as the barrier layer BA, there may be used a nondoped layer, and an impurity may be appropriately doped according to the use. As the doping impurity, there can be used an n type impurity or a p type impurity. Examples of the n type impurity may include Si, S, and Se. Examples of the p type impurity may include Be, C, and Mg. However, when the dope amount of the impurity in the barrier layer BA is too large, in the vicinity of the gate electrode GE described later, the device becomes more likely to be affected by the potential of the drain electrode DE. This may result in a reduction of the breakdown voltage. Further, the impurity in the barrier layer BA may cause the Coulomb scattering in the channel layer CH. This may result in a reduction of the mobility of electrons. Thus, the dope amount of the impurity into the barrier layer BA is preferably $1\times10^{17}$ (1E17) cm$^{-3}$ or less. Further, it is more preferable to use a nondoped barrier layer BA.

Further, as the channel layer CH, there is used a GaN layer, and as the barrier layer BA, there is used an AlGaN layer. Thus, when the lattice constants of the layers are different, the film thickness of the barrier layer BA is required to be equal to, or smaller than the critical film thickness from which dislocation increases.

Further, as described previously, as the barrier layer BA, it is necessary to use a nitride semiconductor smaller in electron affinity than the channel layer CH. However, when a barrier layer BA of a multilayer structure is used, the multilayer may include therein a layer larger in electron affinity than the channel layer CH. It is essential only that at least one layer or more is a layer smaller in electron affinity than the channel layer CH.

As the cap layer CP, there can be used, for example, a GaN layer. The thickness of the GaN layer is, for example, about 2 nm. Alternatively, as the cap layer CP, other than GaN, there can be used an AlN layer, an InN layer, or the like. Alternatively, there may also be used a mixed crystal of the nitride semiconductors (e.g., AlGaN or InAlN). Still alternatively, the cap layer CP may be omitted.

Further, for the cap layer CP, it is necessary to use a nitride semiconductor larger in electron affinity than the barrier layer BA. Further, as the cap layer CP, a nondoped layer may be used, or an impurity may be appropriately doped according to the use. As the doping impurity, there can be used an n type impurity or a p type impurity. Examples of the n type impurity may include Si, S, and Se. Examples of the p type impurity may include Be, C, and Mg.

Whereas, as the channel base layer UC, there is used an AlGaN layer. As the cap layer CP, there is used a GaN layer. Thus, when the lattice constants of the layers are different, the film thickness of the cap layer CP is required to be equal to, or smaller than the critical film thickness from which dislocation increases.

As the insulation film IF1, there can be used, for example, a silicon nitride film. The thickness of the silicon nitride film is, for example, about 100 nm. Alternatively, there may be used an insulation film other than a silicon nitride film. Alternatively, there may be adopted a lamination structure of several kinds of insulation films. The material and the thickness of the insulation film IF1 can be appropriately selected according to the use of the semiconductor device. As the insulation film IF1, preferable is a film larger in bandgap, and smaller in electron affinity than the underlying nitride semiconductor. As the film satisfying such conditions, mention may be made of, other than a silicon nitride film (SiN), a silicon oxide ($SiO_2$) film, a silicon oxynitride film, a silicon oxycarbide (SiOC) film, an aluminum oxide ($Al_2O_3$ or alumina) film, a hafnium oxide ($HfO_2$) film, a zirconium oxide ($ZrO_2$) film, or the like. Further, various organic films satisfy the conditions described above. Further, out of these, it is preferable to select a film low in interface state density formed at the interface with the underlying nitride semiconductor for current collapse suppression.

The gate electrode GE is formed in the inside of the trench (also referred to as a recess) T penetrating through the insulation film IF1, the cap layer CP, and the barrier layer BA, and dug into some point of the channel layer CH via the gate insulation film GI.

As the gate insulation film GI, there can be used an aluminum oxide ($Al_2O_3$) film. The thickness of the aluminum oxide film is, for example, about 50 nm. As the gate insulation film GI, there may be used an insulation film other than an aluminum oxide film. Alternatively, there may be adopted a lamination structure of several kinds of insulation films. The material and the thickness of the gate insulation film GI can be appropriately selected according to the use of the semiconductor device. As the gate insulation film GI, preferable is a film larger in bandgap, and smaller in electron affinity than the underlying nitride semiconductor. As films satisfying such conditions, mention may be made of, other than an aluminum oxide film, a silicon oxide ($SiO_2$) film, a silicon nitride film (SiN), a hafnium oxide ($HfO_2$) film, a zirconium oxide ($ZrO_2$) film, and the like. The gate insulation film GI affects the voltage applicable to the gate electrode GE, and the threshold voltage, and hence, is preferably set in consideration of the insulation breakdown voltage, the dielectric constant, and the film thickness.

As the gate electrode GE, there can be used a titanium nitride (TiN) film. The thickness of the titanium nitride film is, for example, about 200 nm. As the gate electrode GE, there may be used a conductive film other than a titanium nitride film. There may be used a polycrystal silicon film doped with an impurity such as boron (B) or phosphorus (P). Alternatively, there may be used a metal including Ti, Al, Ni, Au, or the like. Still alternatively, there may be used a compound film (metal silicide film) of a metal including Ti, Al, Ni, Au, or the like, and Si. Further alternatively, there may be used a nitride of a metal film including Ti, Al, Ni, Au, or the like. Alternatively, there may be adopted a lamination structure of several kinds of conductive films. The material and the thickness of the gate electrode GE can be appropriately selected according to the use of the semiconductor device.

Further, as the gate electrode GE, it is preferable to select a material less likely to react with the underlying film (e.g., the gate insulation film GI), and the overlying film (e.g., the interlayer insulation film IL1).

Herein, in the present embodiment, an inactivated region IR is provided between the gate electrode GE and the drain electrode DE. The inactivated region IR is an ion implanted region of an inactivating element implanted into the lamination part of the potential fixed layer VC, the channel base layer UC, the channel layer CH, and the barrier layer BA situated between the gate electrode GE and the drain electrode DE. Injection of an inactivating element may desirably be performed in at least the potential fixed layer VC. Other layers (e.g., the channel base layer UC, the channel layer CH, and the barrier layer BA) are not required to contain an inactivating element with a high concentration. Accordingly, in consideration of the implantation energy and the carry distance of the inactivating element, adjustment may desirably be achieved so that the inactivating element is contained in a desirable amount in the potential fixed layer VC. For example, an inactivating element is implanted so that the activation ratio of the p type impurity in the potential fixed layer VC in the inactivated region IR is lower than, and is preferably 1/10 or less the activation ratio of a p type impurity in the potential fixed layer VC under the source electrode SE not inactivated. However, an inactivating element may be diffused into the layer in the vicinity of the potential fixed layer VC. For example, an inactivating element may be diffused into the channel base layer UC, the channel layer CH, and the barrier layer BA. Alternatively, an inactivating element may be diffused into the layers below the potential fixed layer VC. However, the inactivating element is for inactivating the p type impurity, and does not eliminate the two-dimensional electron gas 2DEG.

Over the gate electrode GE, there is arranged an interlayer insulation film IL1. The interlayer insulation film IL1 has a through hole TH and contact holes C1S and C1D.

As the interlayer insulation film IL1, for example, there can be used a silicon oxide film. The thickness of the silicon oxide film is, for example, about 2000 nm. Alternatively, there may be used an insulation film other than a silicon oxide film. Alternatively, there may be adopted a lamination structure of several kinds of insulation films. The material and the thickness of the interlayer insulation film IL1 can be appropriately selected according to the use of the semiconductor device. As the interlayer insulation film IL1, preferable is a film larger in bandgap, and smaller in electron affinity than the underlying nitride semiconductor. Further, as the interlayer insulation film IL1, it is preferable to select a material less likely to react with the gate electrode GE in contact therewith. As films satisfying such conditions, mention may be made of, other than a silicon oxide film, a silicon nitride film, a silicon oxynitride film, an aluminum oxide ($Al_2O_3$) film, a hafnium oxide ($HfO_2$) film, a zirconium oxide ($ZrO_2$) film, and the like.

Over the interlayer insulation film IL1 including the through hole TH and the contact holes C1S and C1D, there is formed a conductive film. Herein, there is formed a lamination film of a TiN film and an Al film. Of the lamination film, the lamination film in the contact hole C1S or C1D serves as the source electrode SE or the drain electrode DE. On the other hand, the lamination film in the through hole TH serves as the coupling part VIA.

As the source electrode SE and the drain electrode DE, there can be used a lamination film of a TiN film and an Al film thereover. The thickness of the TiN film is, for example, about 50 nm. The thickness of the Al film is, for example, about 1000 nm. As the materials for the source electrode SE and the drain electrode DE, any materials are acceptable so long as they are in ohmic contact with the nitride semiconductor layer (cap layer CP) at the bottom of the contact hole (C1S or C1D). Particularly, when an n type impurity is doped into the nitride semiconductor layer (cap layer CP) at the bottom of the contact hole (C1S or C1D), or the nitride semiconductor layer below this layer, the ohmic contact becomes more likely to be ensured. Accordingly, for the source electrode SE and the drain electrode DE, selection from a wide range of material group becomes possible. Further, as the materials forming the source electrode SE and the drain electrode DE, it is preferable to select a material less likely to react with the interlayer insulation film IL1 in contact therewith. As the materials forming the source electrode SE and the drain electrode DE, there may be used a metal film formed of Ti, Al, Mo (molybdenum), Nb (niobium), V (vanadium), or the like. Alternatively, there can be used mixtures (alloys) of the metals, compound films of the metals and Si (metal silicide films), nitrides of the metals, and the like. Still alternatively, there may be used lamination films of the materials.

As the coupling part VIA, as with the source electrode SE and the drain electrode DE described previously, there can be used a lamination film of a TiN film and an Al film thereover. The thickness of the TiN film is, for example, about 50 nm. The thickness of the Al film is, for example, about 1000 nm. As the materials for the coupling part VIA, any materials are acceptable so long as they are in ohmic contact with the nitride semiconductor layer (potential fixed layer VC) at the bottom of the through hole TH. Whereas, as the materials forming the coupling part VIA, it is preferable to select a material less likely to react with the interlayer insulation film IL1 in contact therewith.

For example, when the potential fixed layer VC contains a p type impurity, as the materials forming the coupling part VIA, there are preferably used metal films formed of Ti, Ni, Pt (platinum), Rh (rhodium), Pd (palladium), Ir (iridium), Cu (copper), Ag (silver), and the like, mixtures (alloys) of the metals, compound films of the metals and Si (metal silicide films), nitrides of the metals, and the like. Alternatively, there may be used lamination films of the materials.

Further, in the present embodiment, the bottom surface of the through hole TH is arranged at some point of the potential fixed layer VC. In the inside of the through hole TH, there is arranged the coupling part VIA. Thus, it is essential only that the coupling part VIA is arranged in such a manner as to be in contact with the potential fixed layer VC. For example, the following configuration is also acceptable: the bottom surface of the through hole TH is arranged at the top surface of the potential fixed layer VC, so that the bottom of the coupling part VIA is in contact with the potential fixed layer VC. Alternatively, the following configuration is also acceptable: the bottom surface of the through hole TH is arranged below the bottom surface of the potential fixed layer VC, so that a part of the side surface of the coupling part VIA is in contact with the potential fixed layer VC. For example, the bottom surface of the through hole TH may be situated at the surface of the buffer layer BU or at some point of the buffer layer BU. The bottom surface of the through hole TH may be situated at the surface of the nucleation layer NUC or at some point of the nucleation layer NUC. Alternatively, the bottom surface of the through hole TH may be situated at the surface of the substrate S or at some point of the substrate S. However, the contact between a part of the side surface of the coupling part VIA and the potential fixed layer VC may result in a smaller contact area. For this reason, the bottom surface of the through hole TH is preferably arranged at or below the top surface of the potential fixed layer VC, and above the lower surface of the potential fixed layer VC.

As described previously, the source pad SP and the drain pad DP are formed integrally with the source electrode SE and the drain electrode DE, respectively. Accordingly, the source pad SP and the drain pad DP are formed of the same materials as those for the source electrode SE and the drain electrode DE, respectively. Under the source pad SP, there is arranged the coupling part VIA (FIG. 4).

As the protective film PRO, there can be used an insulation film such as a silicon oxynitride (SiON) film.

[Manufacturing Method Description]

Then, with reference to FIGS. 5 to 25, a description will be given to a method for manufacturing the semiconductor device of the present embodiment. In addition, the configuration of the semiconductor device will be made clearer. FIGS. 5 to 25 are each a cross sectional view or a plan view showing the semiconductor device of the present embodiment during a manufacturing step.

Figure 5:
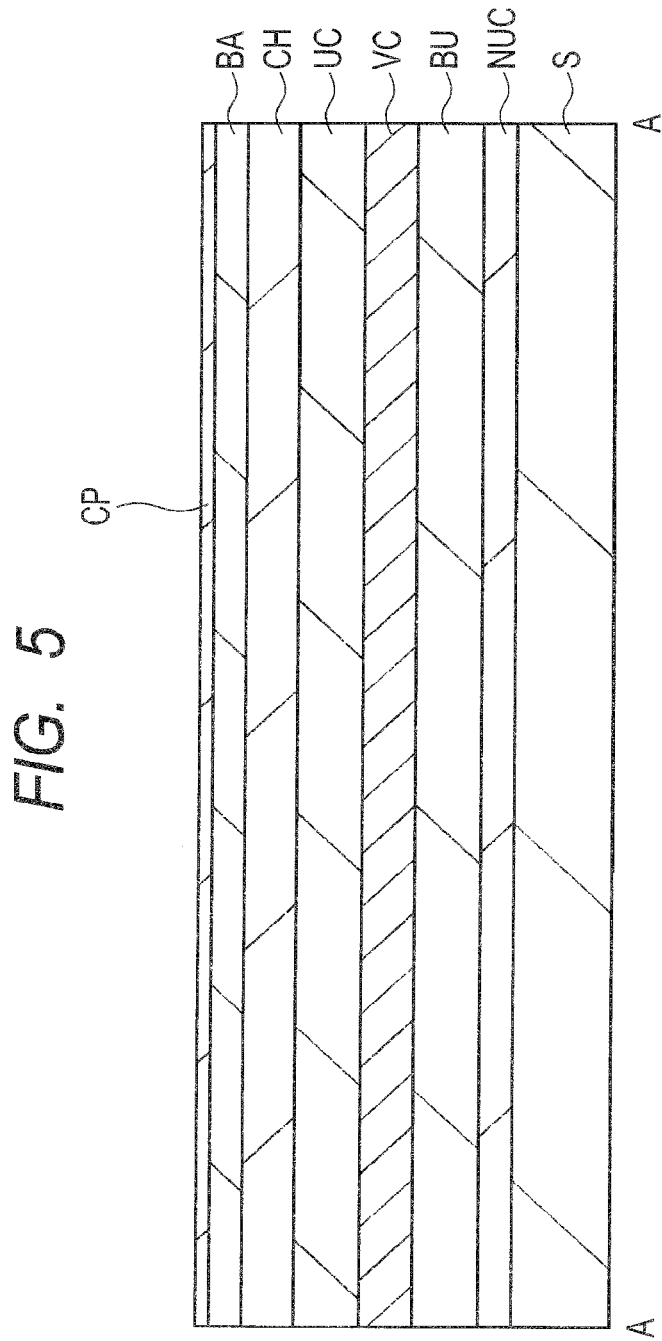
FIG. 5 is a cross sectional view showing the semiconductor device of First Embodiment during a manufacturing step.

As shown in FIG. 5, over a substrate S, there are sequentially formed a nucleation layer NUC and a buffer layer BU. As the substrate S, there is used, for example, a semiconductor substrate formed of silicon (Si) with a (111)-plane exposed. Thereover, as the nucleation layer NUC, for example, an aluminum nitride (AlN) layer is epitaxially grown with a film thickness of about 200 nm using MOCVD: Metal Organic Chemical Vapor Deposition method, or the like Incidentally, as the substrate S, there may be used a substrate formed of SiC, sapphire, or the like other than the silicon. Further, generally, the nucleation layer NUS, and the nitride semiconductor layers (III-V group compound layers) subsequent to the nucleation layer NUS are all formed by III-group element plane growth (namely, in the present case, gallium plane growth or aluminum plane growth).

Then, over the nucleation layer NUC, as the buffer layer BU, there is formed a superlattice structure in which lamination films (AlN/GaN films) each of a gallium nitride (GaN) layer and an aluminum nitride (AlN) layer are repeatedly deposited. For example, gallium nitride (GaN) layers each with a film thickness of about 20 nm and aluminum nitride (AlN) layers each with a film thickness of about 5 nm are alternately epitaxially grown using the metal organic chemical vapor deposition method or the like. For example, there are formed 40 layers of the lamination films. When the lamination film is grown, the lamination film may be grown while being doped with carbon (C). Carbon is doped so that the carbon concentration in the lamination film is, for example, about $1 \times 10^{19}$ (1E19) $cm^{-3}$.

Further, over the buffer layer BU, as apart of the buffer layer BU, for example, an AlGaN layer may be epitaxially grown using the metal organic chemical vapor deposition method or the like.

Then, over the buffer layer BU, as the potential fixed layer VC, for example, a gallium nitride layer (p-GaN layer) containing a p type impurity is epitaxially grown using the metal organic chemical vapor deposition method, or the like. For example, as a p type impurity, there is used magnesium (Mg). For example, a gallium nitride layer is deposited about 200 nm thick while being doped with magnesium (Mg). The Mg concentration in the deposited film is set at, for example, about $5 \times 10^{18}$ (5E18) $cm^{-3}$.

Then, over the potential fixed layer VC, there is formed a channel base layer UC. Over the potential fixed layer VC, as the channel base layer UC, for example, an AlGaN layer is epitaxially grown using the metal organic chemical vapor deposition method, or the like. At this step, growth is achieved without performing intentional impurity doping. The thickness is set at, for example, 1000 nm, and the composition of Al is set at about 3%.

Then, over the channel base layer UC, there is formed a channel layer CH. For example, over the channel base layer UC, a gallium nitride layer (GaN layer) is epitaxially grown using the metal organic chemical vapor deposition method, or the like. At this step, growth is achieved without performing intentional impurity doping. The film thickness of the channel layer CH is, for example, about 80 nm.

Then, over the channel layer CH, as the barrier layer BA, for example, an AlGaN layer is epitaxially grown using the metal organic chemical vapor deposition method, or the like. For example, by setting the composition ratio of Al at 0.2, and the composition ratio of Ga at 0.8, there is formed an $Al_{0.2}Ga_{0.8}N$ layer. The composition ratio of Al of the AlGaN layer of the barrier layer BA is set larger than the composition ratio of Al of the AlGaN layer of the buffer layer BU described previously.

In this manner, there is formed a laminate of the channel base layer UC, the channel layer CH, and the barrier layer BA. Of the laminate, a two-dimensional electron gas (2DEG) is formed in the vicinity of the interface between the channel layer CH and the barrier layer BA.

Then, over the barrier layer BA, there is formed a cap layer CP. For example, over the barrier layer BA, a gallium nitride layer (GaN layer) is epitaxially grown using the metal organic chemical vapor deposition method, or the like. At this step, growth is achieved without performing intentional impurity doping. The film thickness of the cap layer CP is, for example, about 2 nm.

Then, after completion of deposition of the GaN type semiconductor film such as a gallium nitride layer (GaN layer), a heat treatment is performed in order to activate a p type impurity. For example, a heat treatment is performed at 750° C. for 30 minutes in a nitrogen atmosphere.

Figure 6:
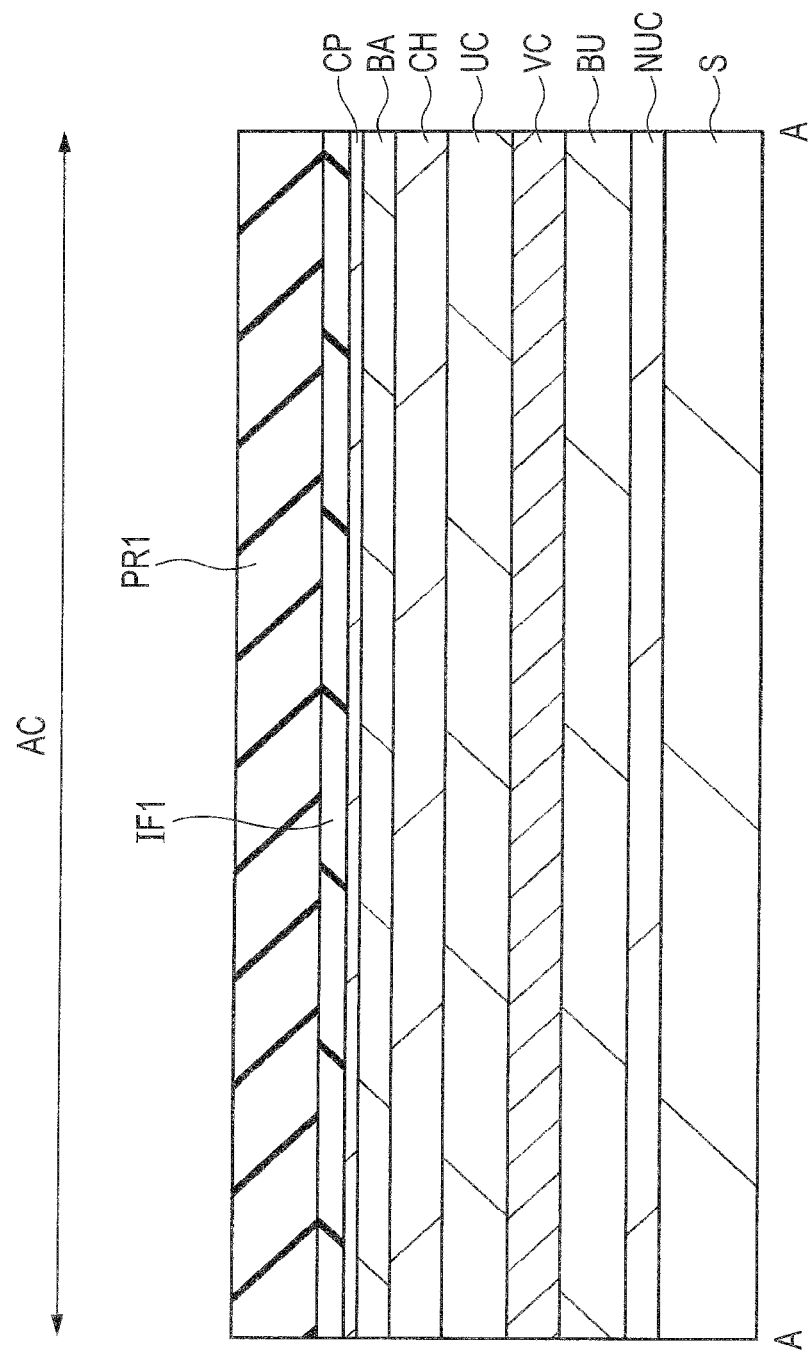
FIG. 6 is a cross sectional view showing the semiconductor device of First Embodiment during a manufacturing step, and showing the manufacturing step following FIG. 5.
Figure 7:
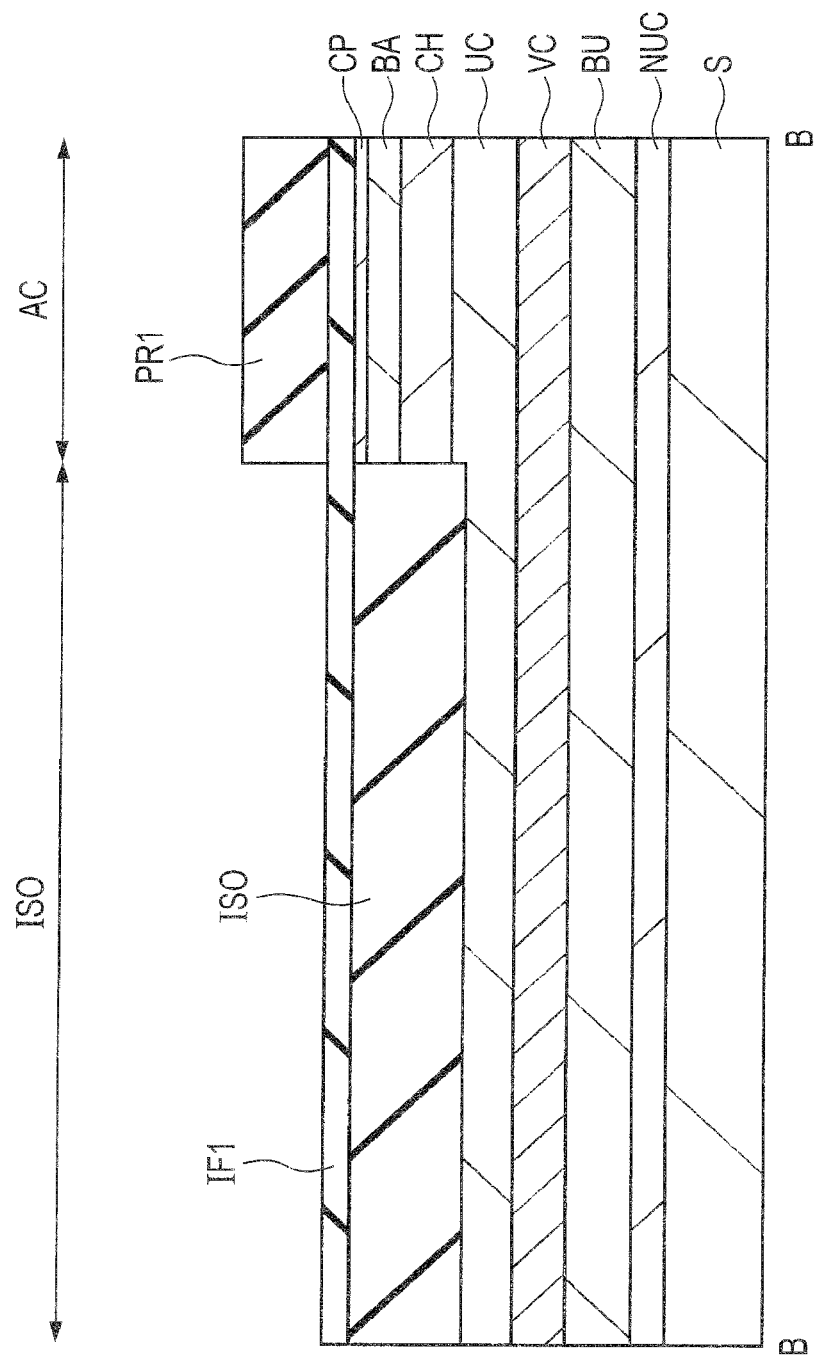
FIG. 7 is a cross sectional view showing the semiconductor device of First Embodiment during a manufacturing step.

Then, as shown in FIGS. 6 and 7, over the cap layer CP, as the insulation film IF1, a silicon nitride film is deposited with a film thickness of, for example, about 100 nm using a sputtering method, or the like.

Then, by a photolithography treatment, a photoresist film PR1 for opening an element isolation region therein is formed over the insulation film IF1. Then, using the photoresist film PR1 as a mask, nitrogen ions are implanted, thereby to form an isolation region ISO. Thus, ion species such as nitrogen (N) or boron (B) is implanted, so that the crystal state is changed, resulting in an increase in resistance.

Figure 8:
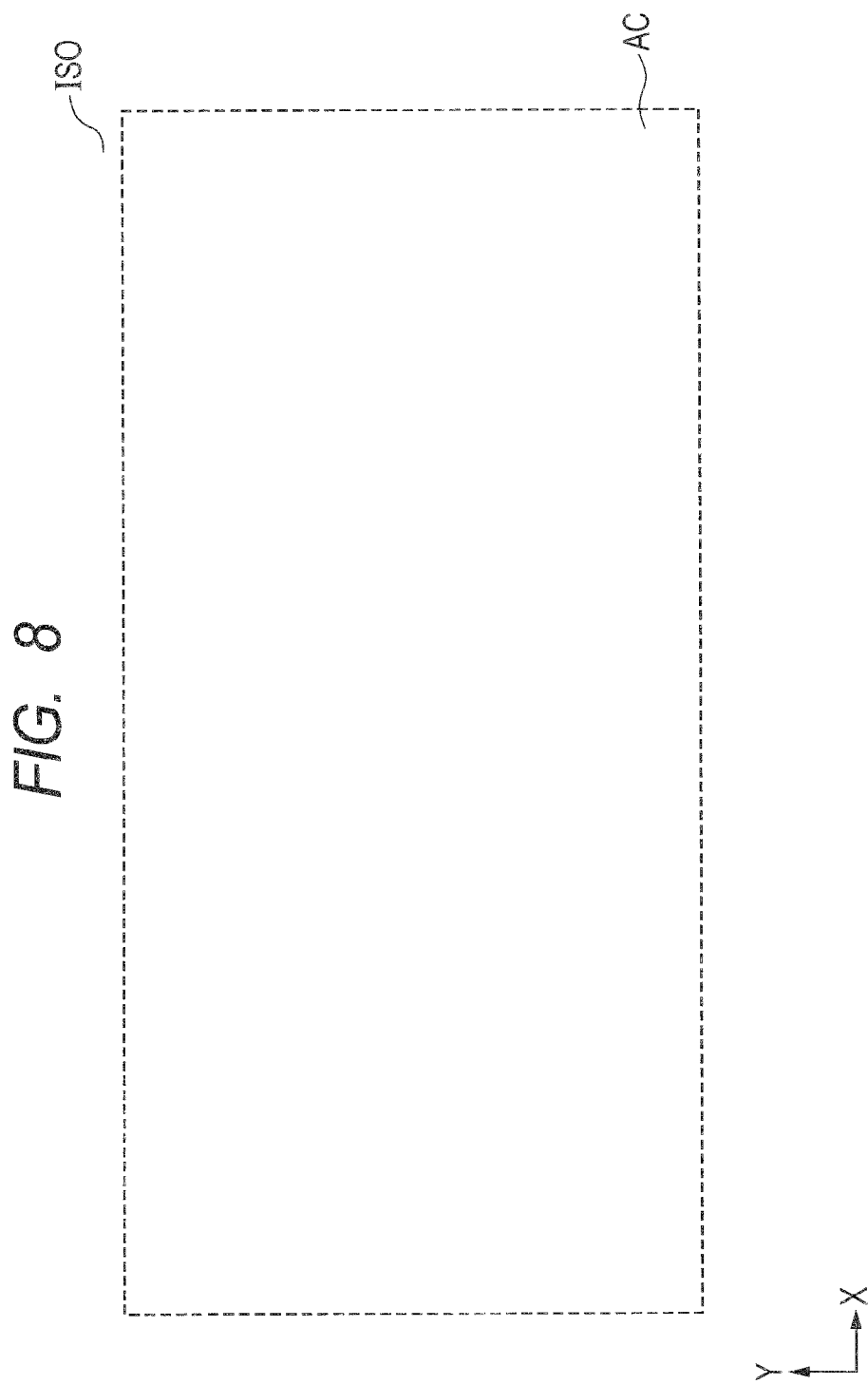
FIG. 8 is a plan view showing the semiconductor device of First Embodiment during a manufacturing step.

For example, nitrogen ions are implanted at a density of about $5 \times 10^{14}$ (5E14) $cm^{-2}$ via the insulation film IF1 into a laminate formed of the channel base layer UC, the channel layer CH, and the barrier layer BA. The implantation energy is, for example, about 120 keV. Incidentally, the nitrogen ion implantation conditions are adjusted so that the depth of implantation, namely, the bottom of the isolation region ISO is situated below the bottom surface of the channel layer CH, and situated above the bottom surface of the potential fixed layer VC. Incidentally, the bottom of the isolation region ISO is situated above the bottom of the through hole TH (coupling part VIA) described later. In this manner, there is formed the isolation region ISO. The region surrounded by the isolation regions ISO serves as an active region AC. As shown in FIG. 8, the active region AC is, for example, in a substantially rectangular shape having long sides in the X direction. Then, the photoresist film PR1 is removed by a plasma ashing treatment, or the like.

Figure 9:
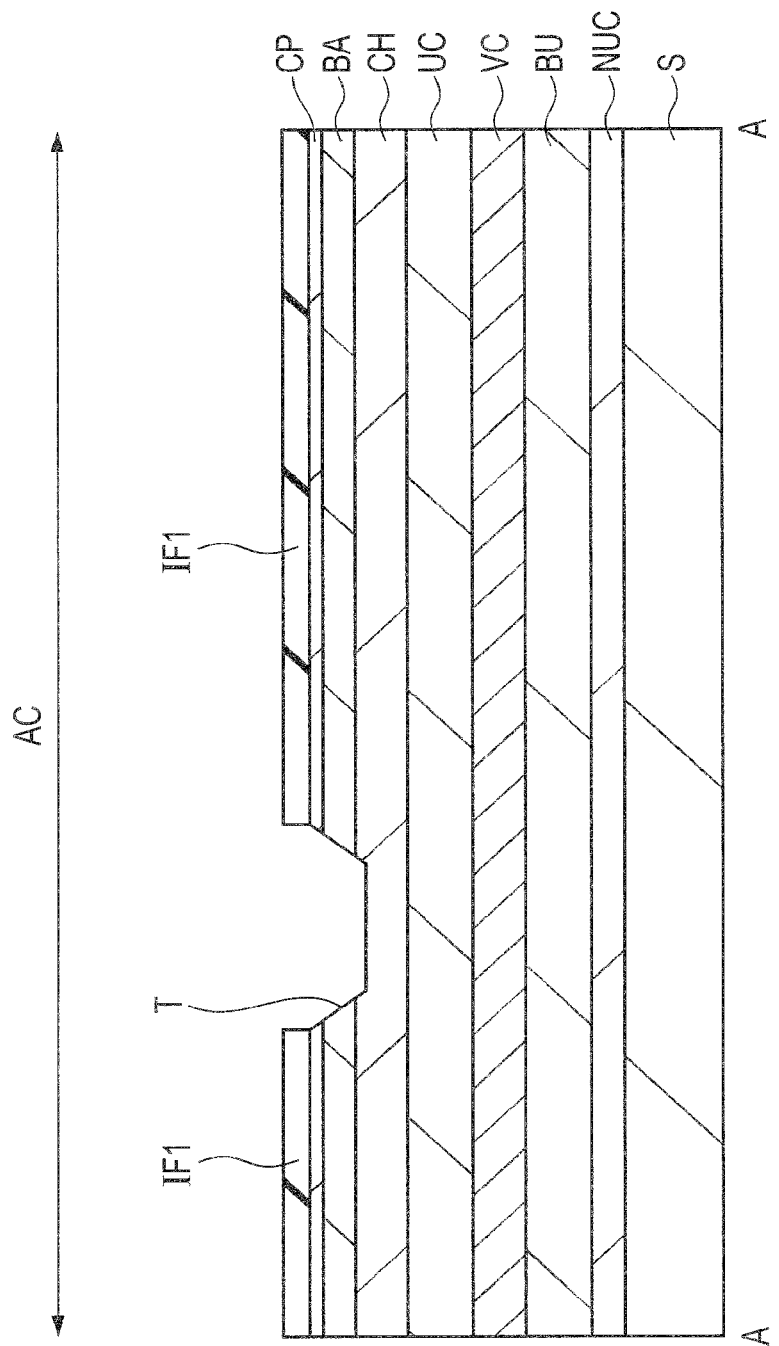
FIG. 9 is a cross sectional view showing the semiconductor device of First Embodiment during a manufacturing step, and showing the manufacturing step following FIG. 6.
Figure 10:
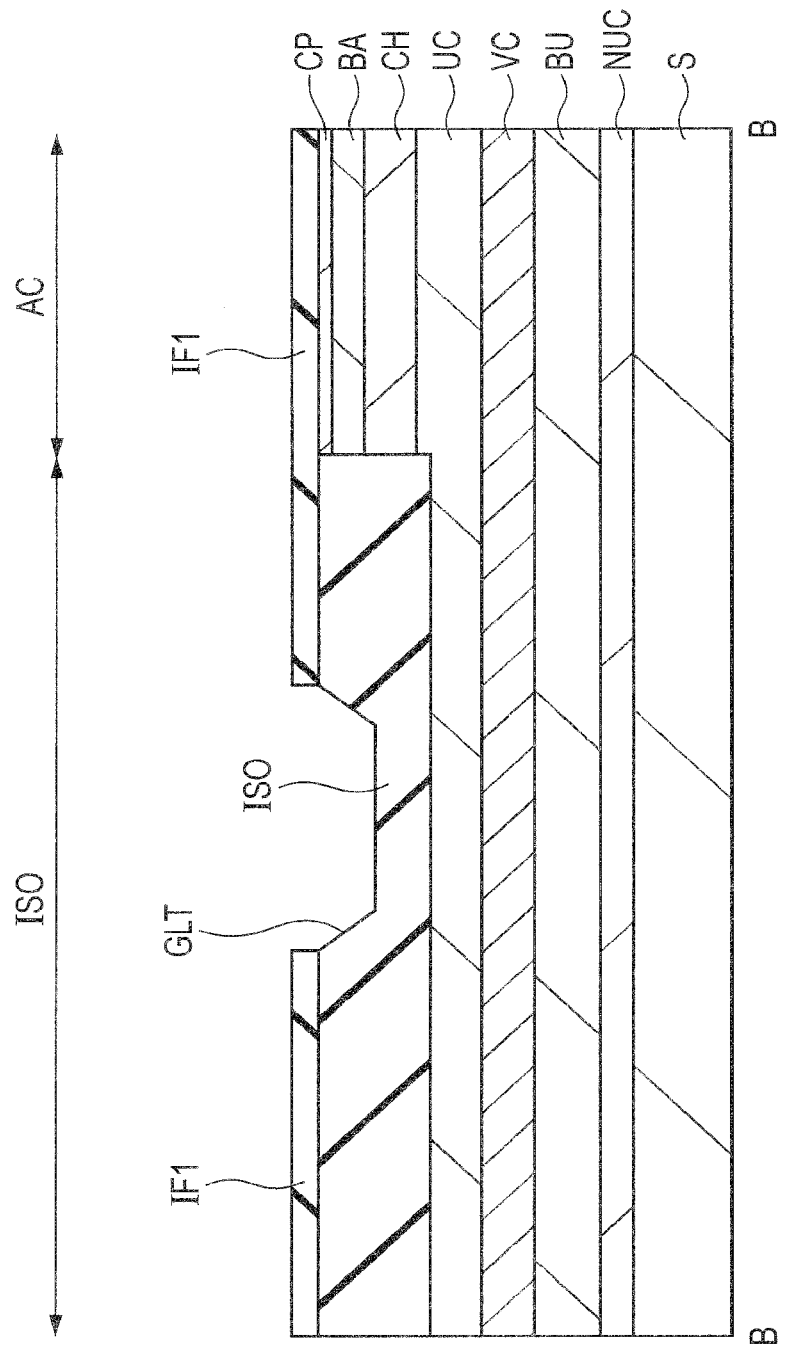
FIG. 10 is a cross sectional view showing the semiconductor device of First Embodiment during a manufacturing step, and showing the manufacturing step following FIG. 7.
Figure 11:
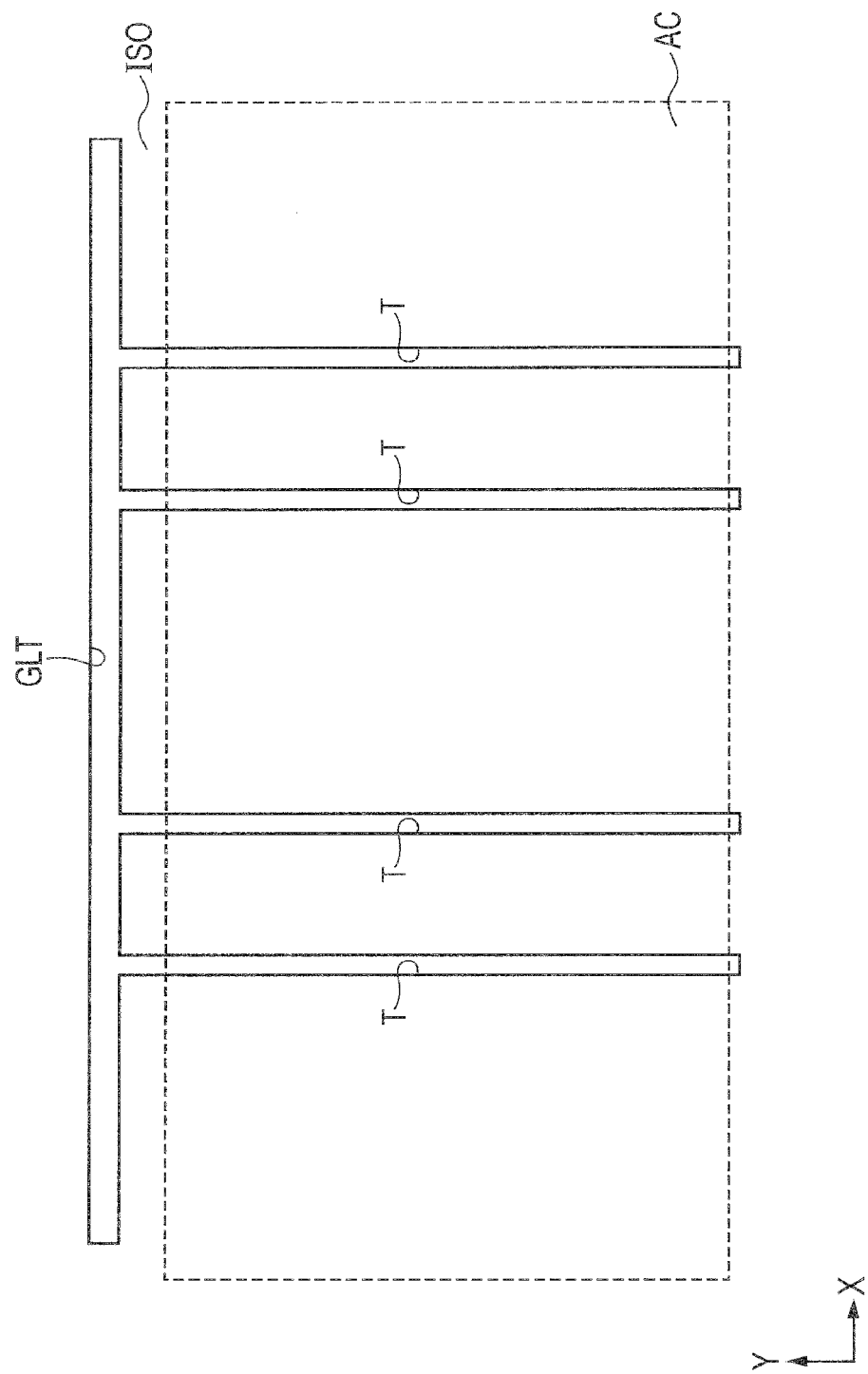
FIG. 11 is a plan view showing the semiconductor device of First Embodiment during a manufacturing step.

Then, as shown in FIGS. 9 to 11, using a photolithography technology and an etching technology, the insulation film IF1 is patterned. For example, over the insulation film IF1, there is formed a photoresist film (not shown). By a photolithography treatment, there is removed the photoresist film (not shown) in the gate electrode formation region. In other words, over the insulation film IF1, there is formed a photoresist film (not shown) having an opening in the gate electrode formation region. Then, using the photoresist film (not shown) as a mask, the insulation film IF1 is etched. When a silicon nitride film is used as the insulation film IF1, there is performed dry etching using a dry etching gas including a fluorine type gas such as $SF_6$. Then, by a plasma ashing treatment, or the like, there is removed the photoresist film (not shown). In this manner, over the cap layer CP, there is formed the insulation film IF1 having an opening in the gate electrode formation region.

Then, using the insulation film IF1 as a mask, the cap layer CP, the barrier layer BA, and the channel layer CH are dry etched. As a result, there is formed a trench T penetrating through the cap layer CP and the barrier layer BA, and reaching some point of the channel layer CH. As the etching gas, there is used a dry etching gas including a chlorine type gas such as $BCl_3$. At this step, in the isolation region ISO, there is formed a trench GLT for the gate line GL (FIGS. 10 and 11).

Figure 12:
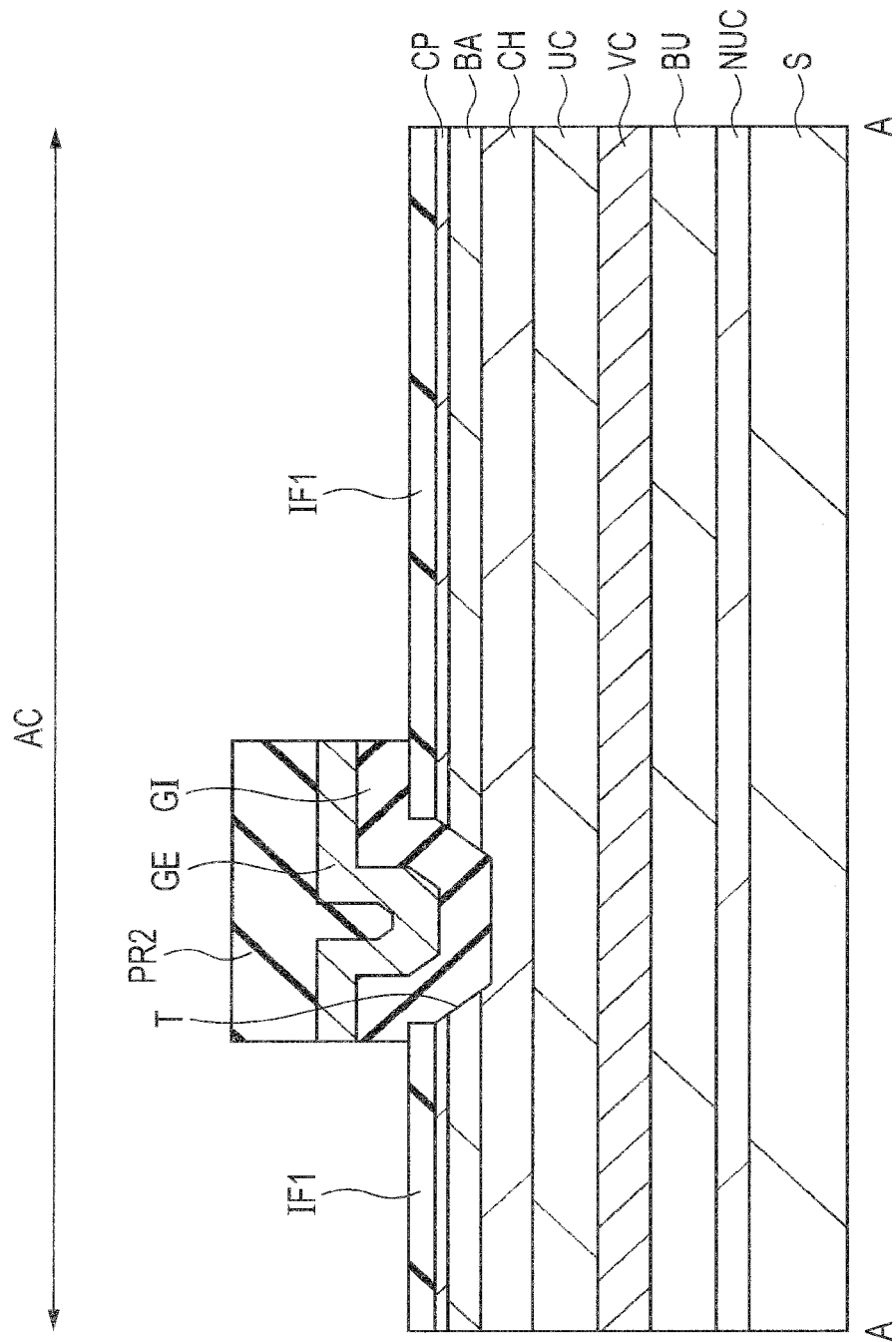
FIG. 12 is a cross sectional view showing the semiconductor device of First Embodiment during a manufacturing step, and showing the manufacturing step following FIG. 9.
Figure 13:
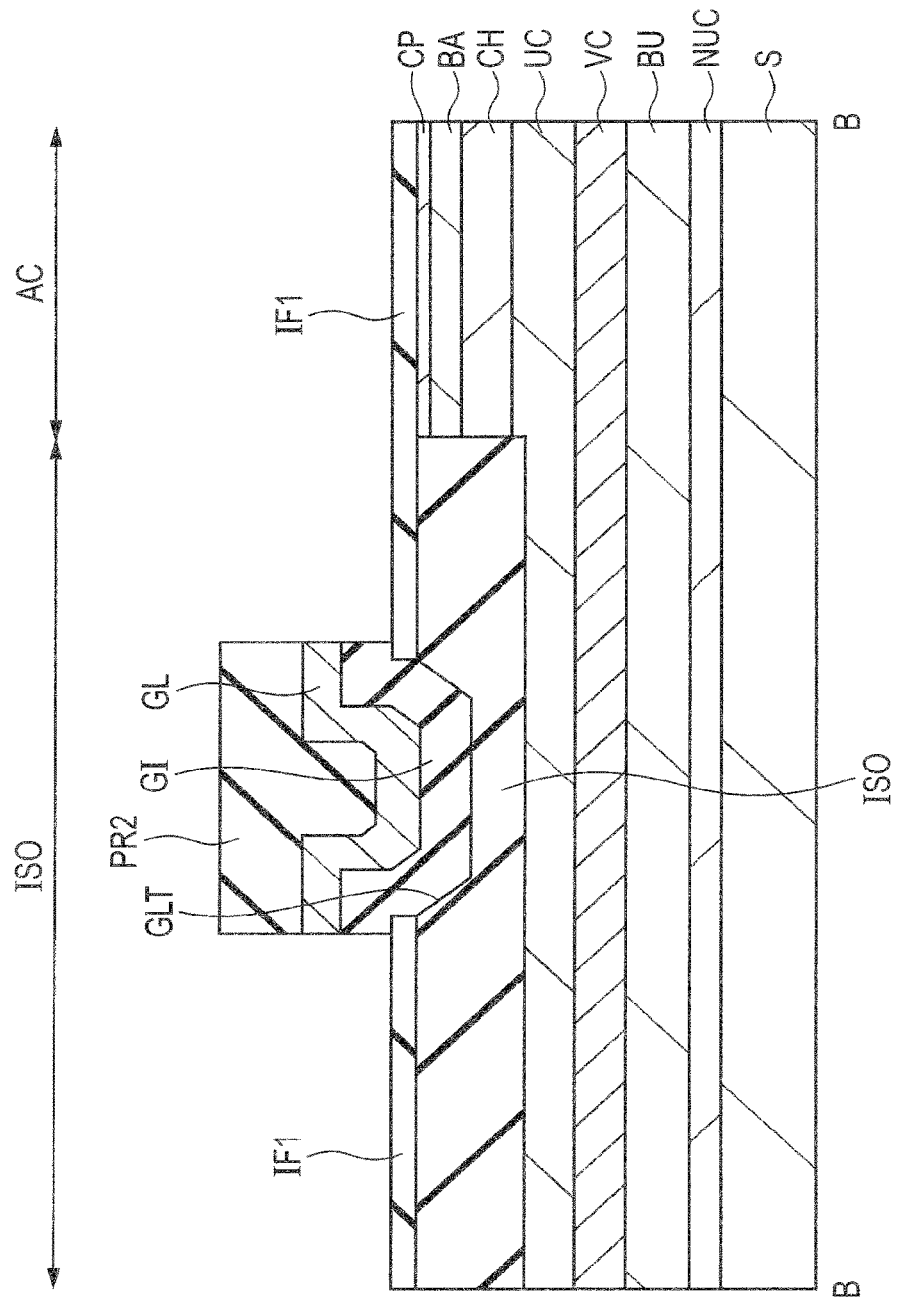
FIG. 13 is a cross sectional view showing the semiconductor device of First Embodiment during a manufacturing step, and showing the manufacturing step following FIG. 10.
Figure 14:
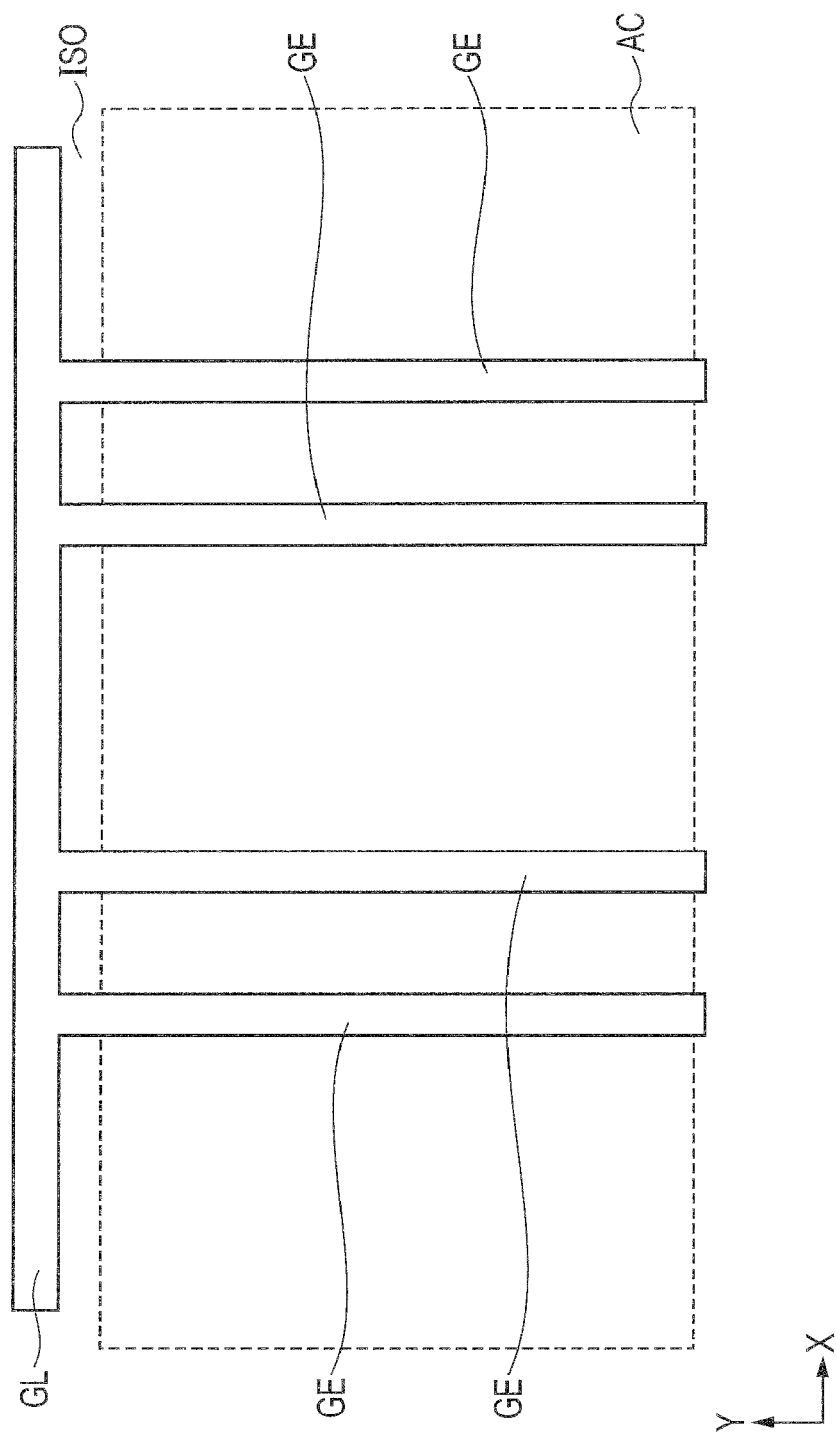
FIG. 14 is a plan view showing the semiconductor device of First Embodiment during a manufacturing step.

Then, as shown in FIGS. 12 to 14, over the insulation film IF1 including the inside of the trench T, a gate electrode GE is formed via a gate insulation film GI. For example, over the insulation film IF1 including the inside of the trench T, as the gate insulation film GI, an aluminum oxide film is deposited with a film thickness of about 50 nm using an ALD (Atomic Layer Deposition) method, or the like.

As the gate insulation film GI, other than an aluminum oxide film, there may be used a silicon oxide film, or a high dielectric constant film higher in dielectric constant than a silicon oxide film. As a high dielectric constant film, there may be used a SiN film (silicon nitride), or a hafnium type insulation film such as a $HfO_2$ film (hafnium oxide film), a hafnium aluminate film, a HfON film (hafnium oxynitride film), a HfSiO film (hafnium silicate film), a HfSiON film (hafnium silicon oxynitride film), or a HfAlO film.

Then, for example, over the gate insulation film GI, as a conductive film, for example, a TiN (titanium nitride) film is deposited with a film thickness of about 200 nm using a sputtering method, or the like. Then, using a photolithography technology, a photoresist film PR2 is formed in the gate electrode formation region. Using the photoresist film PR2 as a mask, the TiN film is etched. As a result, there is formed a gate electrode GE. During the etching, the aluminum oxide film underlying the TiN film may be etched. For example, during processing of the TiN film, there is performed dry etching using a dry etching gas containing a chlorine type gas such as $Cl_2$. During processing of the aluminum oxide film, there is performed dry etching using a dry etching gas containing a chlorine type gas such as $BCl_3$.

Further, during the etching, the gate electrode GE is patterned in a shape protruding in one direction (toward the right side in FIG. 12, or the drain electrode DE side). The protrusion part is referred to as a field plate electrode part. The field plate electrode part is a region of a part of the gate electrode GE extending from the end of the trench T on the drain electrode DE side toward the drain electrode DE side.

Figure 15:
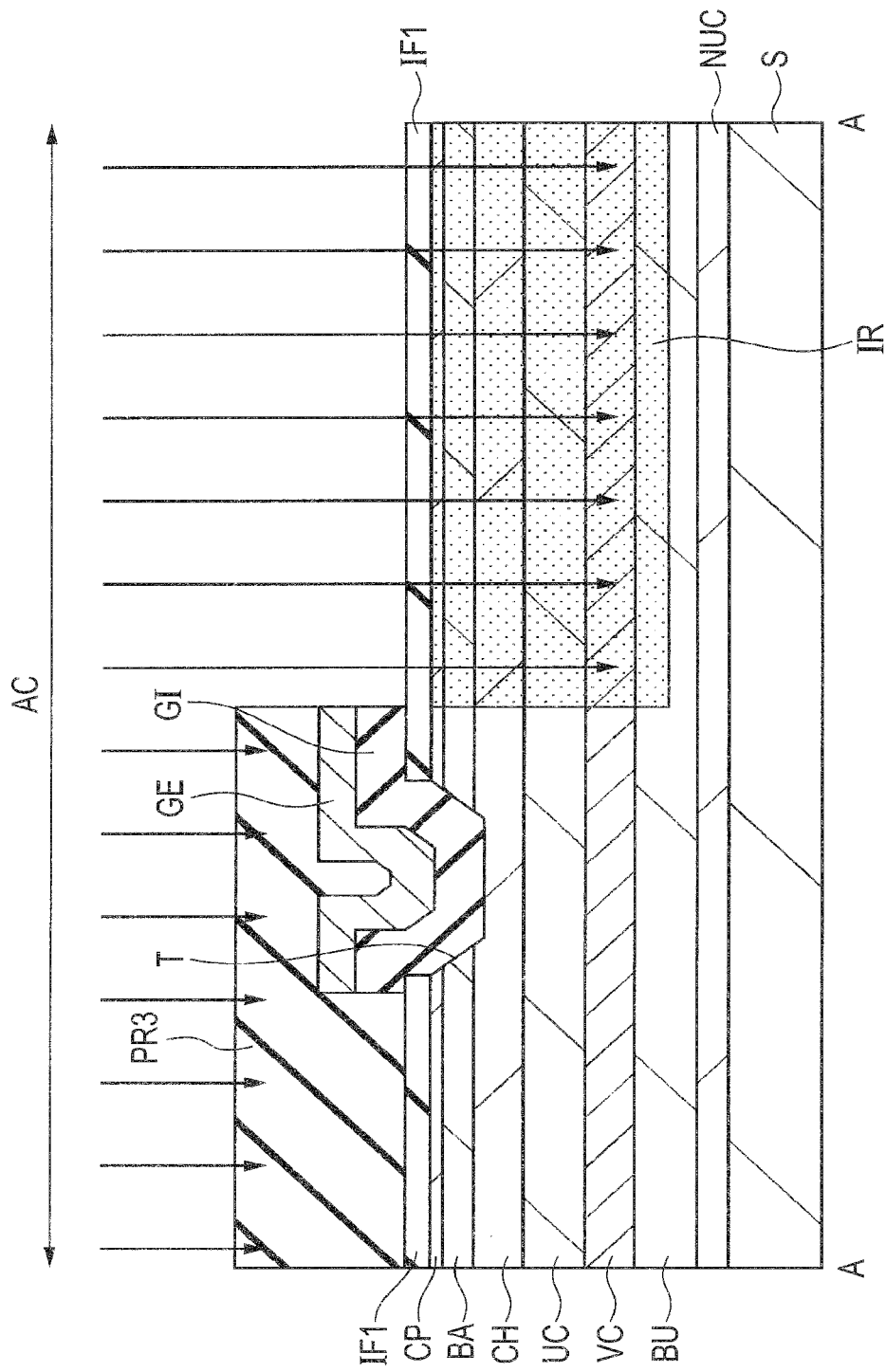
FIG. 15 is a cross sectional view showing the semiconductor device of First Embodiment during a manufacturing step, and showing the manufacturing step following FIG. 12.
Figure 16:
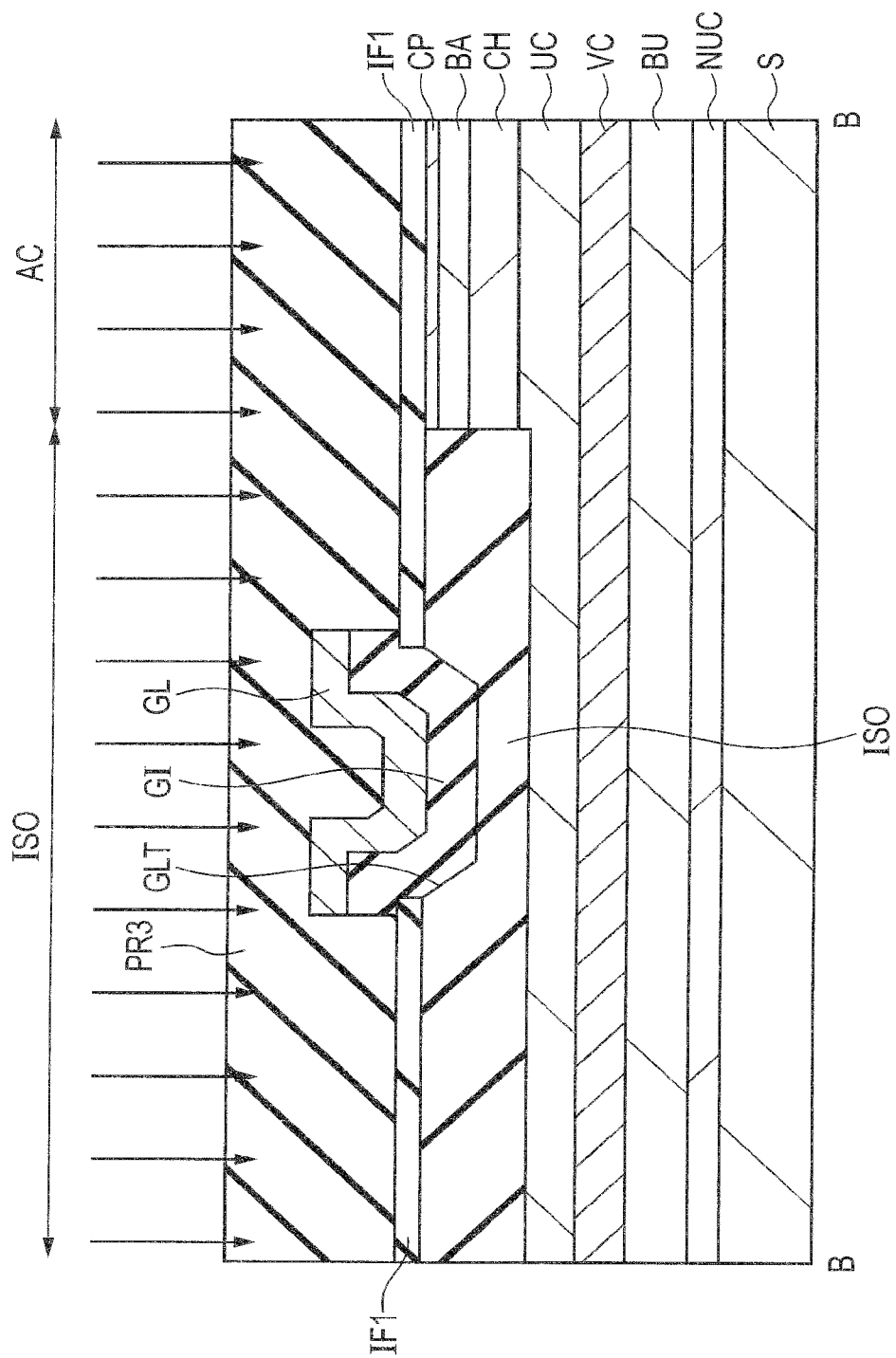
FIG. 16 is a cross sectional view showing the semiconductor device of First Embodiment during a manufacturing step, and showing the manufacturing step following FIG. 13.
Figure 17:
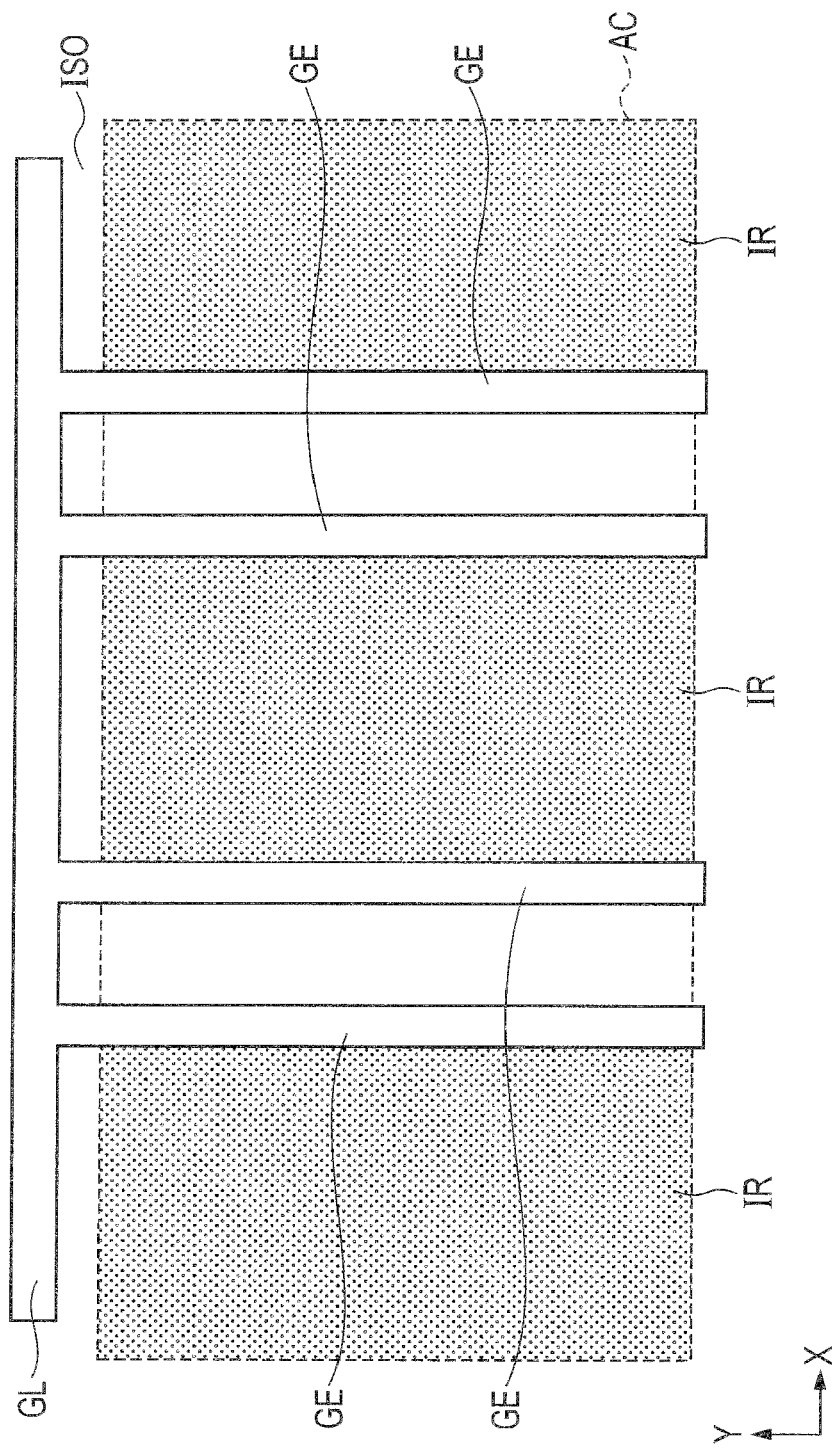
FIG. 17 is a plan view showing the semiconductor device of First Embodiment during a manufacturing step.

Then, as shown in FIGS. 15 to 17, an inactivating element is implanted into the potential fixed layer VC on one side (the right side in FIG. 15, or the drain electrode side) of the gate electrode GE. As a result, there is formed an inactivated region IR. Incidentally, herein, in consideration of diffusion of the inactivating element, there is shown the state in which an inactivating element is implanted into the lamination part of the potential fixed layer VC, the channel base layer UC, the channel layer CH, and the barrier layer BA situated on one side of the gate electrode GE. Incidentally, in FIG. 15, the end of the region in which the inactivating element has been implanted is angular. However, for example, as shown in FIG. 1, the end of the region in which the inactivating element has been implanted may be in an R (a curved surface) shape (the same also applies to other embodiments).

For example, over the gate electrode GE and the insulation film IF1, there is formed a photoresist film PR3. Using a photolithography technology, there is removed the photoresist film PR3 over the insulation film IF1 situated on one side of the gate electrode GE. Using the photoresist film PR3 as a mask, an inactivating element is implanted. As the inactivating element, hydrogen (H) is ion implanted, for example, at a density of 5E14 ($5 \times 10^{14}/cm^2$), and an energy of 120 KeV. It is essential only that implantation of the inactivating element is performed in at least the potential fixed layer VC. Other layers (e.g., the channel base layer UC, the channel layer CH, and the barrier layer BA) are not required to contain an inactivating element at a high concentration. Accordingly, in consideration of the implantation energy and the carry distance of the inactivating element, the implantation conditions may be desirably adjusted so that an inactivating element is contained in a desirable amount in the potential fixed layer VC. For example, an inactivating element is implanted so that the activation ratio of the p type element in the potential fixed layer VC in the inactivated region IR is lower than, and is preferably $\frac{1}{10}$ or less the activation ratio of the p type impurity in the potential fixed layer VC under the source electrode SE not inactivated. Incidentally, a heat treatment may be performed in order to diffuse the ion-implanted inactivating element. However, when a high-temperature heat treatment is performed, the implanted inactivating element desorbs from the inside of the crystal. For this reason, 600° C. or less is preferable.

Herein, as the introducing means of an inactivating element, the ion implantation method was used. However, there may be performed a plasma treatment of an inactivating element described in details in Second Embodiment.

Figure 18:
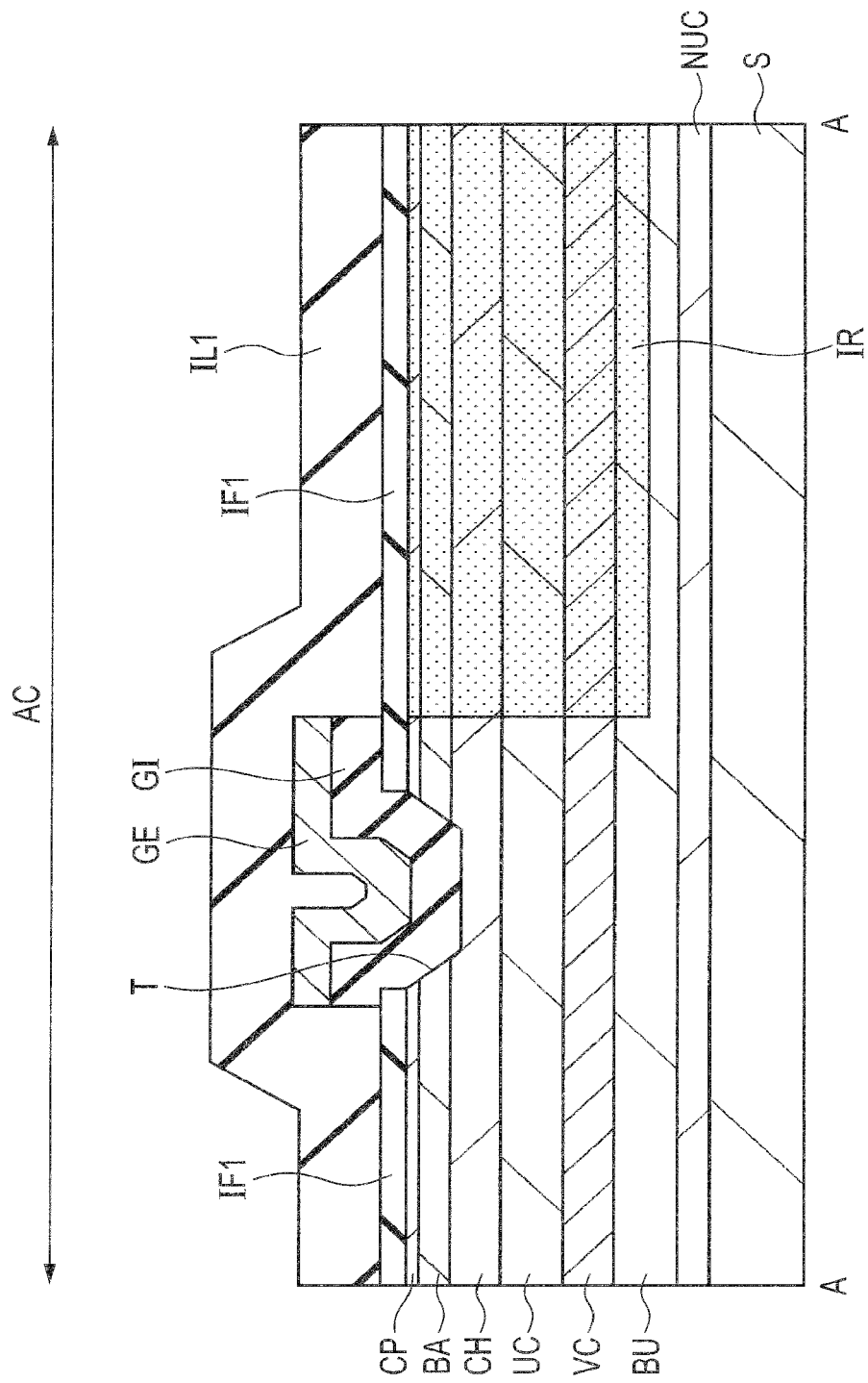
FIG. 18 is a cross sectional view showing the semiconductor device of First Embodiment during a manufacturing step, and showing the manufacturing step following FIG. 15.
Figure 19:
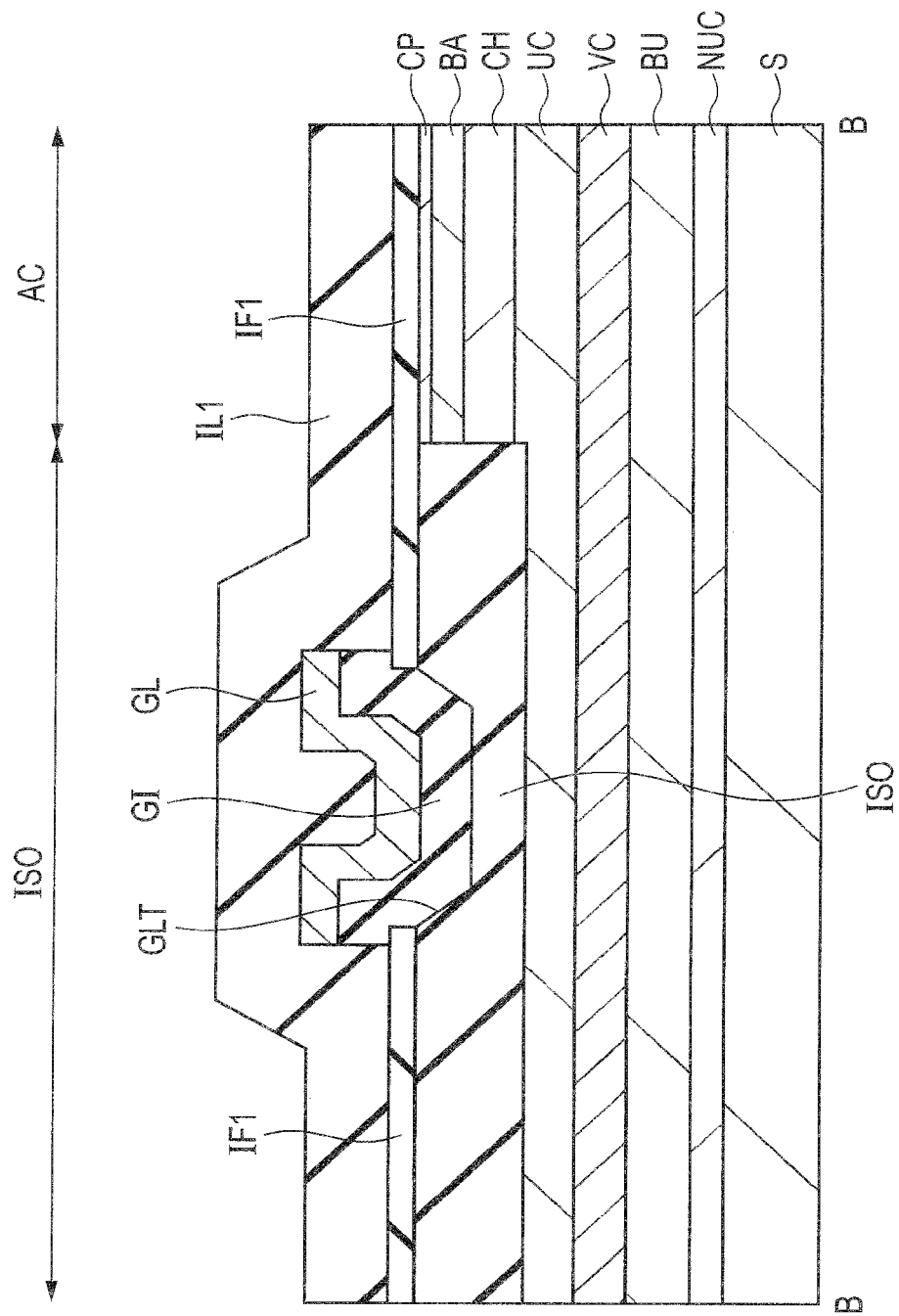
FIG. 19 is a cross sectional view showing the semiconductor device of First Embodiment during a manufacturing step, and showing the manufacturing step following FIG. 16.

Then, as shown in FIGS. 18 and 19, over the insulation film IF1 including over the gate electrode GE, as the interlayer insulation film IL1, for example, a silicon oxide film is deposited about 2000 nm in thickness using a sputtering method, or the like.

Figure 20:
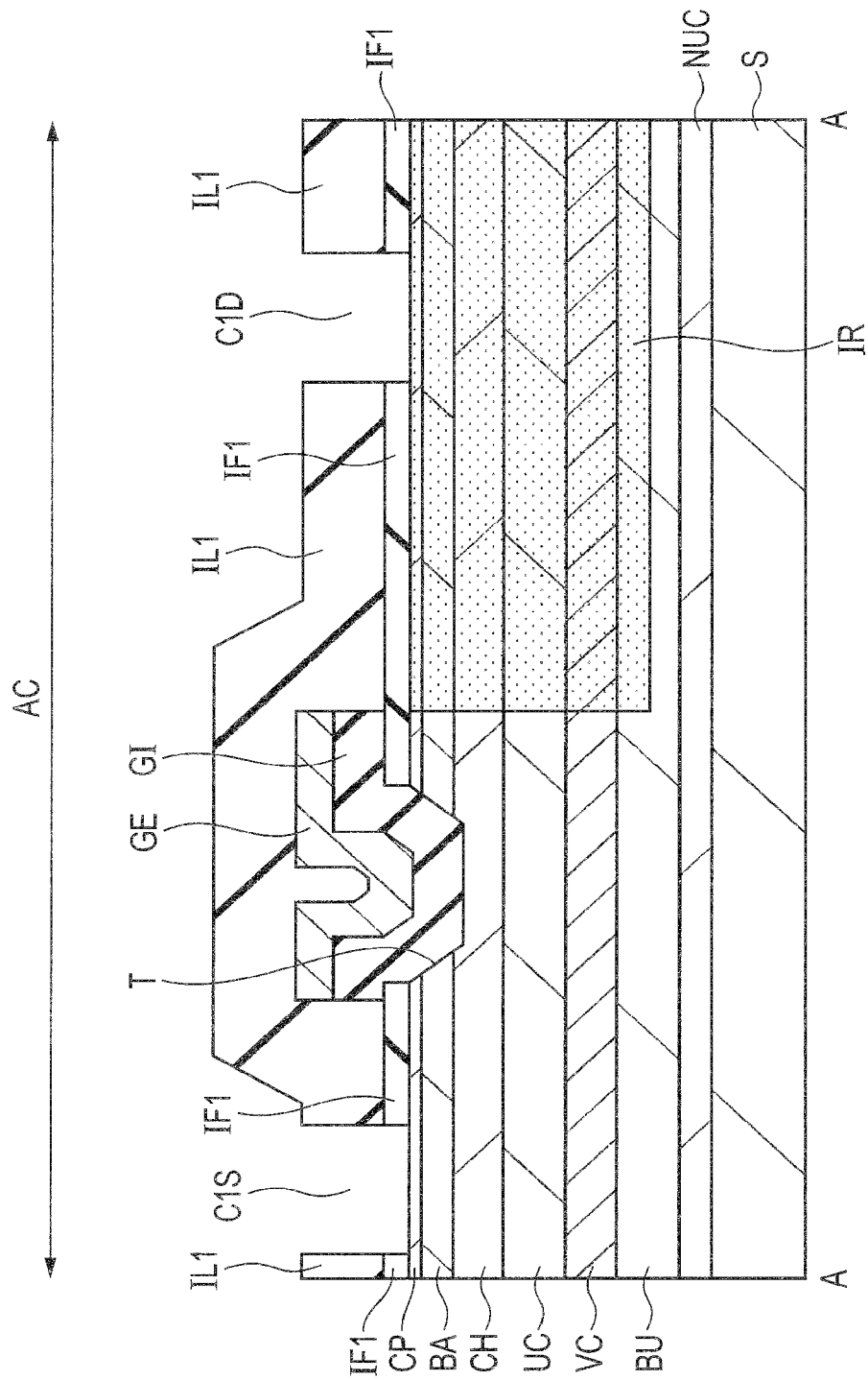
FIG. 20 is a cross sectional view showing the semiconductor device of First Embodiment during a manufacturing step, and showing the manufacturing step following FIG. 18.
Figure 21:
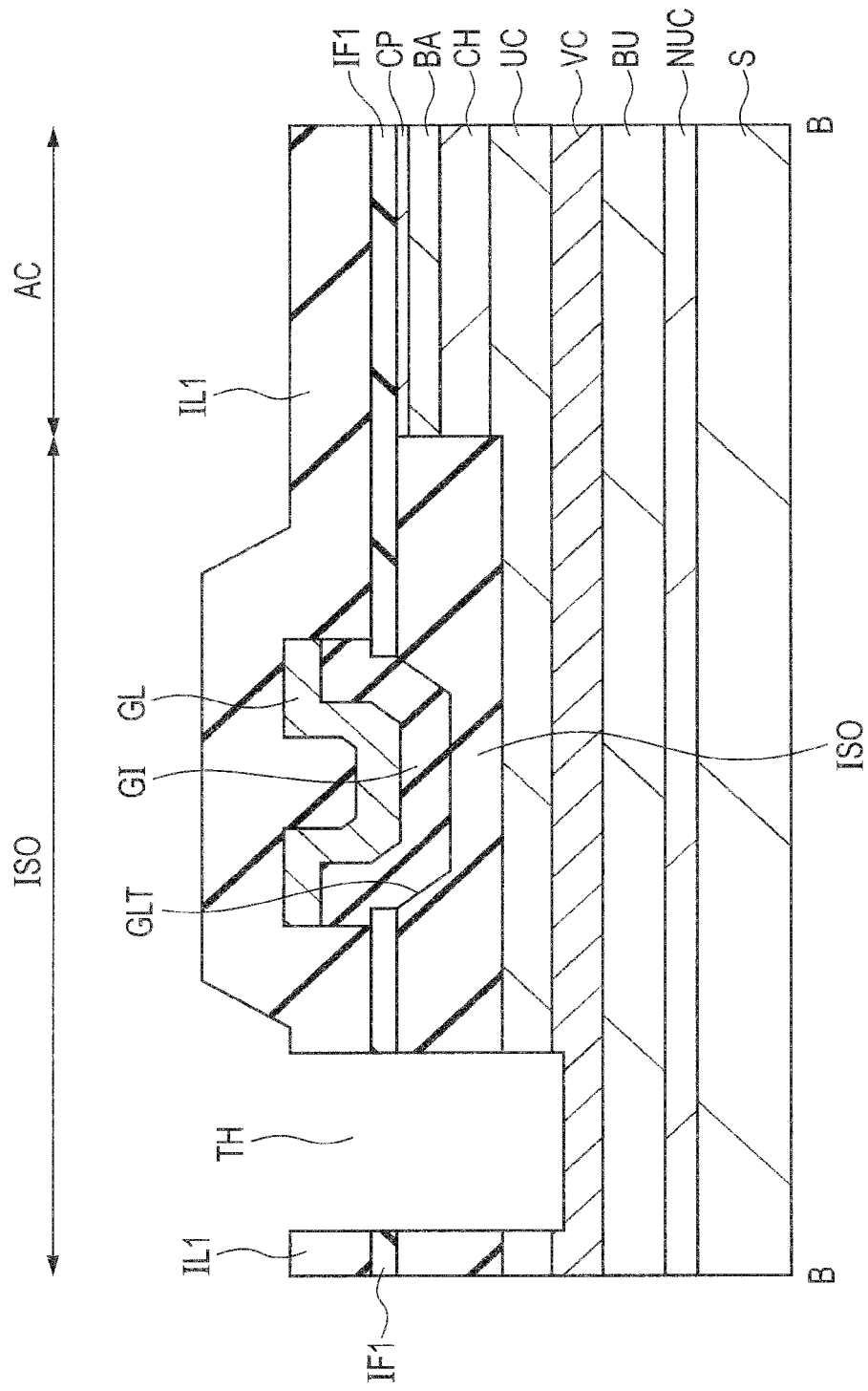
FIG. 21 is a cross sectional view showing the semiconductor device of First Embodiment during a manufacturing step, and showing the manufacturing step following FIG. 19.
Figure 22:
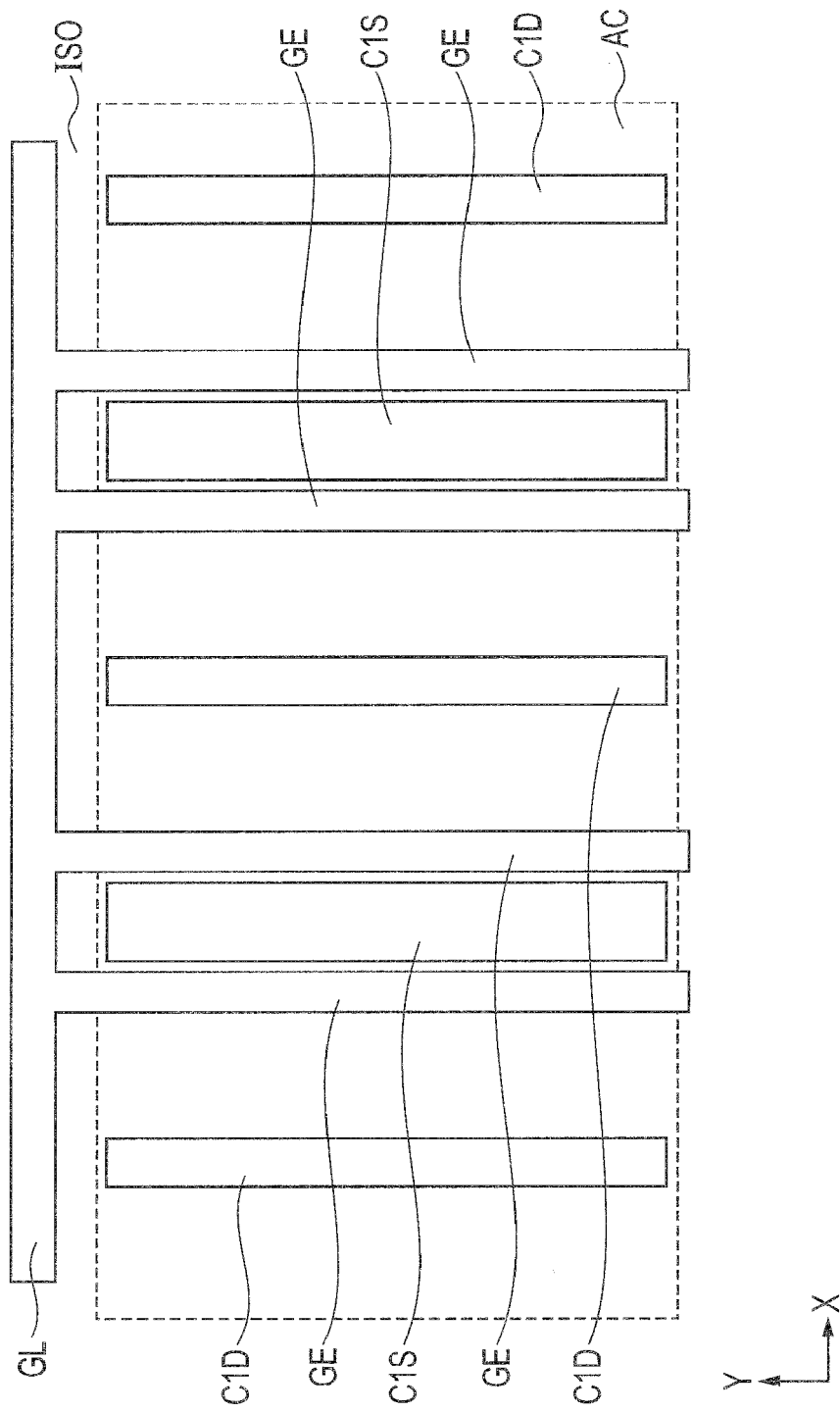
FIG. 22 is a plan view showing the semiconductor device of First Embodiment during a manufacturing step.

Then, as shown in FIGS. 20 to 22, using a photolithography technology and an etching technology, contact holes C1S and C1D, and a through hole TH are formed in the interlayer insulation film IL1 and the insulation film IF1. The contact holes C1S and C1D are formed in the source electrode formation region and the drain electrode formation region, respectively. Whereas, the through hole TH is formed in the source pad formation region.

For example, over the interlayer insulation film IL1, there is formed a first photoresist film having openings in a source electrode coupling region and a drain electrode coupling region, respectively. Then, using the first photoresist film as a mask, the interlayer insulation film IL1 and the insulation film IF1 are etched. As a result, there are formed the contact holes C1S and C1D.

When a silicon oxide film is used as the interlayer insulation film IL1, and a silicon nitride film is used as the insulation film IF1, dry etching using a dry etching gas containing a fluorine type gas such as $SF_6$ is performed for etching of the films.

Then, after removing the first photoresist film, over the interlayer insulation film IL1 including the insides of the contact holes C1S and C1D, there is formed a second photoresist film having an opening in a through hole formation region. Then, using the second photoresist film as a mask, the interlayer insulation film IL1, the insulation film IF1, the isolation region ISO, the channel base layer UC, and the potential fixed layer VC are partially etched. As a result, there is formed a through hole TH. In other words, there is formed a through hole TH penetrating through the interlayer insulation film IL1, the insulation film IF1, the isolation region ISO, and the channel base layer UC, and reaching some point of the potential fixed layer VC.

As described previously, etching is performed so that the bottom of the through hole TH is in the potential fixed layer VC, and is situated below the bottom of the isolation region ISO.

When a silicon oxide film is used as the interlayer insulation film IL1, and a silicon nitride film is used as the insulation film IF1, first, the films are removed by dry etching using a dry etching gas containing a fluorine type gas such as $SF_6$. Then, the isolation region ISO, the channel base layer (AlGaN layer) UC, and in the middle of the potential fixed layer (pGaN layer) VC are removed by dry etching using a dry etching gas containing a chlorine type gas such as $BCl_3$.

Incidentally, the formation order of the contact holes C1S and C1D, and the through hole TH is not limited to that described above. After the formation of the through hole TH, the contact holes C1S and C1D may be formed. Alternatively, the following is also acceptable: the interlayer insulation film IL1 in the through hole formation region, the source electrode coupling region, and the drain electrode coupling region is removed; then, the insulation film IF1, the isolation region ISO, the channel base layer UC, and the potential fixed layer VC in the through hole formation region are removed partway; further, the insulation film IF1 in the source electrode coupling region and the drain electrode coupling region is removed. Thus, the formation steps of the contact holes C1S and C1D, and the through hole TH may assume various steps.

From the bottom surfaces of the contact holes C1S and C1D formed in the steps described above, there is exposed the cap layer CP. From the bottom surface of the through hole TH, there is exposed the potential fixed layer VC.

Figure 23:
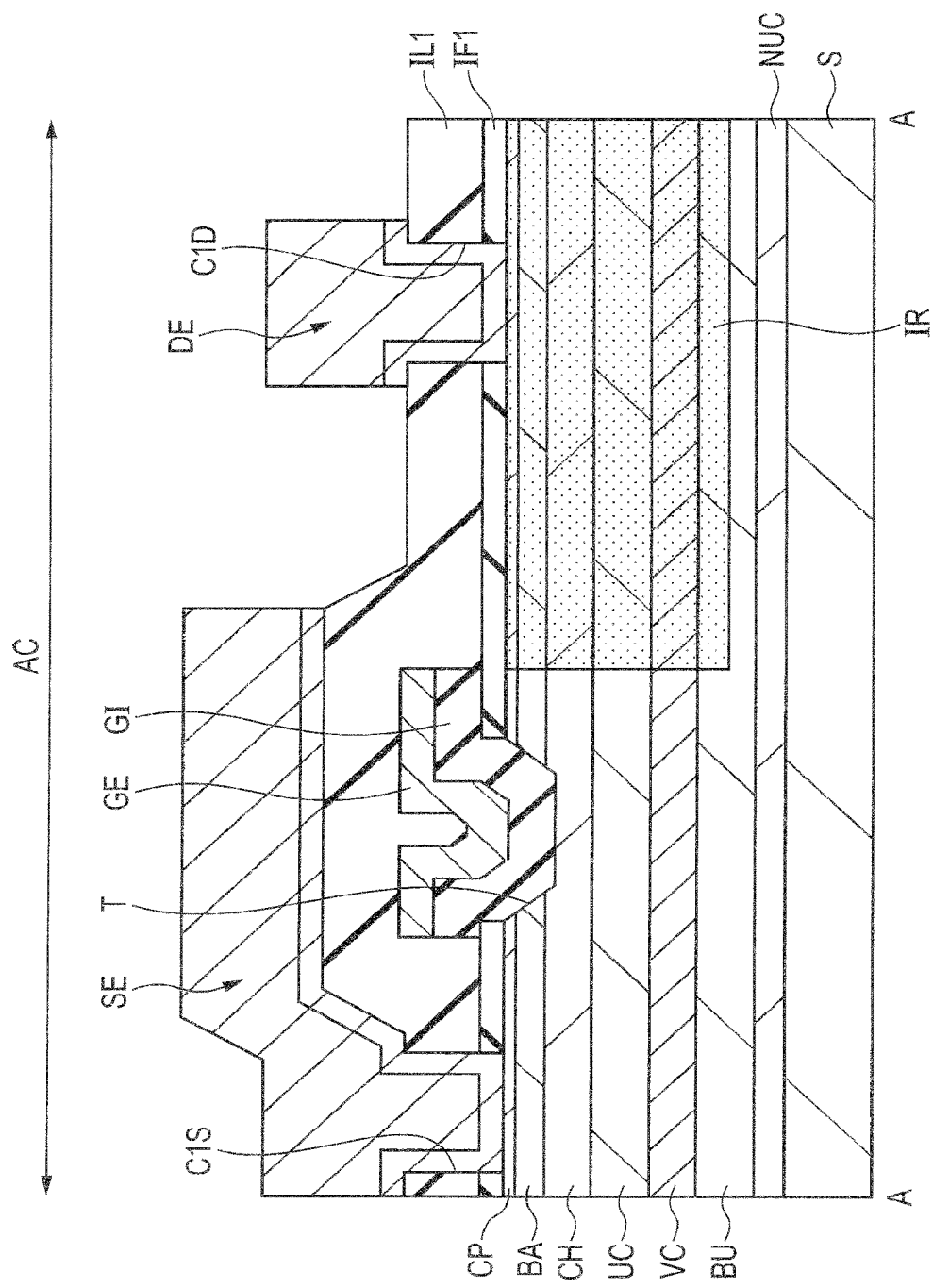
FIG. 23 is a cross sectional view showing the semiconductor device of First Embodiment during a manufacturing step, and showing the manufacturing step following FIG. 20.
Figure 24:
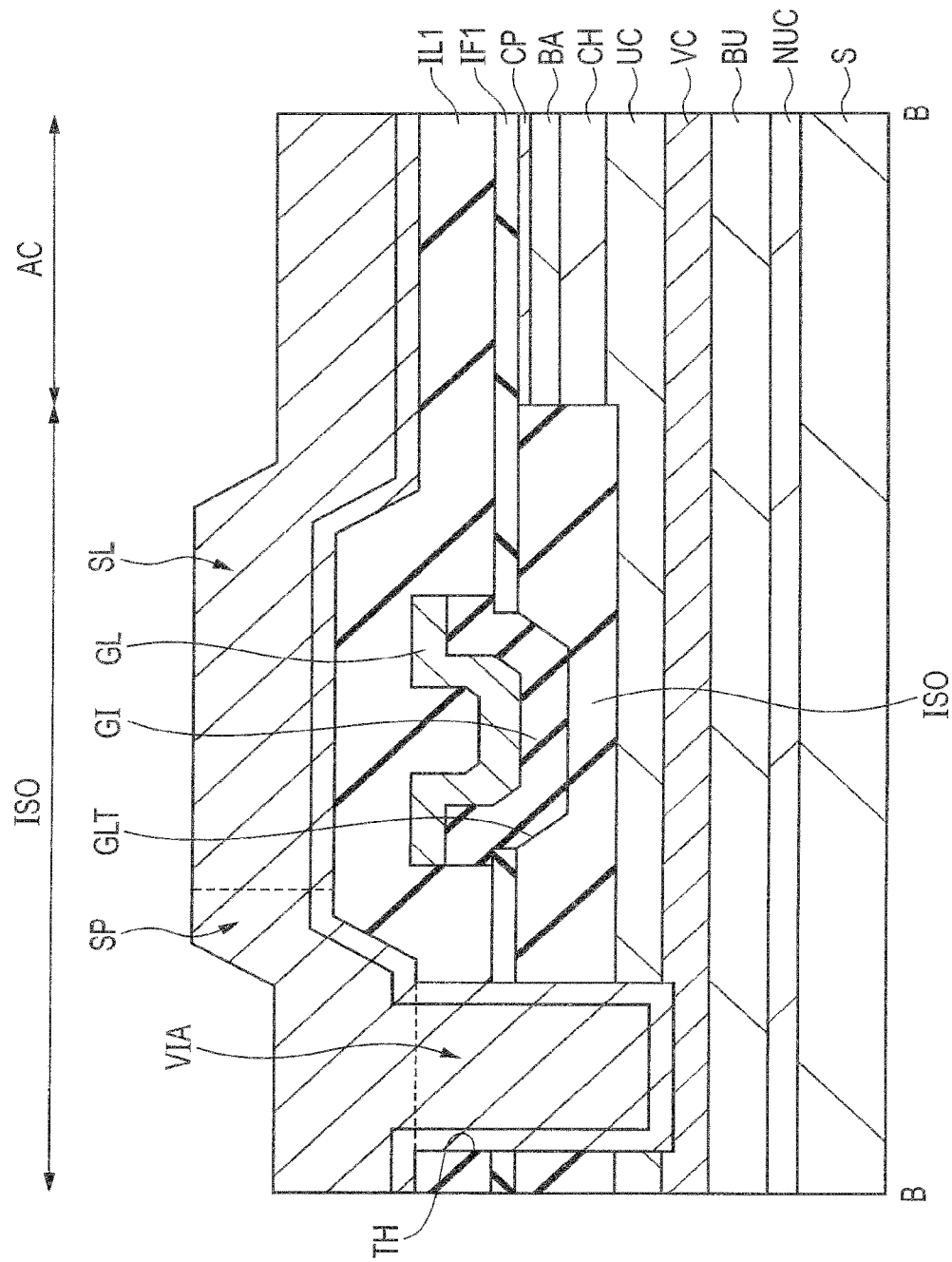
FIG. 24 is a cross sectional view showing the semiconductor device of First Embodiment during a manufacturing step, and showing the manufacturing step following FIG. 21.
Figure 25:
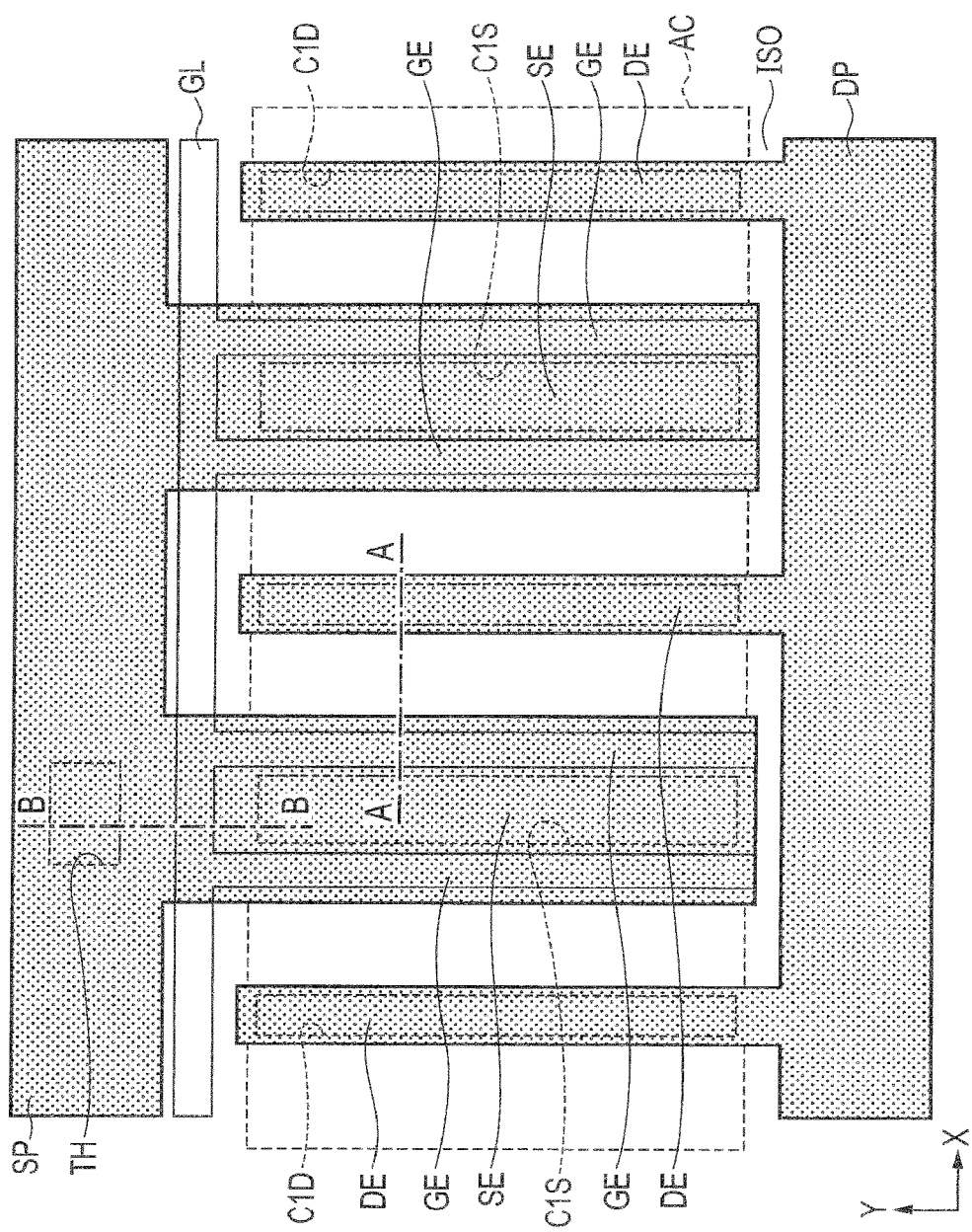
FIG. 25 is a plan view showing the semiconductor device of First Embodiment during a manufacturing step.

Then, as shown in FIGS. 23 to 25, over the cap layer CP on the opposite sides of the gate electrode GE, there are formed the source electrode SE and the drain electrode DE. Further, at the end of the source electrode SE, there is formed a source pad SP, and at the end of the drain electrode DE, there is formed a drain pad DP (FIG. 22).

For example, over the interlayer insulation film IL1 including the insides of the contact holes C1S and C1D, and the through hole TH, there is formed a conductive film. For example, as a conductive film, a lamination film (Al/TiN) formed of a titanium nitride (TiN) film and an aluminum (Al) film thereover is formed using a sputtering method, or the like. The titanium nitride film has a film thickness of, for example, about 50 nm. The aluminum film has a film thickness of, for example, about 1000 nm.

Then, using a photolithography technology, a photoresist film (not shown) is formed in the formation region of the source electrode SE, the drain electrode DE, the source pad SP, and the drain pad DP. Using the photoresist film (not shown) as a mask, the conductive film (Al/TiN) is etched. There is performed dry etching using a dry etching gas containing a chlorine type gas such as $BCl_3$. By this step, there is formed a coupling part VIA in which the conductive film is embedded in the through hole TH; and there are formed the source electrode SE, the drain electrode DE, the source pad SP, and the drain pad DP. Each planar shape of the source electrode SE and the drain electrode DE is a rectangular shape (line shape) having long sides in the Y direction as shown in FIG. 25. Whereas, each planar shape of the source pad SP and the drain pad DP is a rectangular shape (line shape) having long sides in the X direction. The source pad SP is arranged in such a manner as to ensure a coupling among a plurality of source electrodes SE. The drain pad DP is arranged in such a manner as to ensure a coupling among a plurality of drain electrodes DE.

Then, under the source pad SP, the through hole TH is situated, so that the source pad SP and the potential fixed layer VC are electrically coupled with each other via the coupling part VIA (FIG. 24).

Then, over the interlayer insulation film IL1 including over the source electrode SE, the drain electrode DE, the source pad SP, and the drain pad DP, there is formed a protective film (also referred to as an insulation film, a covering film, or a surface protective film) PRO. For example, over the interlayer insulation film IL1, as the protective film PRO, for example, a silicon oxynitride (SiON) film is deposited using a sputtering method, or the like (see FIGS. 3 and 4).

By the steps up to this point, there can be formed a semiconductor device of the present embodiment. Incidentally, the steps described above are examples. The semiconductor device of the present embodiment may also be manufactured by other steps than the steps described above. For example, after performing the ion implantation of an inactivating element, the gate electrode GE may be formed.

Thus, in accordance with the present embodiment, the potential fixed layer VC which is a conductive layer is provided between the buffer layer BU and the channel layer CH, and is coupled with the source electrode SE. This can reduce the characteristic fluctuations of the semiconductor device. Namely, the potential fixed layer VC can prevent a change in potential due to a change in charge amount of the layers below this layer (e.g., the buffer layer BU) from affecting even the channel layer CH. This can reduce the fluctuations in characteristics such as the threshold potential and the ON resistance.

Further, in the present embodiment, as the potential fixed layer VC, there is used a p type nitride semiconductor layer. Accordingly, when the drain electrode DE is applied with a positive potential (positive bias), the potential fixed layer VC is depleted, resulting in a high resistance layer. This can suppress the deterioration of, or can improve the drain breakdown voltage.

Further, in the present embodiment, the coupling part VIA in the through hole TH is arranged in the isolation region ISO outside the active region AC in which electrons are conducted, and under the formation region of the source pad SP. As a result, it is possible to implement miniaturization and high integration of semiconductor devices. Further, it is possible to ensure a large active region AC in which electrons can be conducted. For this reason, it is possible to reduce the ON resistance per unit area.

For example, when an impurity such as Fe is doped into the buffer layer for achieving a higher breakdown voltage (see Patent Document 1), the Fe forms a deep level. Such a deep level serves as the base point for trapping and release of electrons or holes during the operation of a semiconductor device, and hence causes the fluctuations in characteristics such as the threshold potential. Particularly, when the level is deep, the deep level may cause fluctuations in characteristics such as the threshold potential during a period as very long as several minutes to several days according to the energy depth or position.

In contrast, in the present embodiment, the potential fixed layer VC which is a conductive layer is provided between the buffer layer BU and the channel layer CH, and is coupled with the source electrode SE. This can reduce the characteristic fluctuations of the semiconductor device.

Whereas, when a superlattice structure is used as the buffer layer BU, the superlattice structure becomes a very deep quantum well (a very high barrier against the movement of electrons or holes). For this reason, when electric charges such as electrons or holes are trapped in the vicinity of the superlattice structure, it becomes difficult for the electric charges to move in the vertical direction the substrate. Accordingly, when a superlattice structure is used, unnecessary electric charges are difficult to remove. This may cause fluctuations in characteristics such as the threshold potential during a very long period.

In contrast, in the present embodiment, the potential fixed layer VC which is a conductive layer is provided between the buffer layer BU and the channel layer CH, and is coupled with the source electrode SE. This can reduce the characteristic fluctuations of the semiconductor device.

Further, when a plasma treatment is performed during the manufacturing steps, electric charges tend to be introduced into the semiconductor layer. Examples of the plasma treatment include PECVD, and the plasma asking treatment of a photoresist film. The electric charges introduced during such a treatment may cause fluctuations in characteristics such as the threshold potential. Particularly, a nitride semiconductor has a large bandgap, and also a high insulation property. For this reason, the electric charges introduced by a plasma treatment, or the like are less likely to be drained. This may also cause fluctuations in characteristics such as the threshold potential during a very long period.

In contrast, in the present embodiment, the potential fixed layer VC which is a conductive layer is provided between the buffer layer BU and the channel layer CH, and is coupled with the source electrode SE. This can reduce the characteristic fluctuations of the semiconductor device.

Further, in the present embodiment, an inactivated region IR is provided between the gate electrode GE and the drain electrode DE. Thus, the potential fixed layer VC situated between the gate electrode GE and the drain electrode DE is inactivated, resulting in the inactivated region IR. This can improve the drain breakdown voltage.

Figure 26:
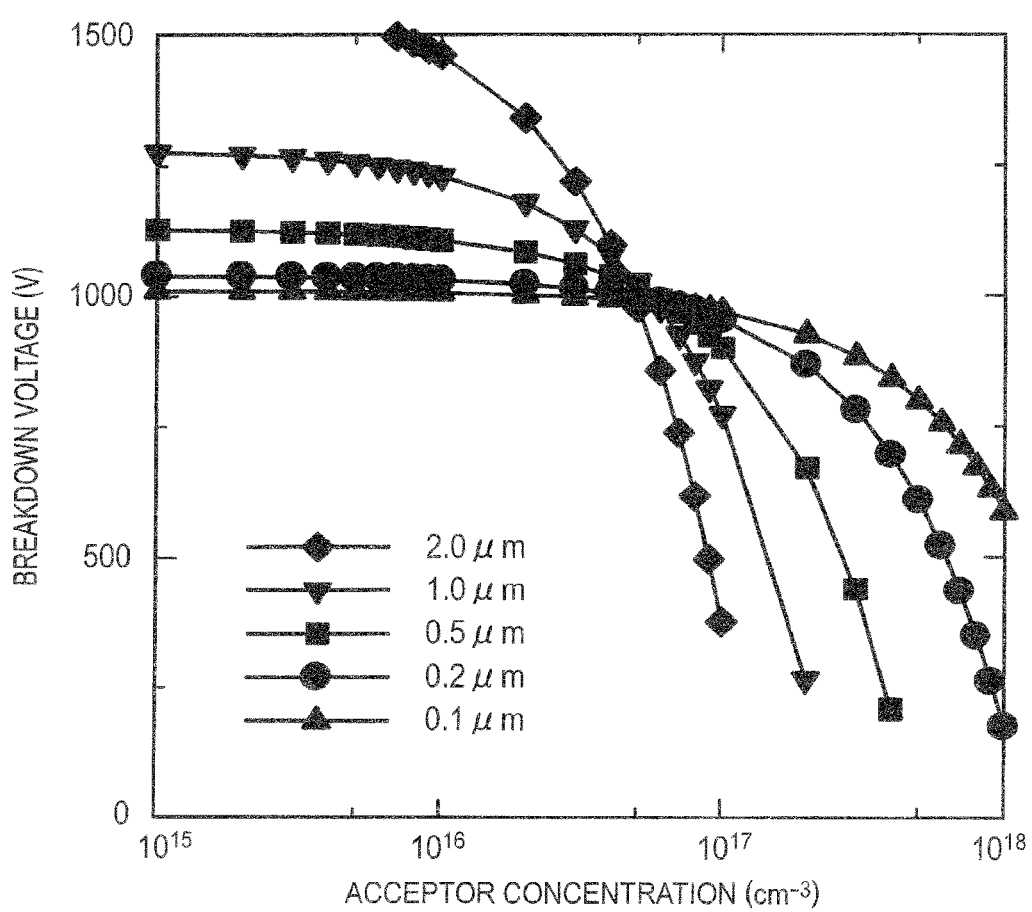
FIG. 26 is a graph showing the relationship between the longitudinal drain breakdown voltage and the activated acceptor concentration in a potential fixed layer.

FIG. 26 is a graph showing the relationship between the longitudinal drain breakdown voltage and the concentration of the activated acceptor in the potential fixed layer. The graph shows the results of simple calculation of the dependency of the activated acceptor concentration in the potential fixed layer with respect to the longitudinal drain breakdown voltage. Incidentally, the actual breakdown voltage differs depending upon the epitaxial structure other than that of the potential fixed layer. The horizontal axis denotes the acceptor concentration [$cm^{-3}$], and the vertical axis denotes the drain breakdown voltage [V]. As shown in FIG. 26, when the thickness of the potential fixed layer is set constant, the drain breakdown voltage decreases with an increase in acceptor concentration in the potential fixed layer. Namely, even when the thickness of the potential fixed layer is any of 2.0 μm, 1.0 μm, 0.5 μm, 0.2 μm, and 0.1 μm, with an increase in acceptor concentration, the drain breakdown voltage decreases. Particularly, when the acceptor concentration exceeds $1 \times 10^{17}$ (1E17) $cm^{-3}$, the drain breakdown voltage is remarkably deteriorated. Accordingly, from the viewpoint of the drain breakdown voltage, a restriction is caused on the concentration of the p type impurity in the potential fixed layer.

Particularly, the epitaxial growth layer of a nitride semiconductor such as GaN has a dislocation/defect. For this reason, even when a p type impurity (acceptor) is introduced, the generation rate of electric charges (herein, holes) is as low as less than 10%. Thus, doping of a p type impurity (acceptor) enough to remove the electric charges accumulated in the substrate causes the deterioration of the drain breakdown voltage.

In contrast, in the present embodiment, while keeping the concentration of the p type impurity high on the source electrode SE side, the p type impurity can be inactivated on the drain electrode DE side. Thus, the p type potential fixed layer in a region affecting the drain breakdown voltage can be inactivated. Accordingly, it becomes possible to set high the p type impurity concentration (acceptor concentration) on the source electrode SE side independent of the breakdown voltage. For this reason, while keeping the breakdown voltage on the drain side, the electric charges such as electrons or holes are removed. This can suppress the fluctuations in characteristics such as the threshold potential.

Particularly, as described previously, when a p type nitride semiconductor layer is used as the potential fixed layer, with the drain electrode DE applied with a positive potential (positive bias), the potential fixed layer VC is depleted, resulting in a high resistance layer. For this reason, the conductivity type of the impurity in the potential fixed layer is more preferably set as a p type. Further, as the p type impurity, Mg is useful. As the inactivating element for reducing the activation ratio of Mg, H is preferable. Particularly, H has a small atomic weight, and hence can be implanted even into a deep layer with ease, and is preferably used as an inactivating element.

Further, it is possible to individually control the p type impurity concentration (acceptor concentration) on the drain electrode DE side, and the p type impurity concentration (acceptor concentration) on the source electrode SE side. For this reason, it becomes possible to increase the film thickness of the p type potential fixed layer VC. This can reduce the coupling resistance between the p type potential fixed layer VC and the coupling part VIA. Further, it is possible to increase the process margin when the through hole TH in which the coupling part VIA is embedded is formed by etching.

Applied Example 1

In the semiconductor device (see FIG. 3), the end of the inactivated region IR on the gate electrode GE side is not limited to the position shown in the semiconductor device (see FIG. 3), and can be appropriately changed between the gate electrode GE and the drain electrode DE.

Figure 27:
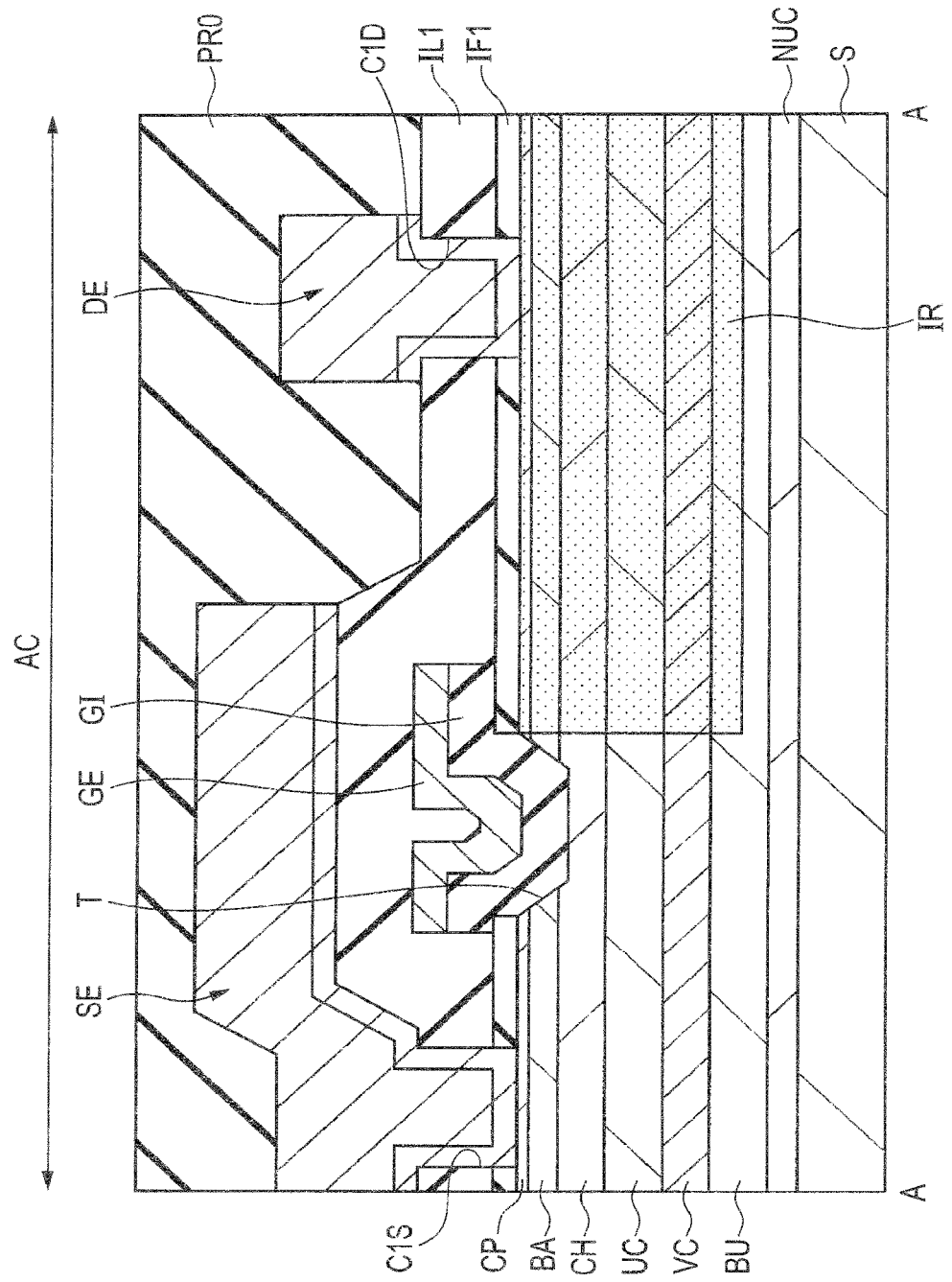
FIG. 27 is a cross sectional view showing a configuration of a semiconductor device of Applied Example 1 of First Embodiment.

FIG. 27 is a cross sectional view showing a configuration of a semiconductor device of Applied Example 1 of the present embodiment. The configuration is the same as that of the semiconductor device (FIGS. 2 to 25) except for the position of the end of the inactivated region IR on the gate electrode GE side.

As shown in FIG. 27, the end of the inactivated region IR on the gate electrode GE side may be allowed to correspond to the end of the trench T on the drain electrode DE side. Namely, in this case, the inactivated region IR extends from the end of the trench T on the drain electrode DE side to under the drain electrode DE.

Applied Example 2

Figure 28:
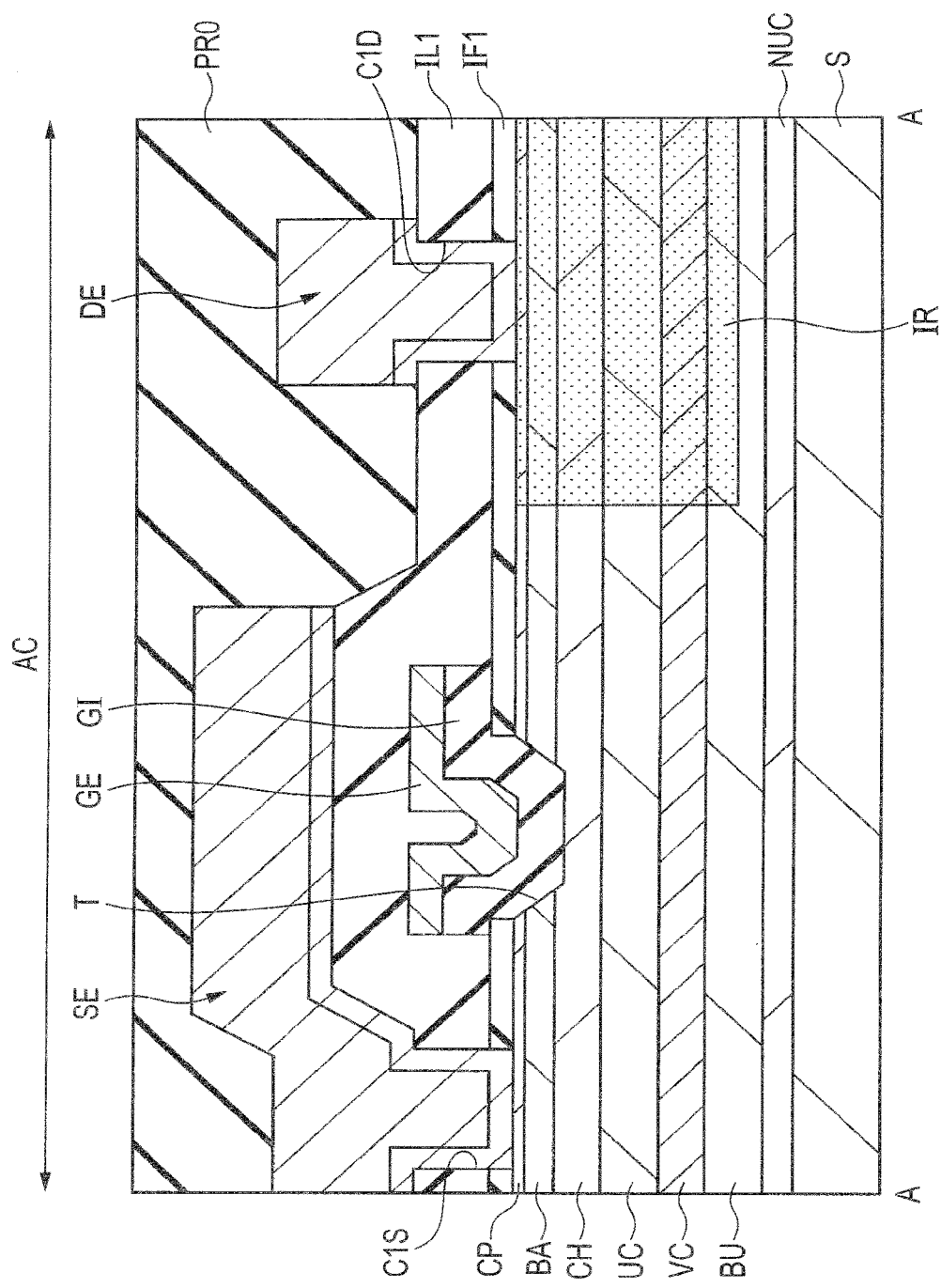
FIG. 28 is a cross sectional view showing a configuration of a semiconductor device of Applied Example 2 of First Embodiment.

FIG. 28 is a cross sectional view showing a configuration of a semiconductor device of Applied Example 2 of the present embodiment. The configuration is the same as that of the semiconductor device (FIGS. 2 to 25) except for the position of the end of the inactivated region IR on the gate electrode GE side.

As shown in FIG. 28, the end of the inactivated region IR on the gate electrode GE side may be arranged between the end on the gate electrode GE and the drain electrode DE. Namely, in this case, the inactivated region IR extends from the position distant from the end of the gate electrode GE on the drain electrode DE side by a given distance to under the drain electrode DE.

Applied Example 3

In the semiconductor device (see FIG. 1), the coupling part VIA is provided; and the potential fixed layer VC is coupled with the source electrode SE via the coupling part VIA. However, the formation of the coupling part VIA may be omitted.

Figure 29:
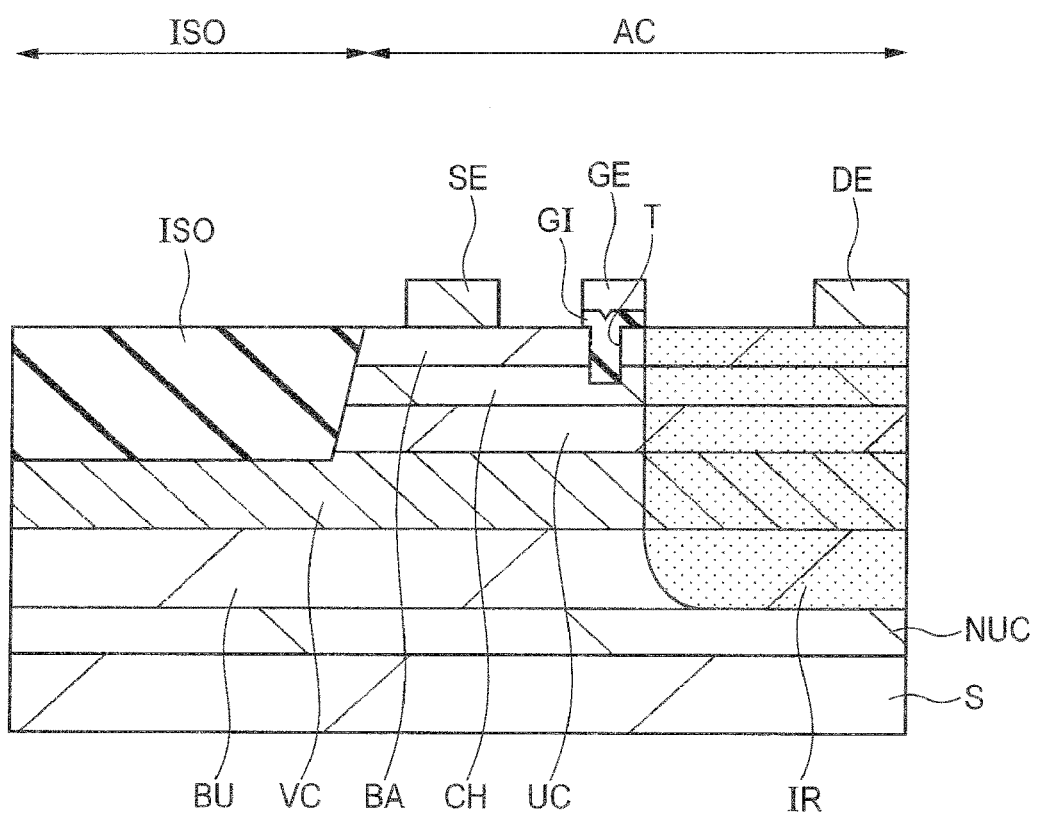
FIG. 29 is a cross sectional view schematically showing a configuration of a semiconductor device of Applied Example 3 of First Embodiment.

FIG. 29 is a cross sectional view schematically showing a configuration of a semiconductor device of Applied Example 3 of the present embodiment. In the present applied example, over a substrate S, there are sequentially formed a nucleation layer NUC, a buffer layer BU, a p type potential fixed layer VC, a channel base layer UC, a channel layer CH, and a barrier layer BA. On the channel layer CH side in the vicinity of the interface between the channel layer CH and the barrier layer BA, there is formed a two-dimensional electron gas (2DEG). Whereas, when the gate electrode GE is applied with a positive potential (threshold potential), a channel is formed in the vicinity of the interface between the gate insulation film GI and the channel layer CH. Thus, although the p type potential fixed layer VC is provided, the p type potential fixed layer VC is not fixed to the source potential. Thus, the p type potential fixed layer VC is arranged below the channel layer CH. Only this can reduce the effect of the electric charges such as electrons or holes on the gate electrode source end most affecting the threshold potential. This can suppress the fluctuations in characteristics such as the threshold potential. However, fixing of the potential of the p type potential fixed layer VC results in a higher effective p type impurity concentration (acceptor concentration). As a result, the electric charge removing effect is enhanced.

Accordingly, even when the coupling part VIA is not provided, while setting high the p type impurity concentration (acceptor concentration) of the potential fixed layer VC on the source electrode SE side, the p type impurity of the potential fixed layer VC is inactivated on the drain electrode DE side. As a result, while keeping the electric charge removing effect, the breakdown voltage on the drain side can be improved.

Second Embodiment

In First Embodiment, using the photoresist film as a mask, an inactivating element was implanted. However, using the gate insulation film GI as a mask, an inactivating element may be implanted.

[Structure Description]

Figure 30:
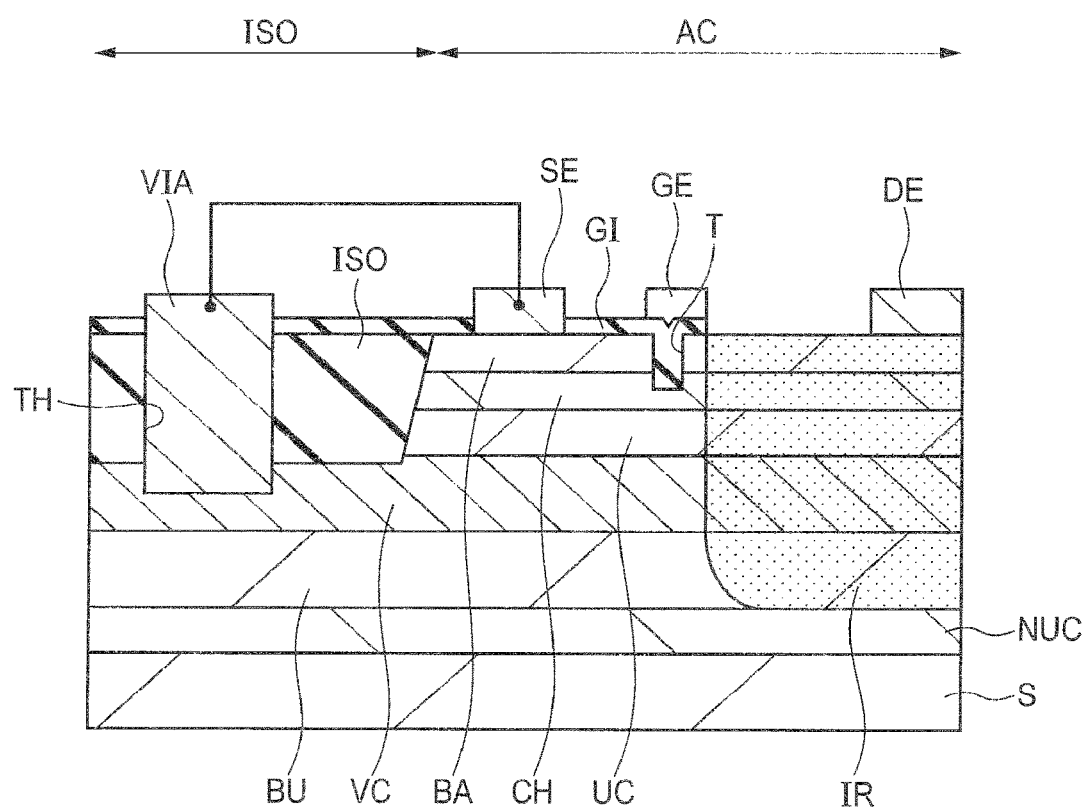
FIG. 30 is a cross sectional view schematically showing a configuration of a semiconductor device of Second Embodiment.

FIG. 30 is a cross sectional view schematically showing a configuration of a semiconductor device of the present embodiment. Incidentally, the configuration of the present embodiment is the same as that in First Embodiment, except for the configuration of the gate insulation film GI. For this reason, a detailed description on the same configuration will be omitted.

In the semiconductor device of the present embodiment, as with First Embodiment (FIG. 1), over a substrate S, there are sequentially formed a nucleation layer NUC, a buffer layer BU, a potential fixed layer VC, a channel base layer UC, a channel layer CH, and a barrier layer BA.

A MISFET of the present embodiment has, as with First Embodiment (FIG. 1), a gate electrode GE formed over the channel layer CH via a gate insulation film GI, and a source electrode SE and a drain electrode DE formed over the barrier layer BA on the opposite sides of the gate electrode GE, respectively. The MISFET is formed in an active region (AC) defined by isolation regions ISO. Further, the gate electrode GE is formed in the inside of a trench T penetrating through the barrier layer BA, and reaching some point of the channel layer CH via the gate insulation film GI.

Herein, in the present embodiment, in the isolation region ISO, there is provided a coupling part (also referred to as a via) VIA penetrating through the isolation region ISO, and reaching the underlying potential fixed layer VC. The coupling part VIA is electrically coupled with the source electrode SE. Thus, the potential fixed layer VC is provided, and coupled with the source electrode SE. As a result, it is possible to reduce the fluctuations in characteristics such as the threshold potential and the ON resistance.

Further, in the present embodiment, the coupling part VIA in the through hole TH is arranged in the isolation region ISO outside the active region AC in which electrons are conducted, and under the formation region of the source pad SP. As a result, it is possible to implement miniaturization and high integration of semiconductor devices. Further, it is possible to ensure a large active region AC in which electrons can be conducted. For this reason, it is possible to reduce the ON resistance per unit area.

Further, in the present embodiment, an inactivated region IR is provided between the gate electrode GE and the drain electrode DE. The inactivated region IR is an inactivating element doped region. Thus, the potential fixed layer VC doped with an impurity to produce a p type situated between the gate electrode GE and the drain electrode DE is inactivated, resulting in the inactivated region IR. As a result, it is possible to improve the drain breakdown voltage. The activation ratio of the inactivated region IR is preferably set smaller than, and at 1/10 or less the activation ratio of the region under the source electrode SE.

Then, in the present embodiment, the gate insulation film extends from under the gate electrode GE to the source electrode SE. Thus, the gate insulation film GI on the source electrode SE side is left. As a result, the gate insulation film GI can be used as a mask for doping an inactivating element.

Specifically, the inactivated region IR is provided between the gate electrode GE and the drain electrode DE; and the gate insulation film GI is left in a region between the end of the gate electrode GE on the drain electrode DE side and the source electrode SE.

Figure 31:
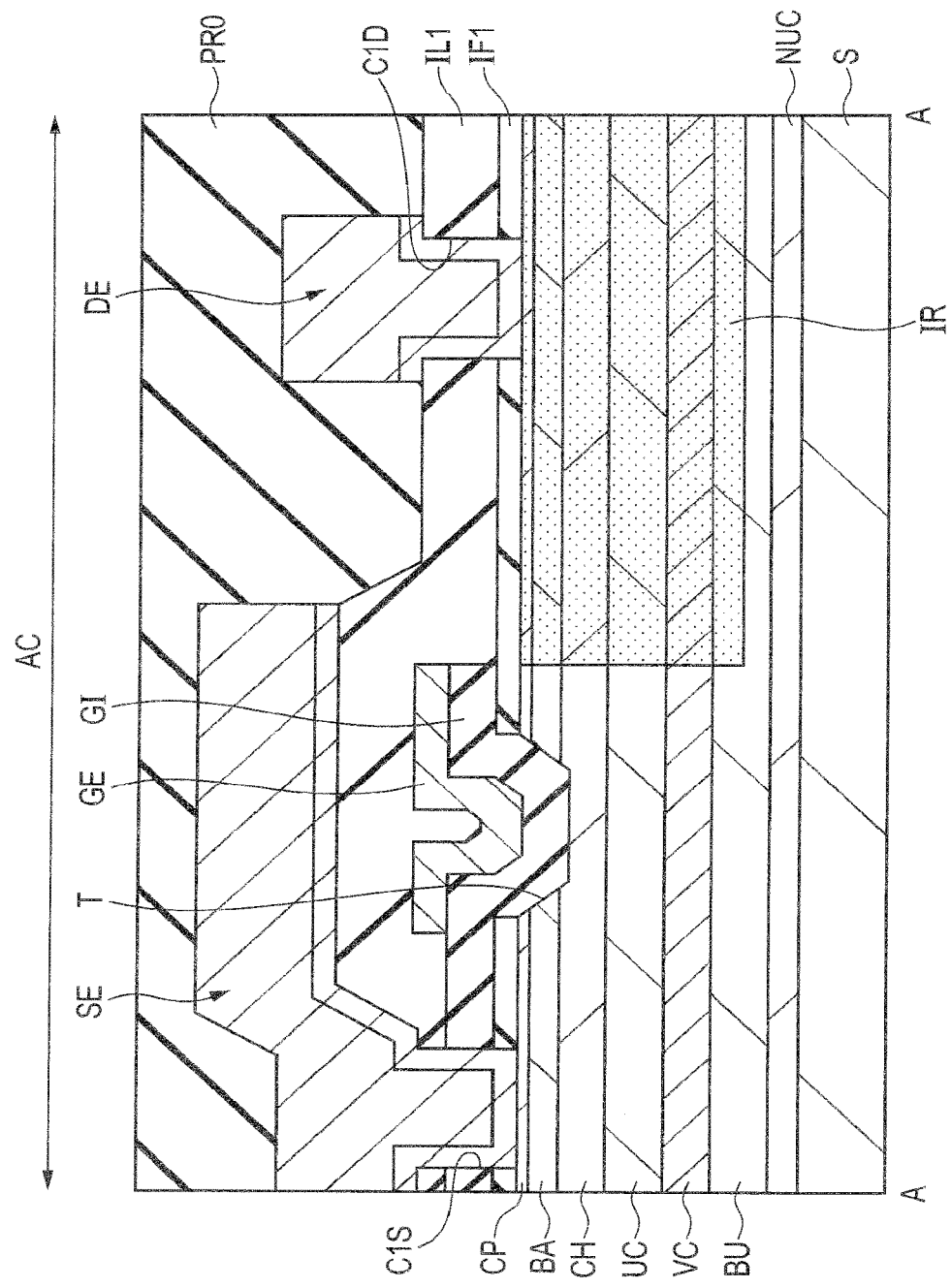
FIG. 31 is a cross sectional view showing a configuration of the semiconductor device of Second Embodiment.
Figure 32:
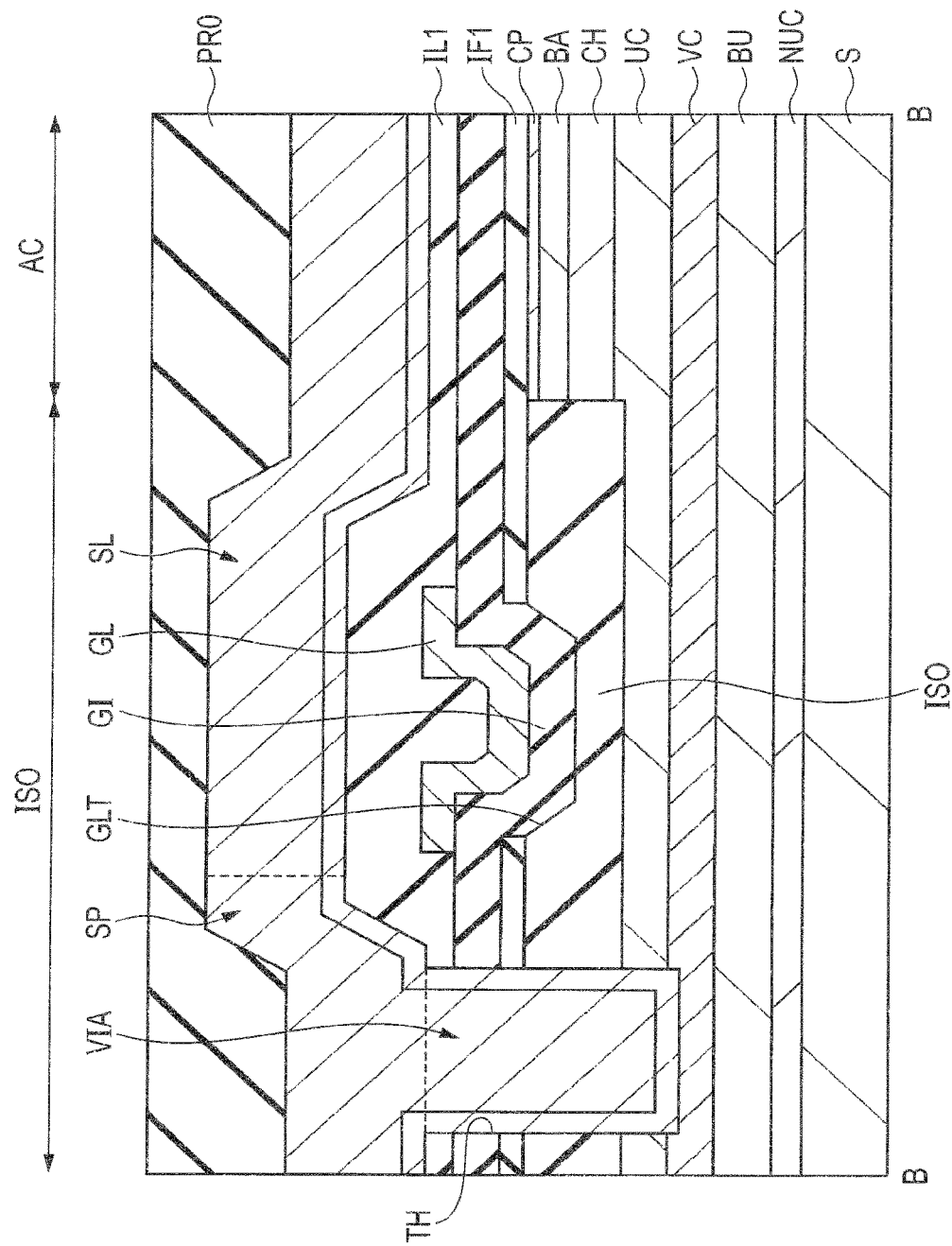
FIG. 32 is a cross sectional view showing a configuration of the semiconductor device of Second Embodiment.

With reference to FIGS. 31 and 32, the semiconductor device of the present embodiment will be further described in details. FIGS. 31 and 32 are each a cross sectional view showing a configuration of the semiconductor device of the present embodiment.

As shown in FIGS. 31 and 32, in the semiconductor device of the present embodiment, as with First Embodiment, over a substrate S, there are sequentially formed a nucleation layer NUC, a buffer layer BU, a potential fixed layer VC, a channel base layer UC, a channel layer (also referred to as an electron transit layer) CH, and a barrier layer BA. The nucleation layer NUC is formed of a nitride semiconductor layer. The buffer layer BU is formed of a monolayered or multilayered nitride semiconductor layer doped with an impurity for forming a deep level in a nitride semiconductor. Herein, there is used a superlattice structure formed of a multilayer nitride semiconductor layer. The potential fixed layer VC is formed of a nitride semiconductor layer doped with an impurity, and has a conductivity. The channel base layer UC is formed of a nitride semiconductor layer smaller in electron affinity than the channel layer CH, and smaller in average lattice constant in the substrate surface direction than the channel layer CH. The channel layer CH is formed of a nitride semiconductor layer larger in electron affinity than the channel base layer UC. The barrier layer BA is formed of a nitride semiconductor layer smaller in electron affinity than the channel layer CH, and smaller in electron affinity than the channel base layer UC.

As the potential fixed layer VC, there can be used, for example, a GaN layer doped with a p type impurity. Other than the GaN layer, there may be used an AlN layer or an InN layer. Alternatively, a mixed crystal of the nitride semiconductors may be used. For example, as the potential fixed layer VC, there can be used a GaN layer doped with Mg in an amount of about $5 \times 10^{18}$ (5E18) $cm^{-3}$ as an impurity. The film thickness of the potential fixed layer VC is about 200 nm.

As the gate insulation film GI, there can be used an aluminum oxide ($Al_2O_3$) film. The thickness of the aluminum oxide film is, for example, about 50 nm. As the gate insulation film GI, there may be used an insulation film other than an aluminum oxide film. Alternatively, there may be adopted a lamination structure of several kinds of insulation films.

The inactivated region IR is provided between the gate electrode GE and the drain electrode DE, and reaches the potential fixed layer VC in the depth direction. The inactivated region IR is a region resulting from inactivation of the potential fixed layer VC doped with an impurity to produce a p type situated between the gate electrode GE and the drain electrode DE by doping of an inactivating element. In the present embodiment, the inactivated region IR is formed by implanting an inactivating element using the gate insulation film GI as a mask. For this reason, in other regions than the formation region of the inactivated region IR, there is left the gate insulation film GI.

Specifically, in a region between the gate electrode GE and the drain electrode DE, there is provided the inactivated region IR; and in a region between the end of the gate electrode GE on the drain electrode DE side and the source electrode SE, there is left the gate insulation film GI.

As the gate electrode GE, there can be used a titanium nitride (TiN) film. The thickness of the titanium nitride film is, for example, about 200 nm. As the gate electrode GE, there may be used a conductive film other than a titanium nitride film.

Over the gate electrode GE, there is arranged the interlayer insulation film IL1. The interlayer insulation film IL1 has the through hole TH and the contact holes C1S and C1D. The source pad SP and the drain pad DP are formed integrally with the source electrode SE and the drain electrode DE, respectively. Accordingly, the source pad SP and the drain pad DP are formed of the same materials as those for the source electrode SE and the drain electrode DE, respectively. Under the source pad SP, there is arranged the coupling part VIA (FIG. 4).

As a protective film PRO, there can be used an insulation film such as a silicon oxynitride (SiON) film.

Herein, in the present embodiment, in the isolation region ISO, there is provided a coupling part (also referred to as a via) VIA penetrating through the isolation region ISO, and reaching the underlying potential fixed layer VC. The coupling part VIA is electrically coupled with the source electrode SE. Thus, the potential fixed layer VC is provided, and coupled with the source electrode SE. As a result, as with First Embodiment, it is possible to reduce the fluctuations in characteristics such as the threshold potential and the ON resistance.

Further, in the present embodiment, an inactivated region IR is provided between the gate electrode GE and the drain electrode DE. The inactivated region IR is an ion implanted region of an inactivating element implanted into the lamination part of the potential fixed layer VC, the channel base layer UC, the channel layer CH, and the barrier layer BA situated between the gate electrode GE and the drain electrode DE. Injection of an inactivating element may desirably be performed in at least the potential fixed layer VC. Other layers (e.g., the channel base layer UC, the channel layer CH, and the barrier layer BA) are not required to contain an inactivating element with a high concentration. Accordingly, in consideration of the implantation energy and the carry distance of the inactivating element, adjustment may desirably be achieved so that an inactivating element is contained in a desirable amount in the potential fixed layer VC. For example, an inactivating element is implanted so that the activation ratio of the p type impurity in the potential fixed layer VC in the inactivated region IR is lower than, and is preferably 1/10 or less the activation ratio of the p type impurity in the potential fixed layer VC under the source electrode SE not inactivated. However, an inactivating element may be diffused into the layer in the vicinity of the potential fixed layer VC. For example, an inactivating element may be diffused into the channel base layer UC, the channel layer CH, and the barrier layer BA. Alternatively, an inactivating element may be diffused into the layers below the potential fixed layer VC. However, the inactivating element is for inactivating the p type impurity, and does not eliminate the two-dimensional electron gas 2DEG.

Further, in the present embodiment, the formation is achieved by implanting an inactivating element using the gate insulation film GI as a mask. Particularly, the aluminum oxide film has a function of inhibiting the transmission of small ions such as hydrogen (H). For this reason, use of the gate insulation film (aluminum oxide film) GI as a mask can favorably achieve selective implantation of an inactivating element.

[Manufacturing Method Description]

Then, with reference to FIGS. 33 to 49, a description will be given to a method for manufacturing the semiconductor device of the present embodiment. In addition, the configuration of the semiconductor device will be made clearer. FIGS. 33 to 49 are each a cross sectional view or a plan view showing the semiconductor device of the present embodiment during a manufacturing step. Incidentally, the configuration of the present embodiment is the same as that of First Embodiment, except for the configuration of the gate insulation film GI. Accordingly, the steps in association with the gate insulation film GI will be described in details.

Figure 33:
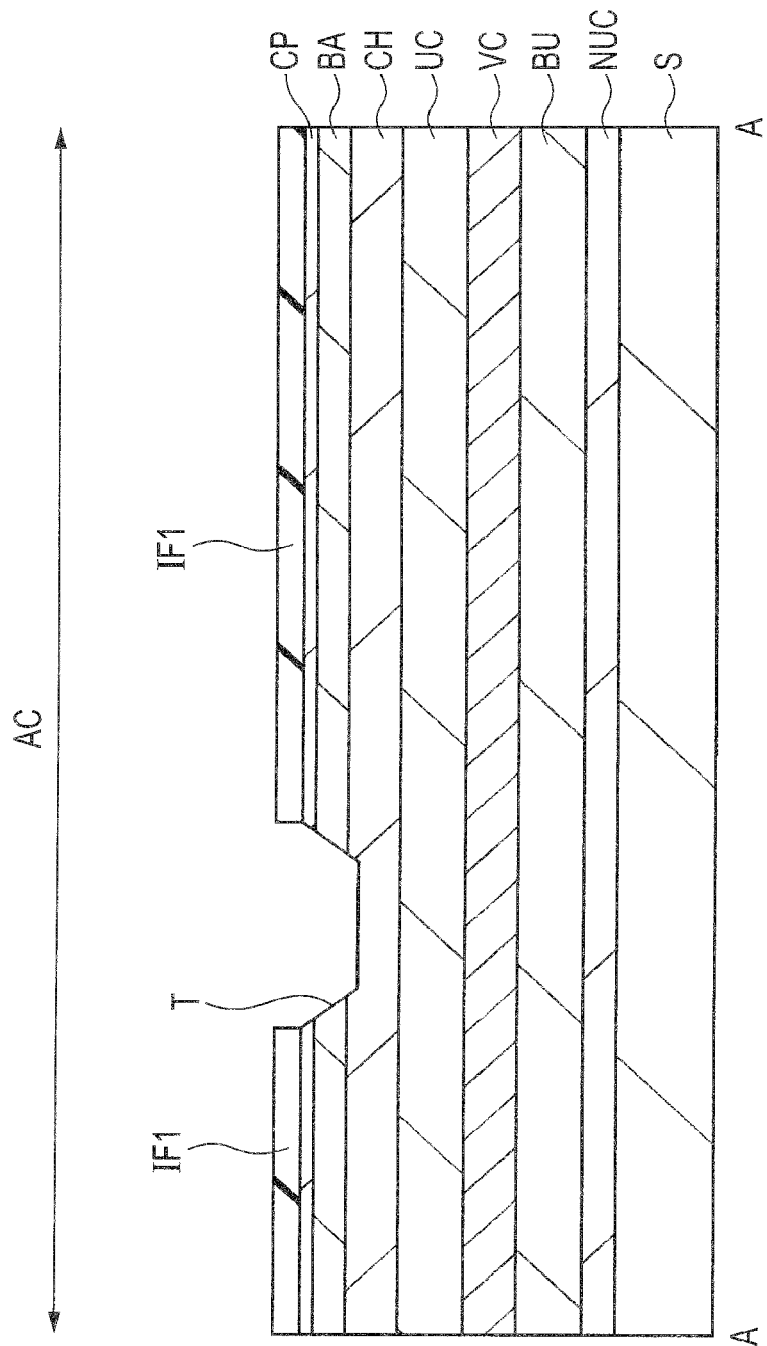
FIG. 33 is a cross sectional view showing the semiconductor device of Second Embodiment during a manufacturing step.
Figure 34:
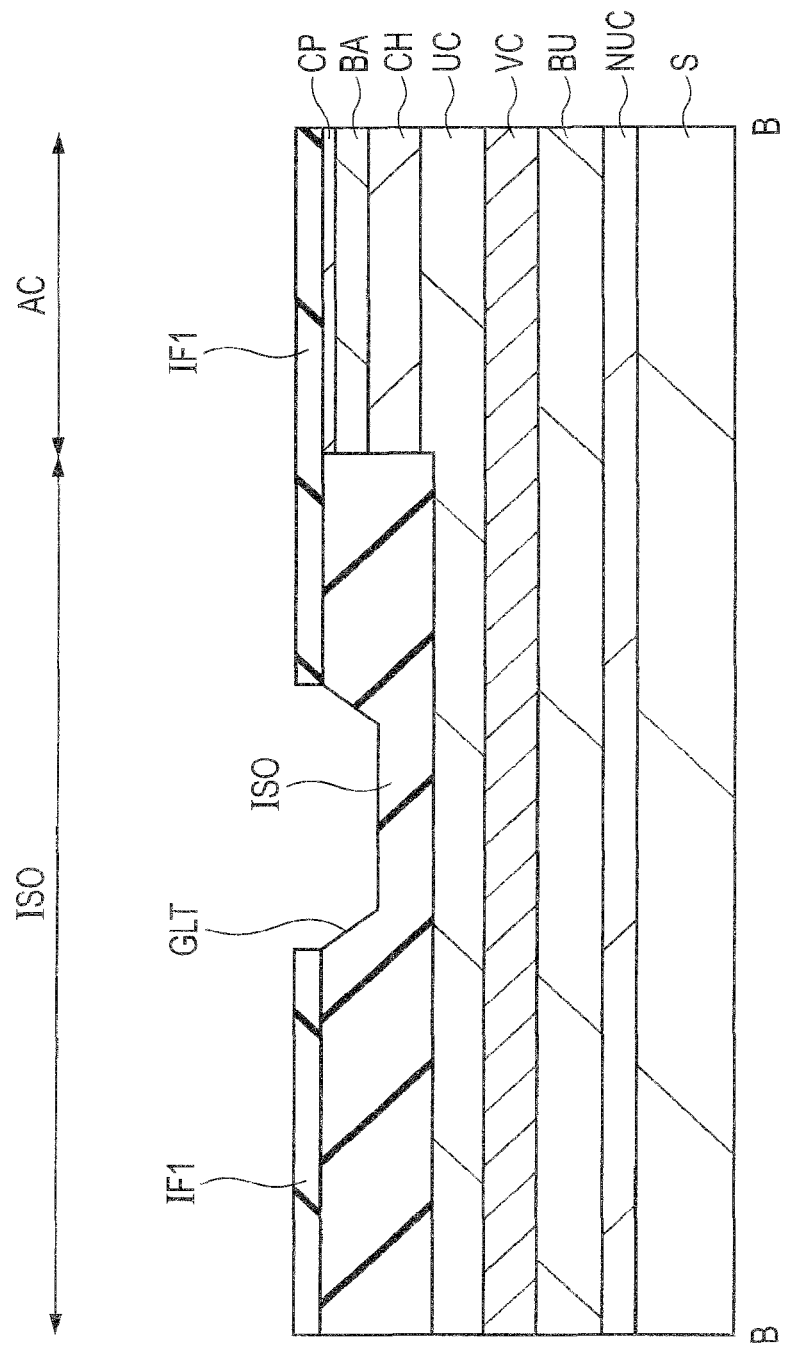
FIG. 34 is a cross sectional view showing the semiconductor device of Second Embodiment during a manufacturing step.

As shown in FIGS. 33 and 34, over a substrate S, there are sequentially formed a nucleation layer NUC and a buffer layer BU. For these, the materials described in First Embodiment are used. Thus, the formation can be achieved in the same manner as in First Embodiment.

Then, over the buffer layer BU, as a potential fixed layer VC, for example, a gallium nitride layer (p-GaN layer) containing a p type impurity is epitaxially grown using the metal organic chemical vapor deposition method, or the like. For example, as a p type impurity, there is used magnesium (Mg). For example, while doping magnesium (Mg), a gallium nitride layer is deposited about 200 nm in thickness. The Mg concentration in the deposited film is set at, for example, about $5 \times 10^{18}$ (5E18) $cm^{-3}$.

Then, over the potential fixed layer VC, there are sequentially formed a channel base layer UC, a channel layer CH, a barrier layer BA, a cap layer CP, and an insulation film IF1. For these, the materials described in First Embodiment are used. Thus, the formation can be achieved in the same manner as in First Embodiment. Then, in the same manner as in First Embodiment, there is formed an isolation region ISO. Further, there is formed a trench T penetrating through the insulation film IF1, the cap layer CP, and the barrier layer BA, and reaching some point of the channel layer CH. At this step, in the isolation region ISO, there is formed a trench GLT for the gate line GL (FIG. 34).

Figure 35:
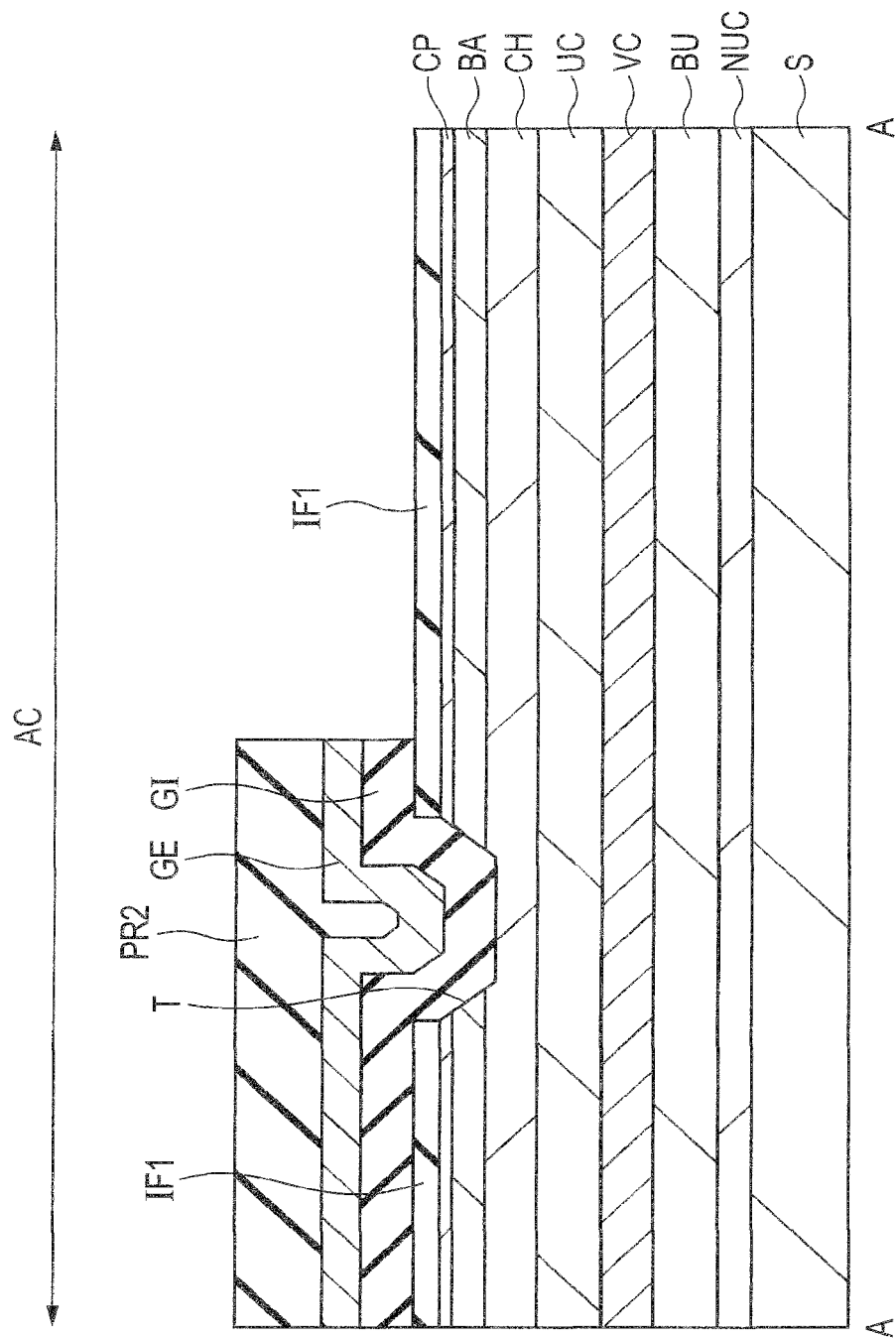
FIG. 35 is a cross sectional view showing the semiconductor device of Second Embodiment during a manufacturing step, and showing the manufacturing step following FIG. 33.
Figure 36:
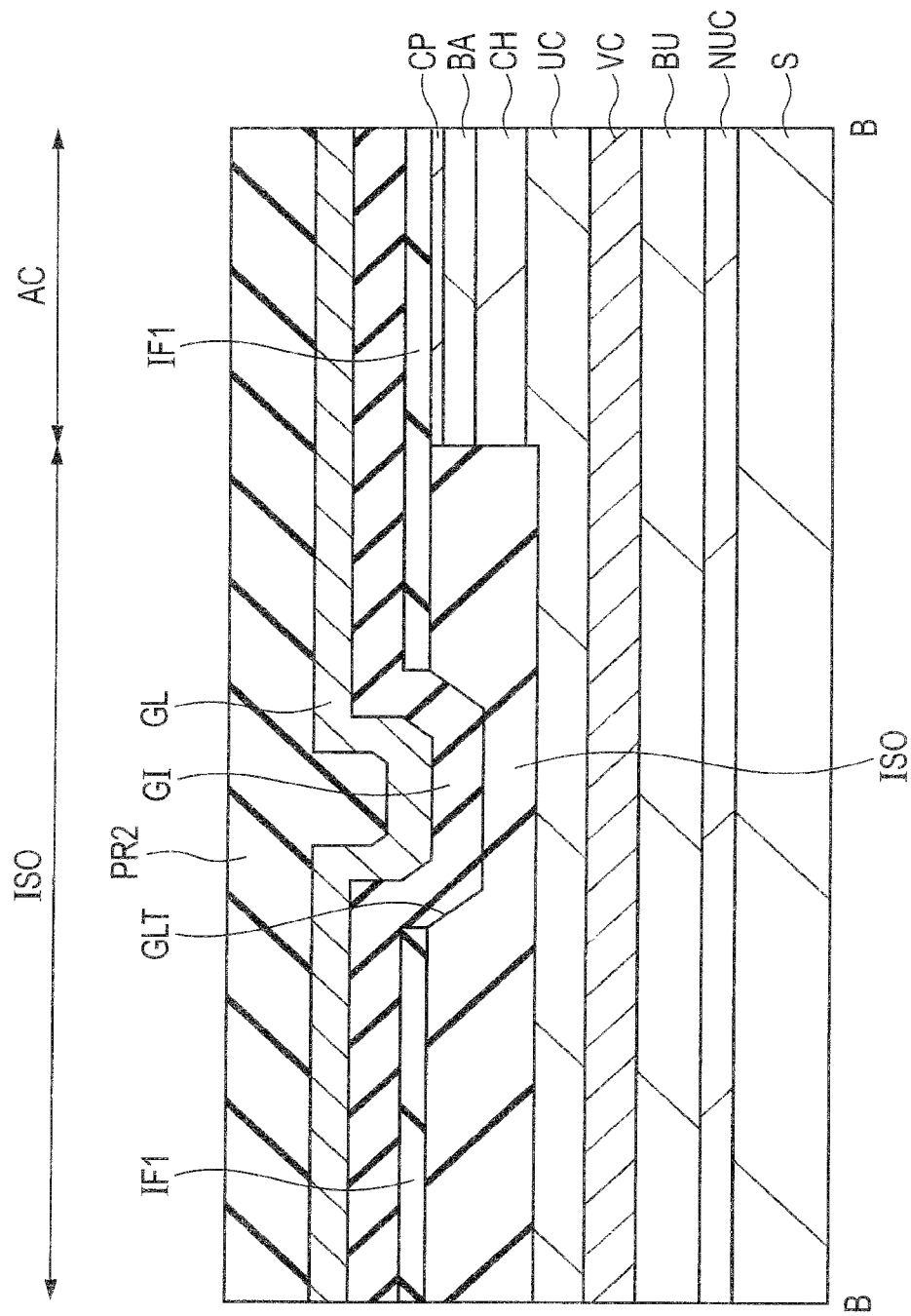
FIG. 36 is a cross sectional view showing the semiconductor device of Second Embodiment during a manufacturing step, and showing the manufacturing step following FIG. 34.
Figure 37:
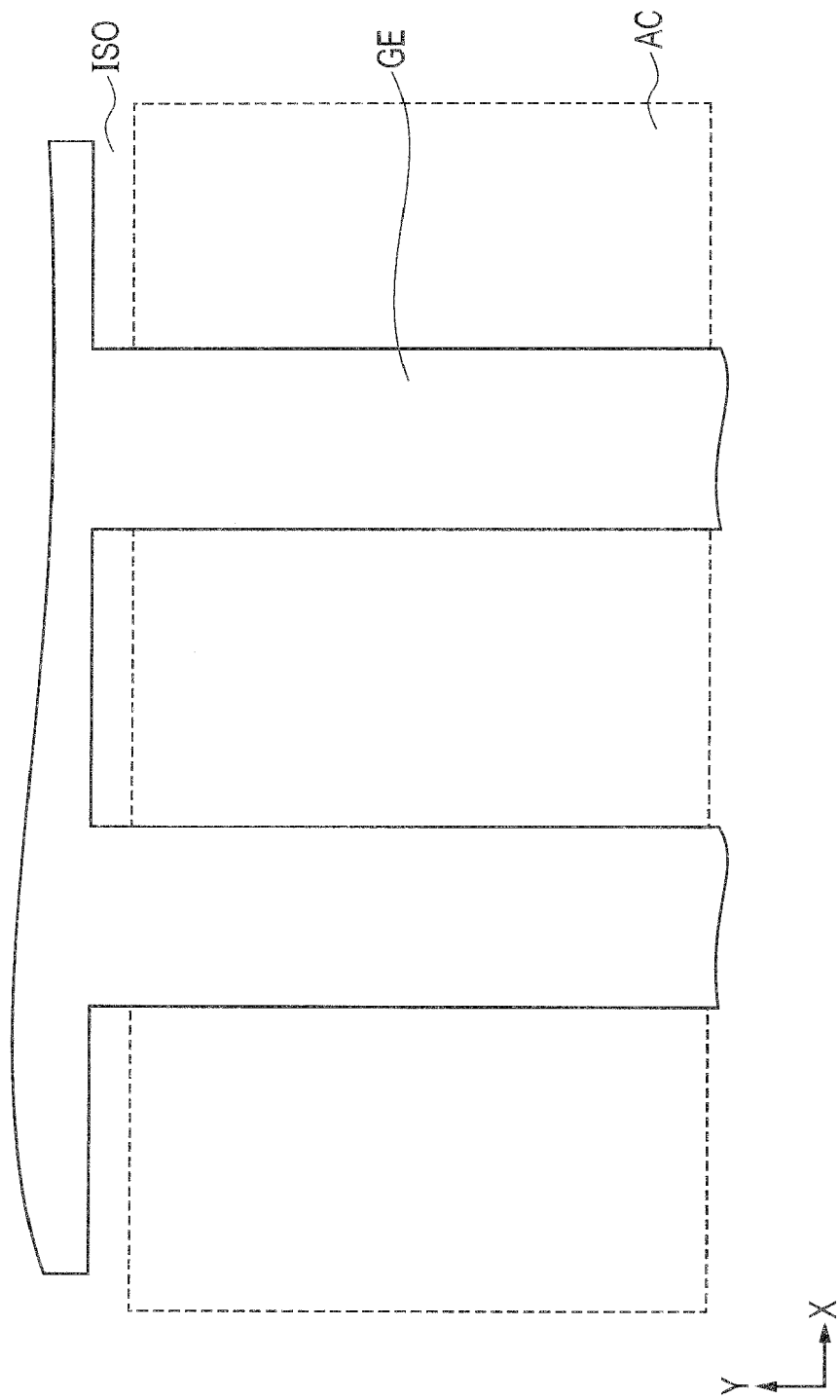
FIG. 37 is a plan view showing the semiconductor device of Second Embodiment during a manufacturing step.

Then, as shown in FIGS. 35 to 37, over the insulation film IF1 including the inside of the trench T, as the gate insulation film GI, an aluminum oxide film is deposited with a film thickness of about 50 nm using an ALD method, or the like. Further, over the gate insulation film GI, as a conductive film, for example, a TiN (titanium nitride) film is deposited with a film thickness of about 200 nm using a sputtering method, or the like.

Then, using a photolithography technology, there is formed a photoresist film PR2 having an opening in the formation region of the inactivated region IR. Using the photoresist film PR2 as a mask, the TiN film and the aluminum oxide film are etched. As a result, there is exposed the insulation film IF1 in the formation region of the inactivated region IR.

Figure 38:
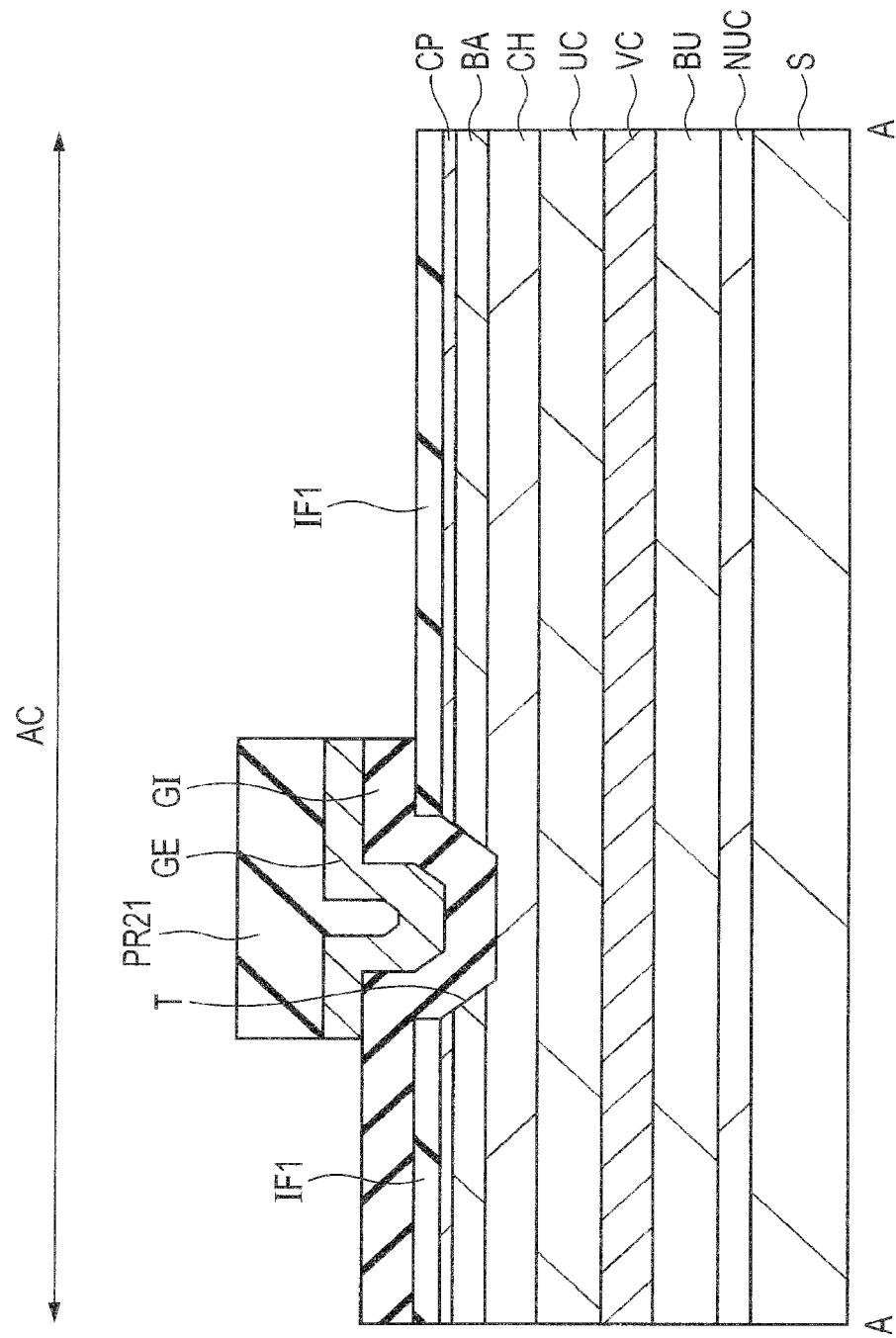
FIG. 38 is a cross sectional view showing the semiconductor device of Second Embodiment during a manufacturing step, and showing the manufacturing step following FIG. 35.
Figure 39:
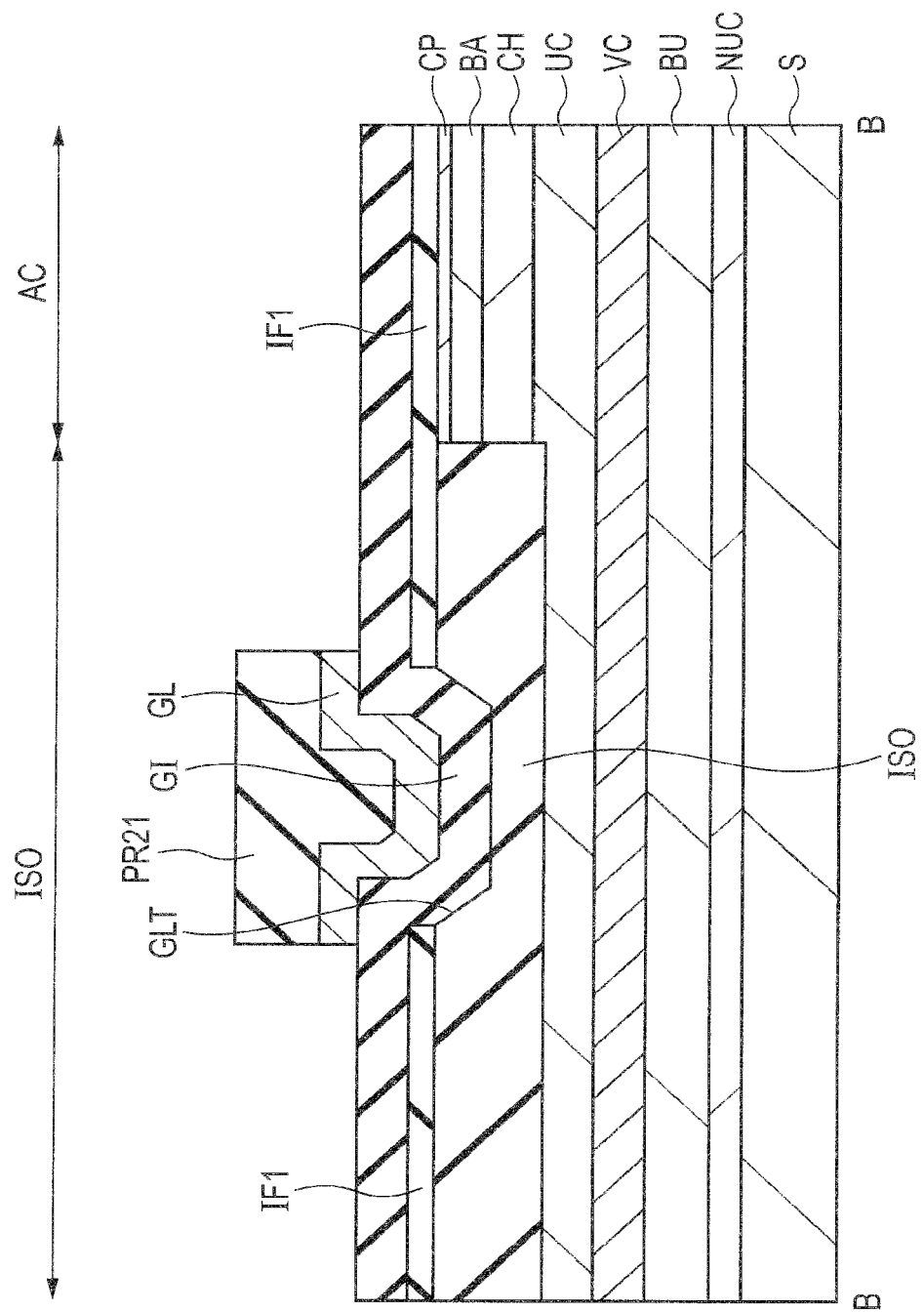
FIG. 39 is a cross sectional view showing the semiconductor device of Second Embodiment during a manufacturing step, and showing the manufacturing step following FIG. 36.
Figure 40:
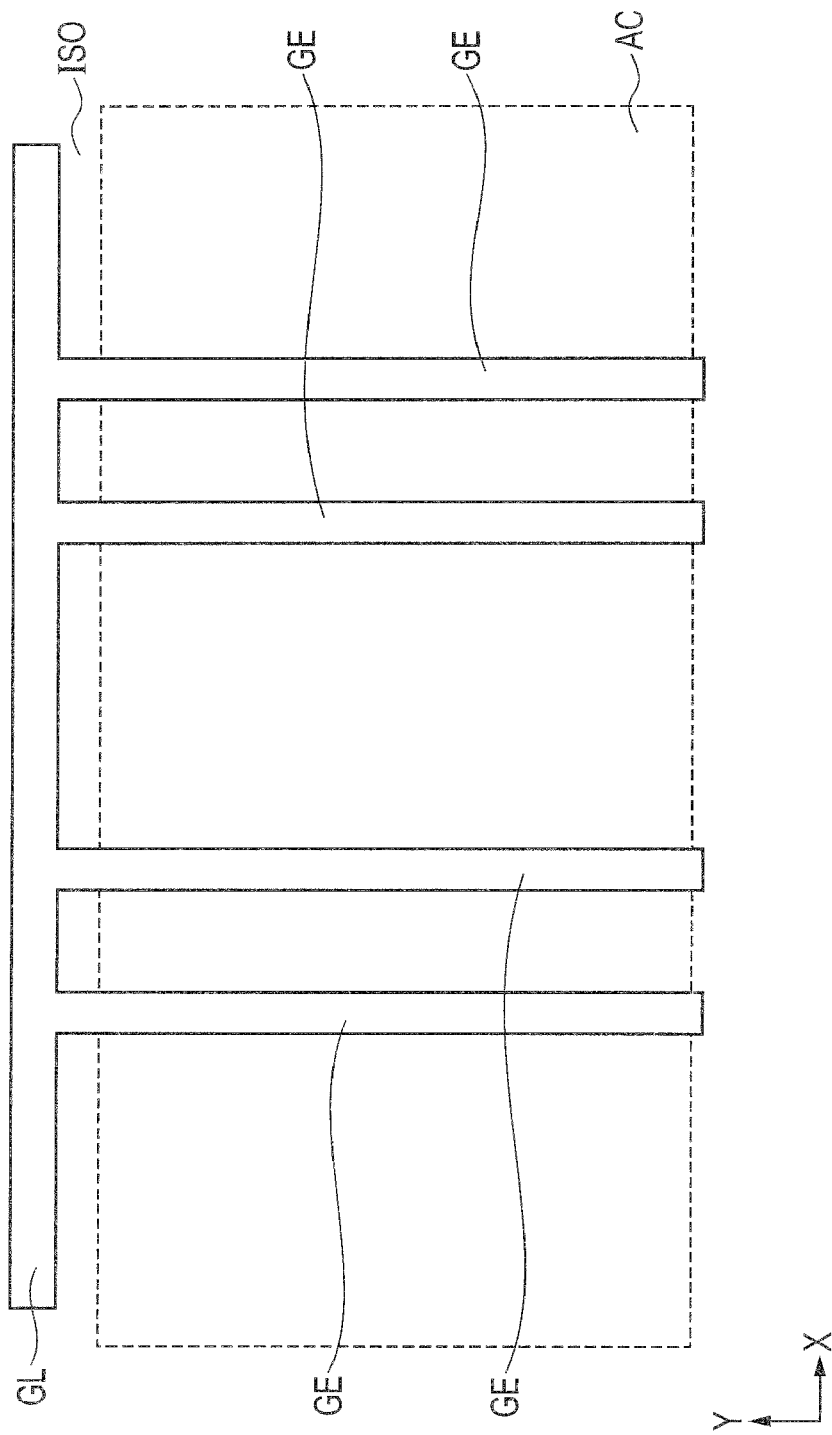
FIG. 40 is a plan view showing the semiconductor device of Second Embodiment during a manufacturing step.

Then, as shown in FIGS. 38 to 40, there is formed a gate electrode GE. The gate electrode GE has the same shape as that of First Embodiment, and has a field plate electrode part. Over a TiN film to be the gate electrode GE, there is formed a photoresist film PR21. Using a photolithography technology, the photoresist film PR21 is left only in the gate electrode formation region. Then, using the photoresist film PR21 as a mask, the TiN film to be the gate electrode GE is etched, thereby to form the gate electrode GE. Upon the etching, the gate insulation film (aluminum oxide film) GI underlying the TiN film is not etched, and is left. For processing of the TiN film, there is used a dry etching gas containing a chlorine type gas such as $Cl_2$.

Figure 41:
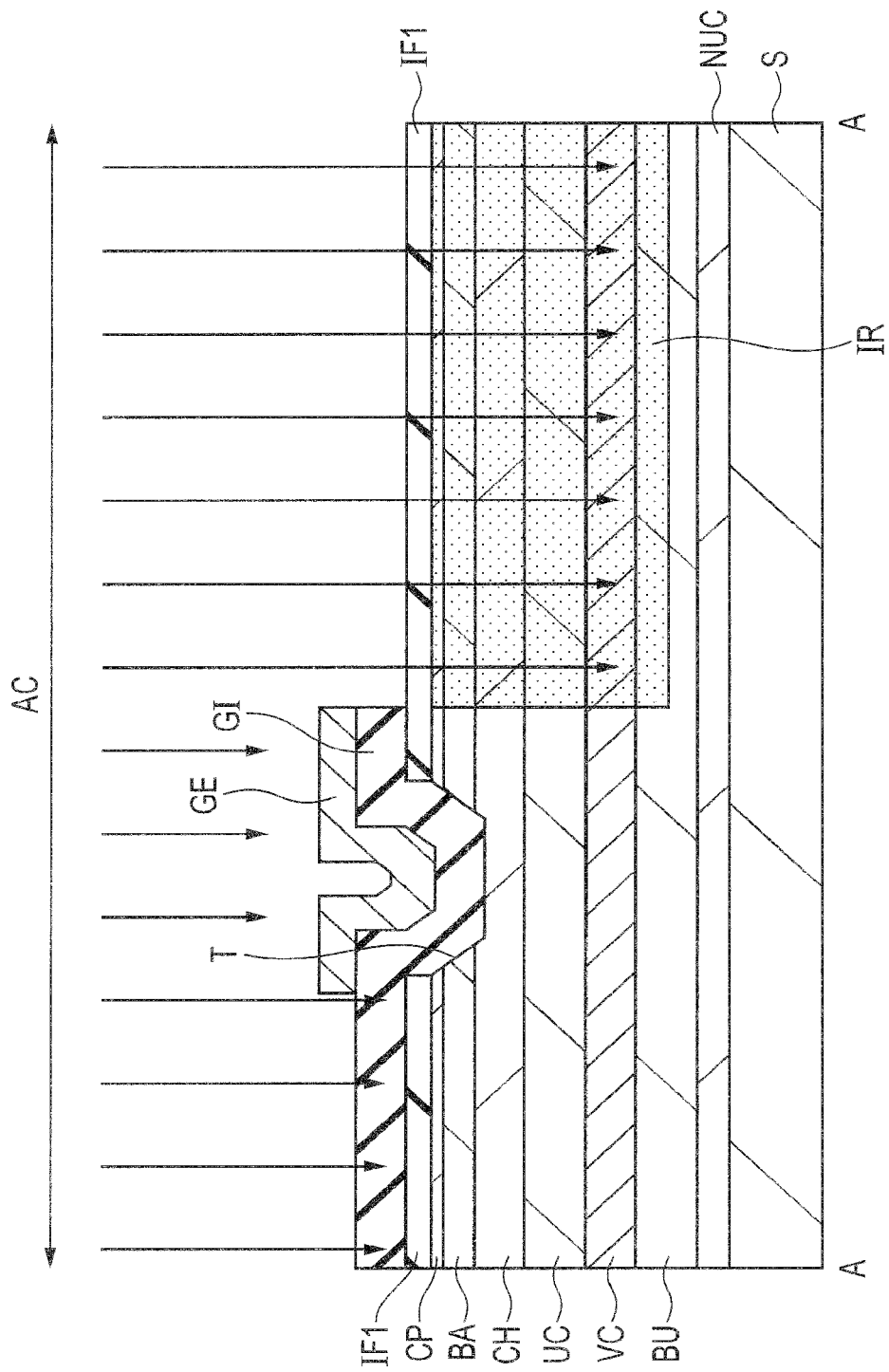
FIG. 41 is a cross sectional view showing the semiconductor device of Second Embodiment during a manufacturing step, and showing the manufacturing step following FIG. 38.
Figure 42:
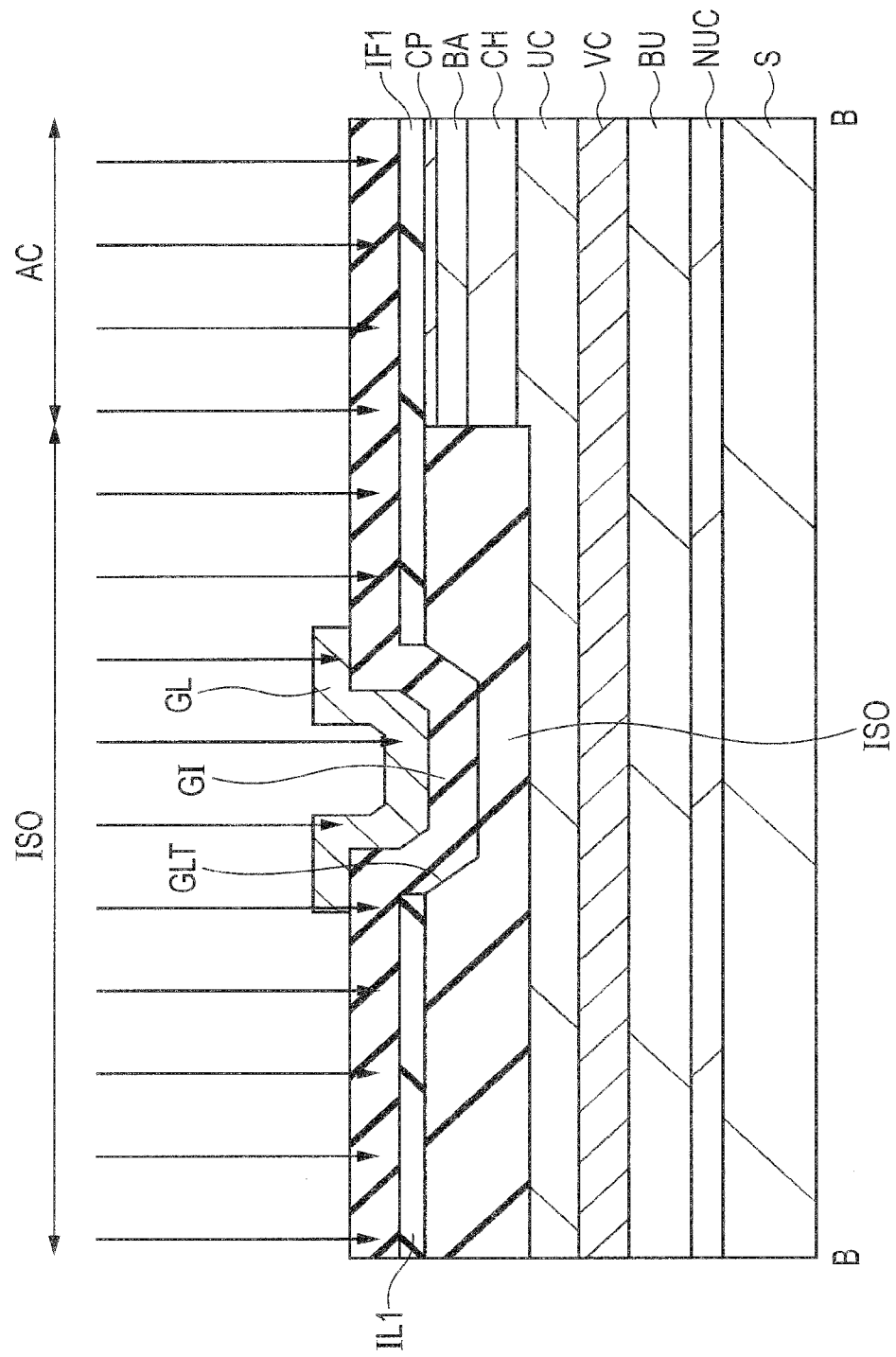
FIG. 42 is a cross sectional view showing the semiconductor device of Second Embodiment during a manufacturing step, and showing the manufacturing step following FIG. 39.
Figure 43:
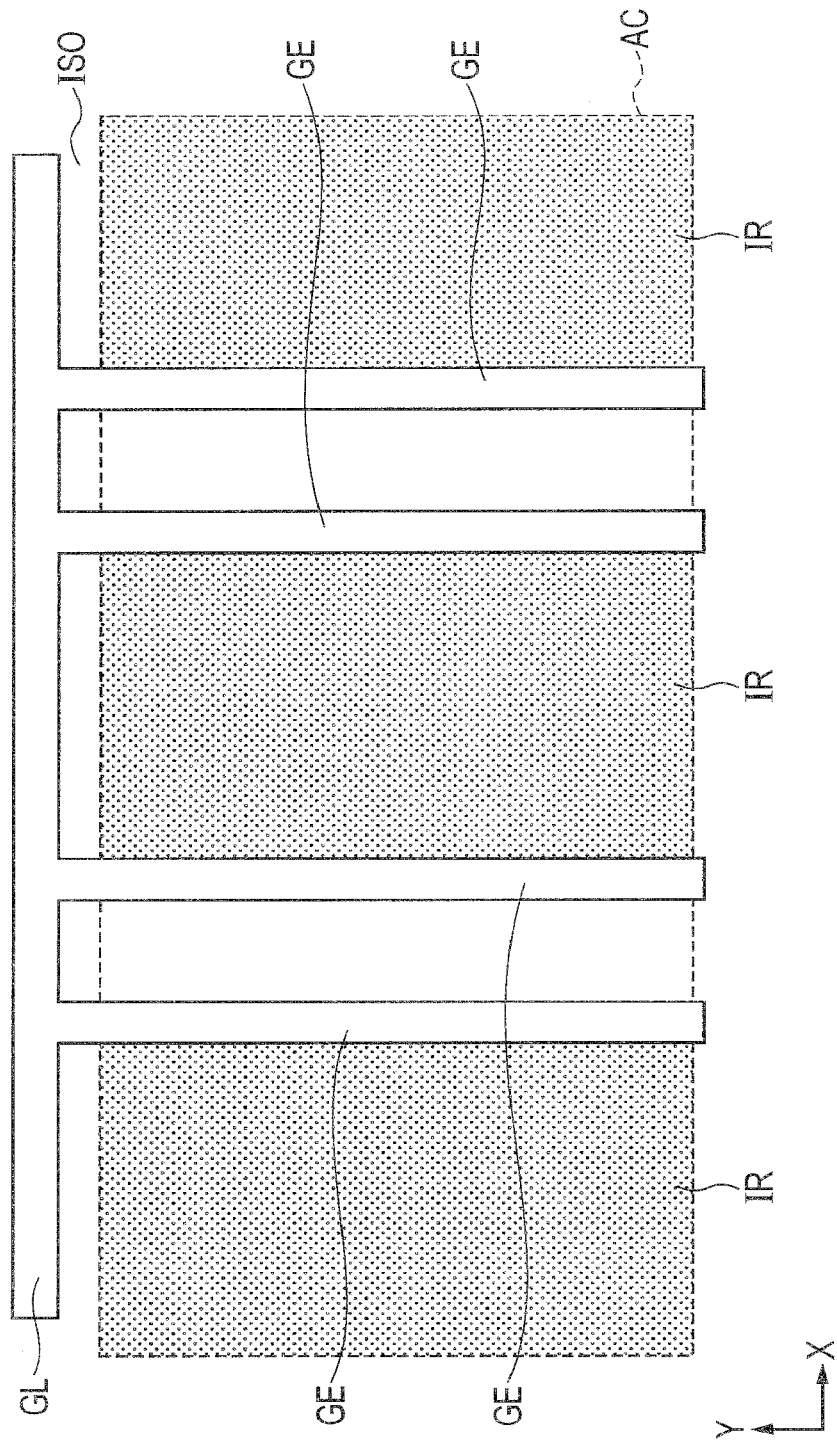
FIG. 43 is a plan view showing the semiconductor device of Second Embodiment during a manufacturing step.

Then, as shown in FIGS. 41 to 43, using the gate insulation film (aluminum oxide film) GI and the gate electrode GE as a mask, an inactivating element is implanted into the potential fixed layer VC on one side of the gate electrode GE (on the right side in FIG. 41, or the drain electrode side). As a result, there is formed an inactivated region IR. Incidentally, herein, in consideration of diffusion of the inactivating element, there is shown the state in which an inactivating element is implanted into the lamination part of the potential fixed layer VC, the channel base layer UC, the channel layer CH, and the barrier layer BA situated on one side of the gate electrode GE.

For example, using the gate insulation film (aluminum oxide film) GI and the gate electrode GE as a mask, an inactivating element is implanted. When an inactivating element is implanted using the gate insulation film (aluminum oxide film) GI and the gate electrode GE as a mask, there is performed a plasma treatment of hydrogen (H) as an inactivating element. Specifically, for example, there is a method of exposure into the atmosphere converted into a plasma by an electronic cyclotron resonance (ECR) method. An inactivating element is implanted so that the activation ratio of the p type impurity in the potential fixed layer VC in the inactivated region IR is lower than, and is preferably 1/10 or less the activation ratio of the p type impurity in the potential fixed layer VC under the source electrode SE not inactivated.

For the gate insulation film GI, a dense film is often used. Using the gate insulation film GI as a mask, an inactivating element is implanted. This can favorably achieve selective implantation of an inactivating element. Particularly, an aluminum oxide can suppress the transmission of small atoms such as hydrogen (H), and is preferably used as a mask for inhibiting the implantation of an inactivating element.

Figure 44:
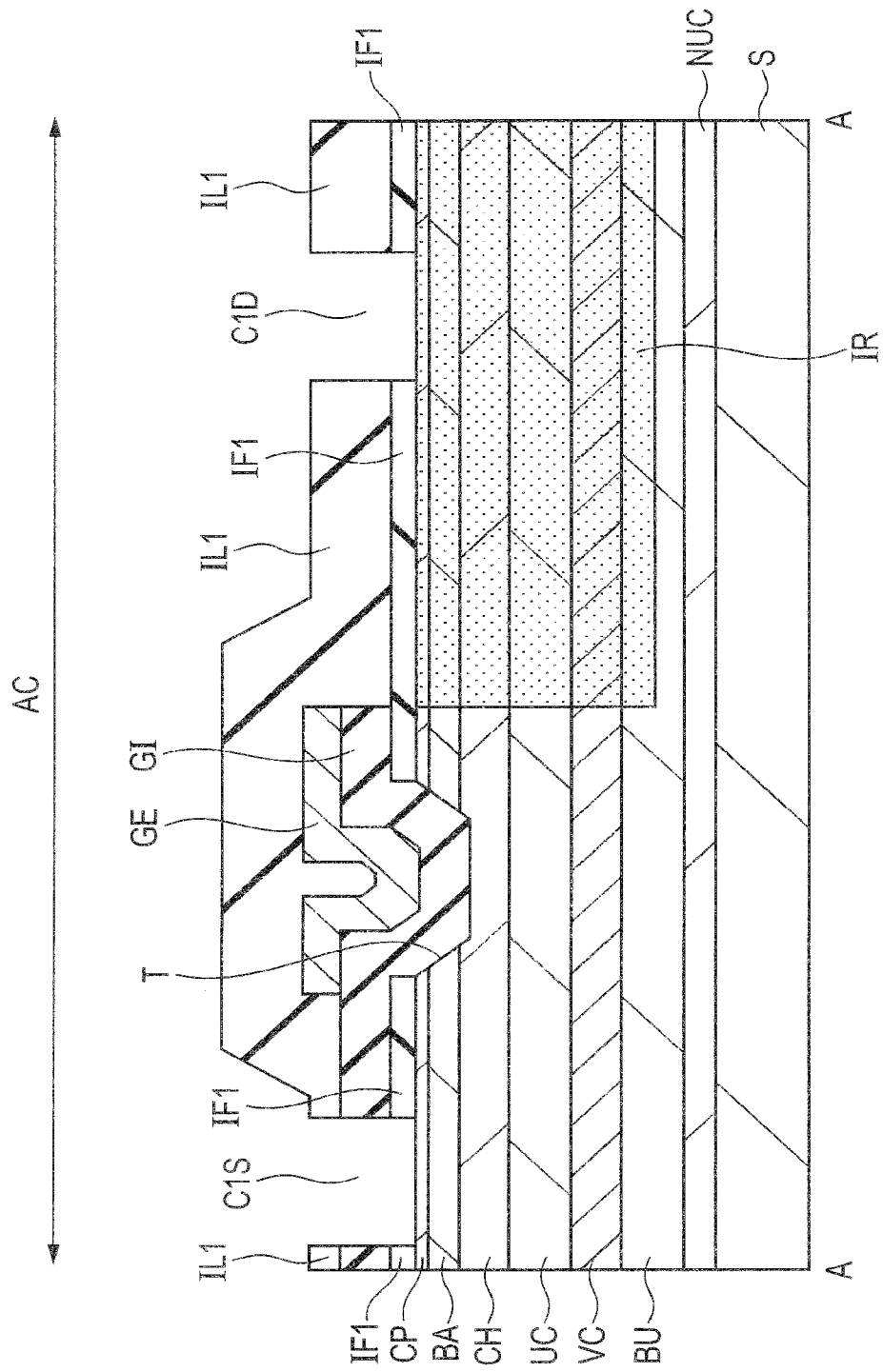
FIG. 44 is a cross sectional view showing the semiconductor device of Second Embodiment during a manufacturing step, and showing the manufacturing step following FIG. 41.
Figure 45:
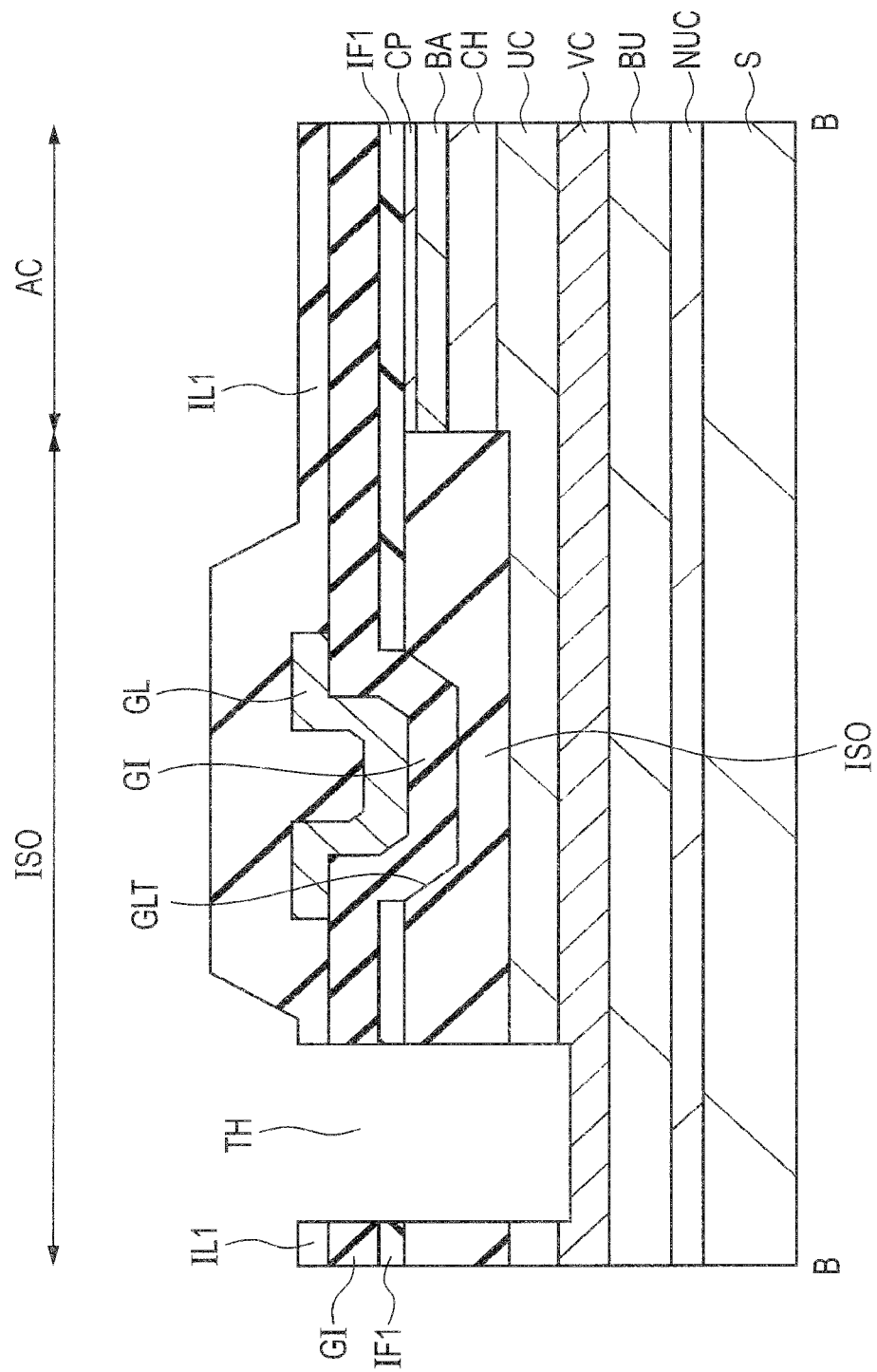
FIG. 45 is a cross sectional view showing the semiconductor device of Second Embodiment during a manufacturing step, and showing the manufacturing step following FIG. 42.
Figure 46:
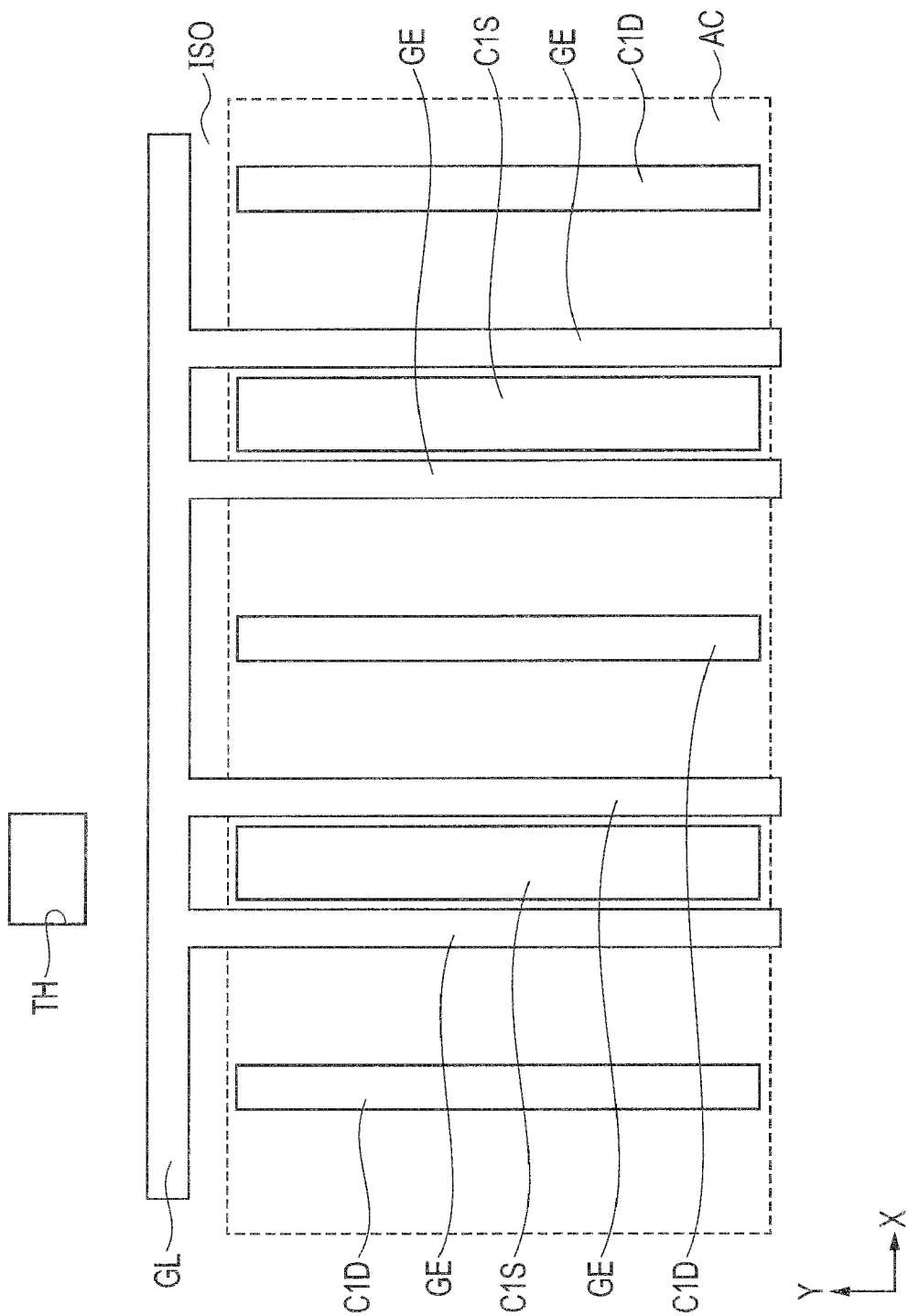
FIG. 46 is a plan view showing the semiconductor device of Second Embodiment during a manufacturing step.

Then, as shown in FIGS. 44 to 46, in the same manner as in First Embodiment, over the gate electrode GE, there is formed an interlayer insulation film IL1. Further, in the interlayer insulation film IL1, there are formed contact holes C1S and C1D, and a through hole TH. At this step, in the formation region of the contact hole C1S, and the formation region of the through hole TH, there is left the gate insulation film (aluminum oxide film) GI. Accordingly, the interlayer insulation film IL1, the gate insulation film GI, and the insulation film IF1 are etched, thereby to form the contact hole C1S (FIG. 44). The interlayer insulation film IL1, the gate insulation film GI, the insulation film IF1, the isolation region ISO, the channel base layer UC, and the potential fixed layer VC are partially etched, thereby to form the through hole TH (FIG. 45).

Figure 47:
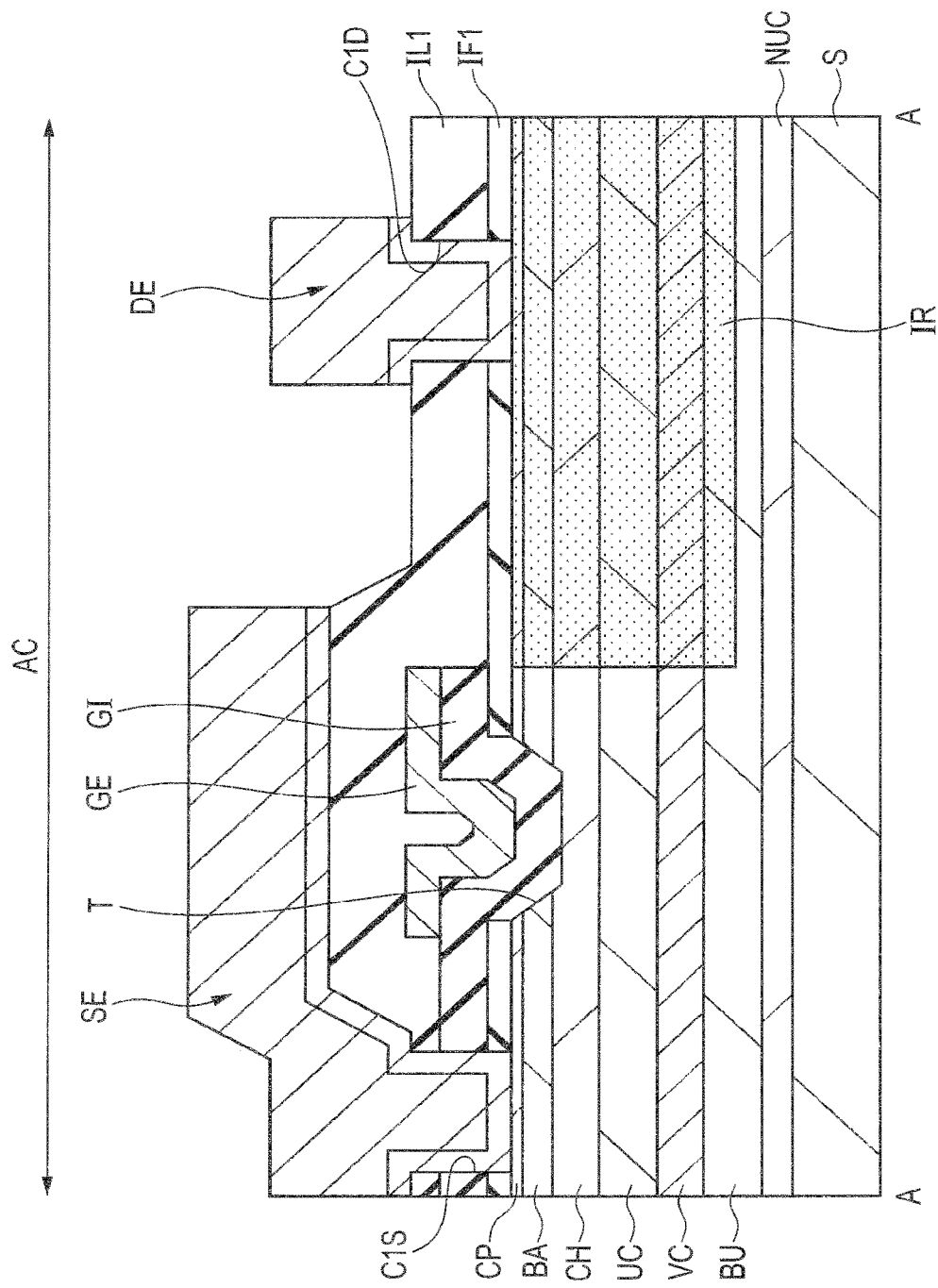
FIG. 47 is a cross sectional view showing the semiconductor device of Second Embodiment during a manufacturing step, and showing the manufacturing step following FIG. 44.
Figure 48:
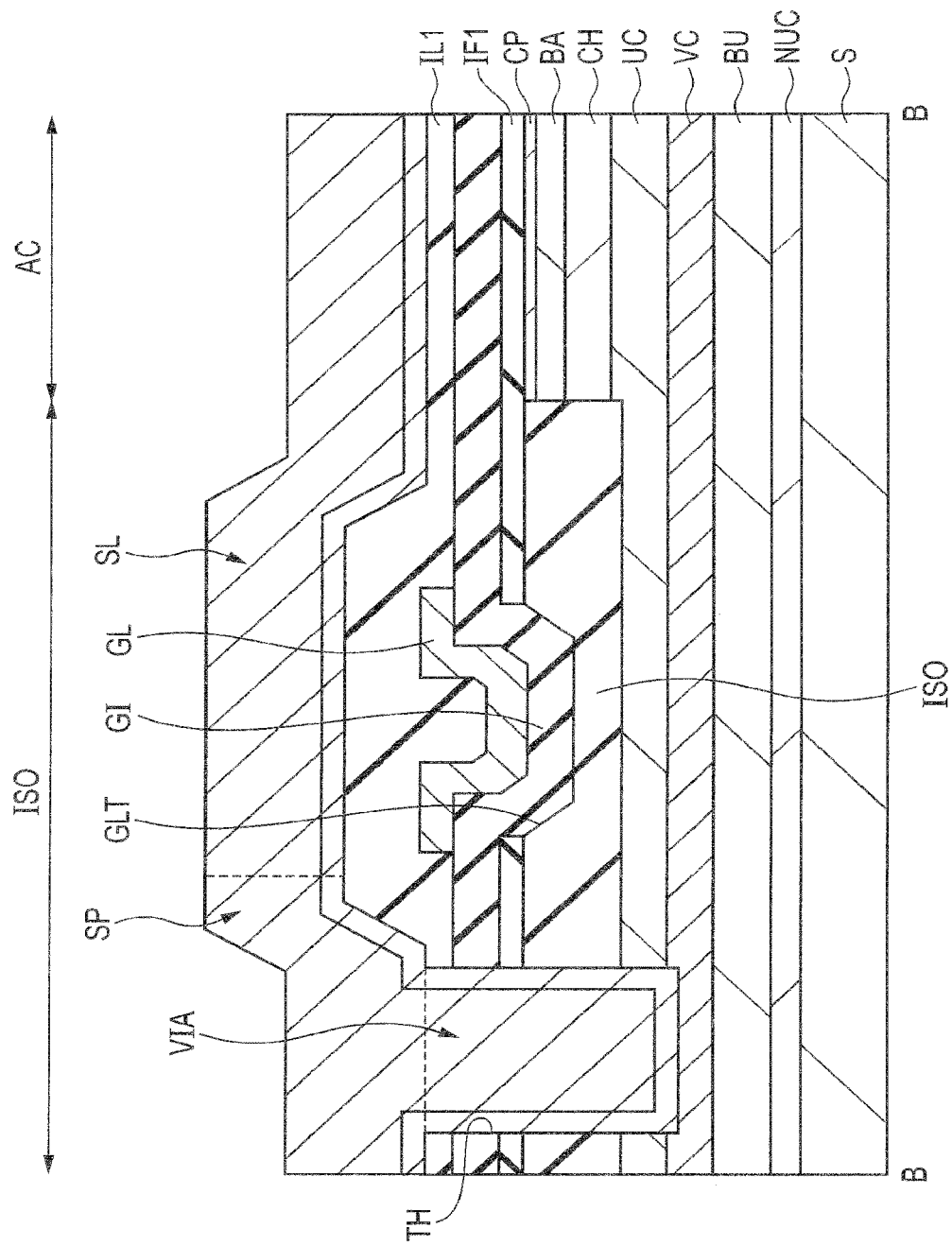
FIG. 48 is a cross sectional view showing the semiconductor device of Second Embodiment during a manufacturing step, and showing the manufacturing step following FIG. 45.
Figure 49:
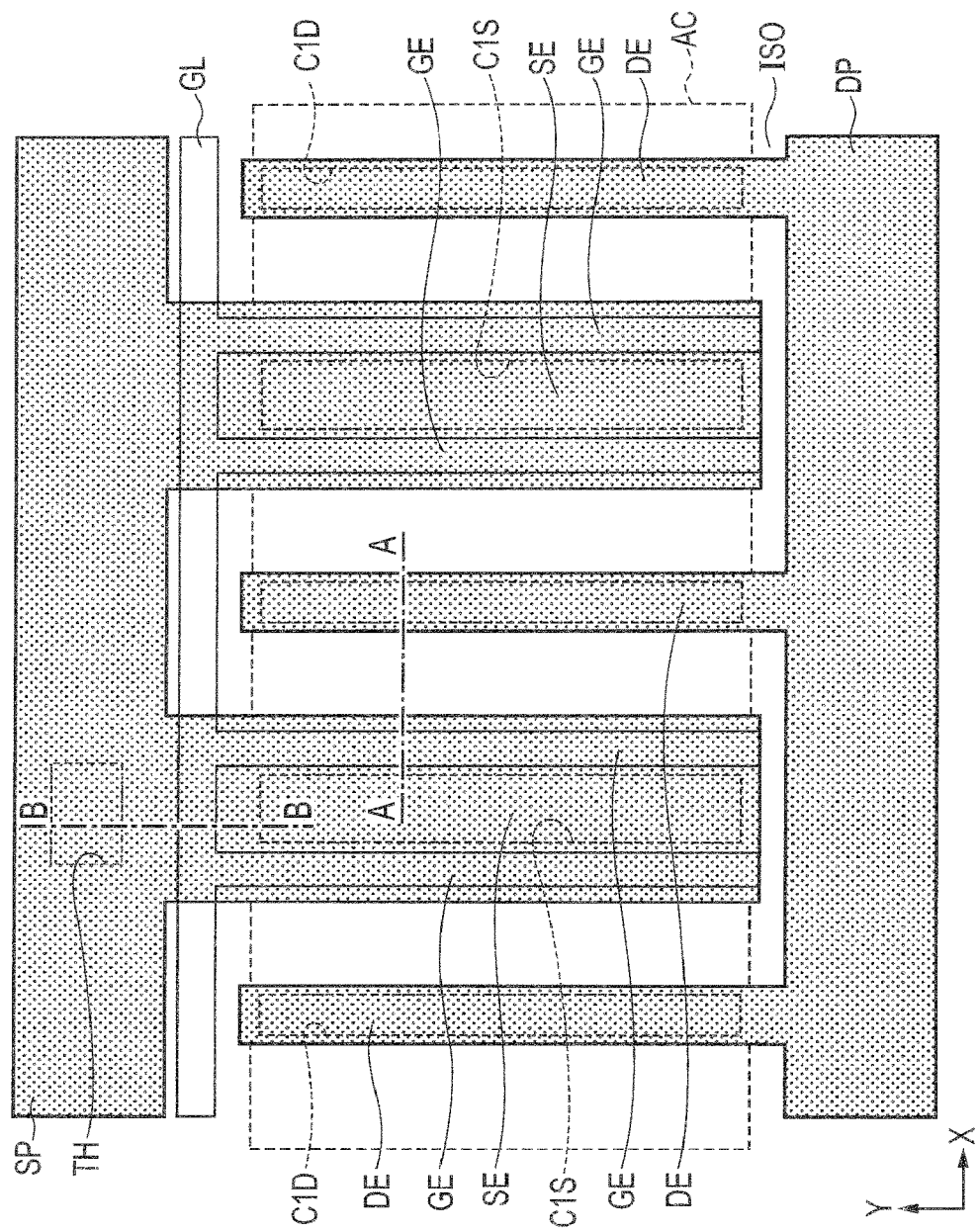
FIG. 49 is a plan view showing the semiconductor device of Second Embodiment during a manufacturing step.

Then, as shown in FIGS. 47 to 49, in the same manner as in First Embodiment, over the cap layer CP on the opposite sides of the gate electrode GE, there are formed the source electrode SE, the drain electrode DE, and the like. Further, over the source electrode SE, the drain electrode DE, and the like, there is formed a protective film PRO.

By the steps up to this point, it is possible to form the semiconductor device of the present embodiment. Incidentally, the steps described above are examples. The semiconductor device of the present embodiment may be manufactured by other steps than the steps described above.

Thus, also in the present embodiment, as with First Embodiment, the potential fixed layer VC is provided, and is coupled with the source electrode SE. Accordingly, it is possible to reduce the characteristic fluctuation of the semiconductor device. Further, also in the present embodiment, as with First Embodiment, the coupling part VIA in the through hole TH is arranged in the isolation region ISO. As a result, it is possible to implement miniaturization and high integration of semiconductor devices. Further, it is possible to ensure a large active region AC in which electrons can be conducted. For this reason, it is possible to reduce the ON resistance per unit area.

Further, in the present embodiment, an inactivated region IR is provided between the gate electrode GE and the drain electrode DE. Thus, the potential fixed layer VC situated between the gate electrode GE and the drain electrode DE is inactivated, resulting in the inactivated region IR. This can improve the drain breakdown voltage. Further, in the present embodiment, using the gate insulation film GI as a mask, the inactivating element was implanted. This can favorably achieve selective implantation of an inactivating element.

Incidentally, the plasma treatment of an inactivating element is a treatment of exposing a substrate in an atmosphere plasma-discharged in a gas containing an inactivating element. For example, a treatment substrate is exposed into an atmosphere plasma-discharged in a gas containing a hydrogen element. In this case, hydrogen radicals are generated, and introduced into a region in which a mask is not formed. The case using such a radical has an advantage of the crystal being less likely to be damaged by ion implantation. Further, a high-density inactivating element can be introduced into the crystal while the crystal being less damaged. For this reason, the activation ratio of the p type element in the potential fixed layer VC in the inactivated region IR can be set sufficiently lower than the activation ratio of the p type impurity in the potential fixed layer VC under the source electrode SE not inactivated.

Alternatively, as the plasma treatment of an inactivating element, there may be used a deposition treatment. For example, in the deposition step of a silicon nitride film, silane ($SiH_4$) or ammonia ($NH_3$) is used as a raw material gas. In accordance with plasma CVD using a compound gas of such an inactivating element, the compound gas of an inactivating element such as silane or ammonia is decomposed, resulting in radicals of an inactive element such as hydrogen radicals. An inactivating element can also be introduced by such a treatment.

Particularly, with the gate insulation film GI left as a mask described above, a silicon nitride film is deposited by a PECVD (plasma-enhanced chemical vapor deposition) method using silane ($SiH_4$) or ammonia ($NH_3$) as a raw material gas. As a result, it is possible to perform the introduction of a hydrogen element and the deposition with a silicon nitride film at the same time. The silicon nitride film can be used as, for example, the lower film of the interlayer insulation film IL'. Namely, over a silicon nitride film, there is formed a silicon oxide film. The lamination film thereof forms the interlayer insulation film IL1. In accordance with the interlayer insulation film IL1 with such a configuration, at the time of formation of the contact holes C1S and C1D described later, a silicon nitride film serves as an etching stopper. As a result, it is possible to form the contact holes C1S and C1D with precision.

Third Embodiment

In First and Second Embodiments, the recess gate type semiconductor devices were shown as examples. However, semiconductor devices with other configurations are also acceptable. For example, as in the present embodiment, there may be used a junction type semiconductor device in which a gate junction layer is arranged under a gate electrode.

Below, with reference to the accompanying drawings, a semiconductor device of the present embodiment will be described in details.

[Structure Description]

Figure 50:
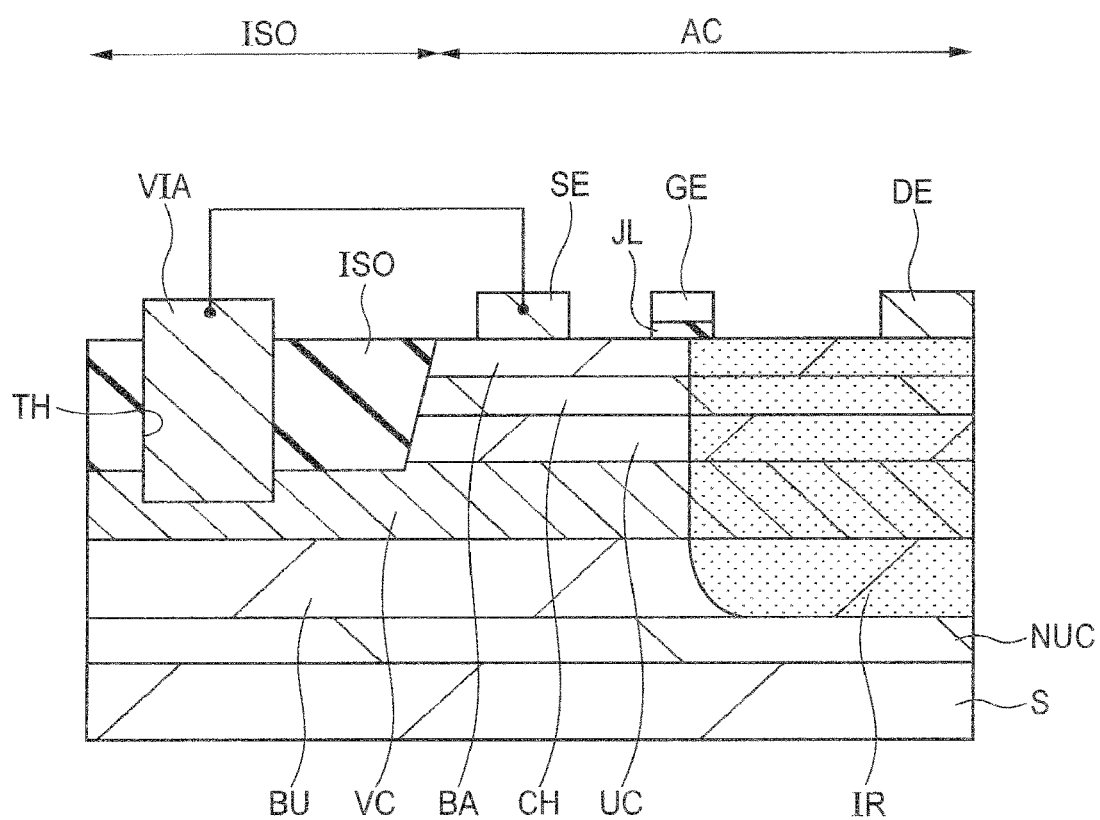
FIG. 50 is a cross sectional view schematically showing a configuration of a semiconductor device of Third Embodiment.

FIG. 50 is a cross sectional view schematically showing a configuration of the semiconductor device of the present embodiment. The semiconductor device (semiconductor element) of the present embodiment is a transistor using a nitride semiconductor. The semiconductor device can be used as a high electron mobility transistor (HEMT) type power transistor.

In the semiconductor device of the present embodiment, as with First Embodiment, over a substrate S, there are sequentially formed a nucleation layer NUC, a buffer layer BU, a potential fixed layer VC, a channel base layer UC, a channel layer (also referred to as an electron transit layer) CH, and a barrier layer BA. The nucleation layer NUC is formed of a nitride semiconductor layer. The buffer layer BU is formed of a single layered or multilayered nitride semiconductor layer doped with an impurity for forming a deep level in a nitride semiconductor. Herein, there is used a superlattice structure formed of a multilayer nitride semiconductor layer. The potential fixed layer VC is formed of a nitride semiconductor layer doped with an impurity to produce a p type with respect to a nitride semiconductor, and has a conductivity. The channel base layer UC is formed of a nitride semiconductor layer smaller in electron affinity than the channel layer CH, and smaller in average lattice constant in the substrate surface direction than the channel layer CH. The channel layer CH is formed of a nitride semiconductor layer larger in electron affinity than the channel base layer UC. The barrier layer BA is formed of a nitride semiconductor layer smaller in electron affinity than the channel layer CH, and smaller in electron affinity than the channel base layer UC.

The semiconductor device of the present embodiment has a gate electrode GE formed over the barrier layer BA via a gate junction layer JL, and a source electrode SE and a drain electrode DE formed over the barrier layer BA on the opposite sides of the gate electrode GE. The semiconductor device is formed in an active region AC defined by the isolation regions ISO. The gate junction layer JL is doped with a p type impurity. Further, the gate junction layer JL and the gate electrode GE are preferably in ohmic contact for positive holes.

On the channel layer CH side in the vicinity of the interface between the channel layer CH and the barrier layer BA, there is formed a two-dimensional electron gas (2DEG). Whereas, under the gate junction layer JL, negative charges resulting from acceptor ionization raise the conduction band of the channel layer CH. Accordingly, a two-dimensional electron gas (2DEG) is not formed. For this reason, in the semiconductor device of the present embodiment, with the gate electrode GE not applied with a positive potential (threshold potential), the OFF state can be kept; and with the gate electrode GE applied with a positive potential (threshold potential), the ON state can be kept. Thus, the normally off operation can be performed.

Herein, in the present embodiment, in the isolation region ISO, there is provided a coupling part (also referred to as a via) VIA penetrating through the isolation region ISO, and reaching the underlying potential fixed layer VC. The coupling part VIA is electrically coupled with the source electrode SE. Thus, the potential fixed layer VC is provided, and coupled with the source electrode SE. As a result, it is possible to reduce the fluctuations in characteristics such as the threshold potential and the ON resistance.

Further, in the present embodiment, an inactivated region IR is provided between the gate electrode GE and the drain electrode DE. The inactivated region IR reaches the potential fixed layer VC in the depth direction. Thus, the potential fixed layer VC doped with an impurity to produce a p type situated between the gate electrode GE and the drain electrode DE is inactivated by doping of an inactivating element, resulting in the inactivated region IR. As a result, it is possible to improve the drain breakdown voltage.

Figure 53:
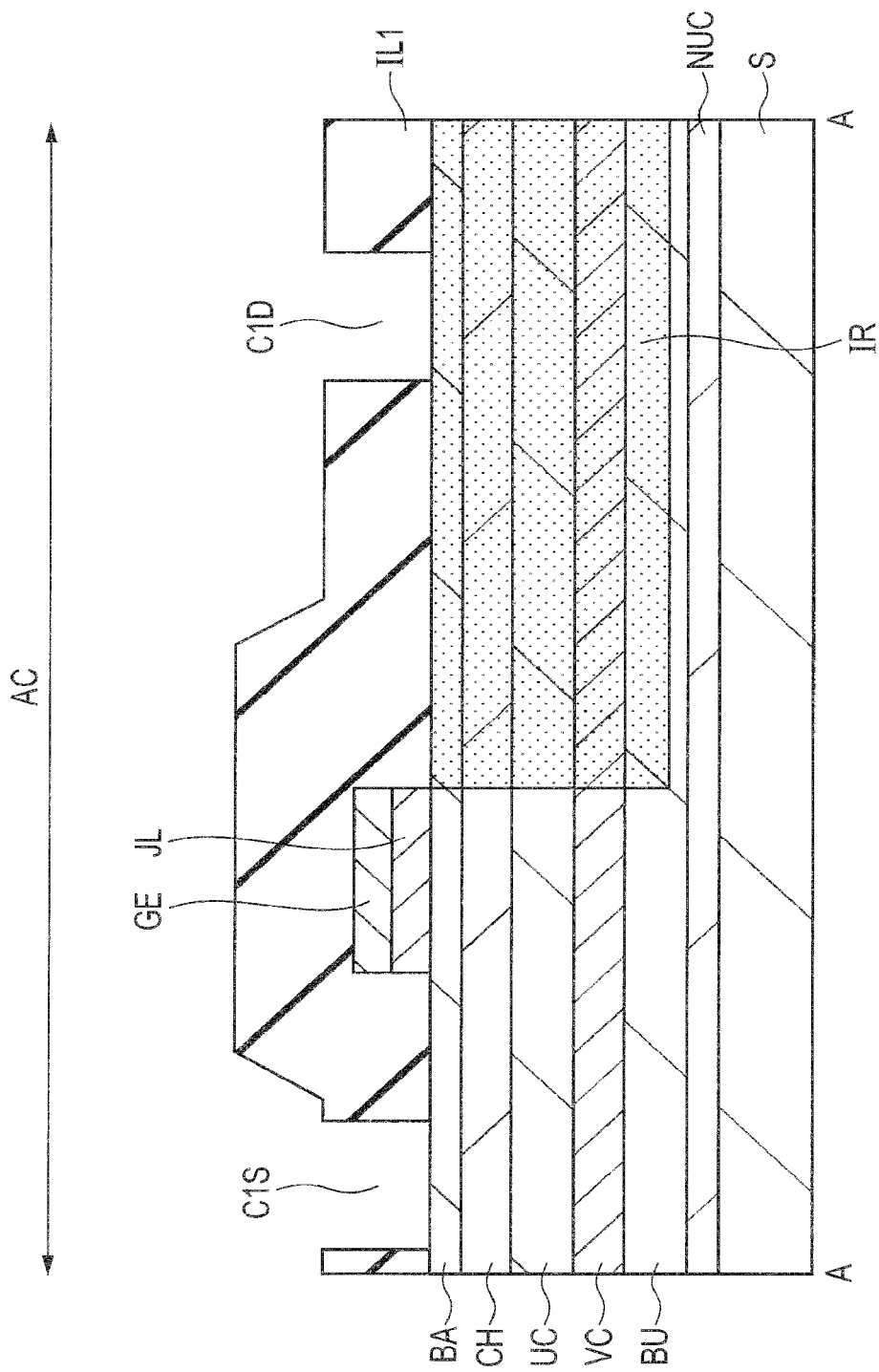
FIG. 53 is a cross sectional view showing the semiconductor device of Third Embodiment during a manufacturing step, and showing the manufacturing step following FIG. 52.
Figure 54:
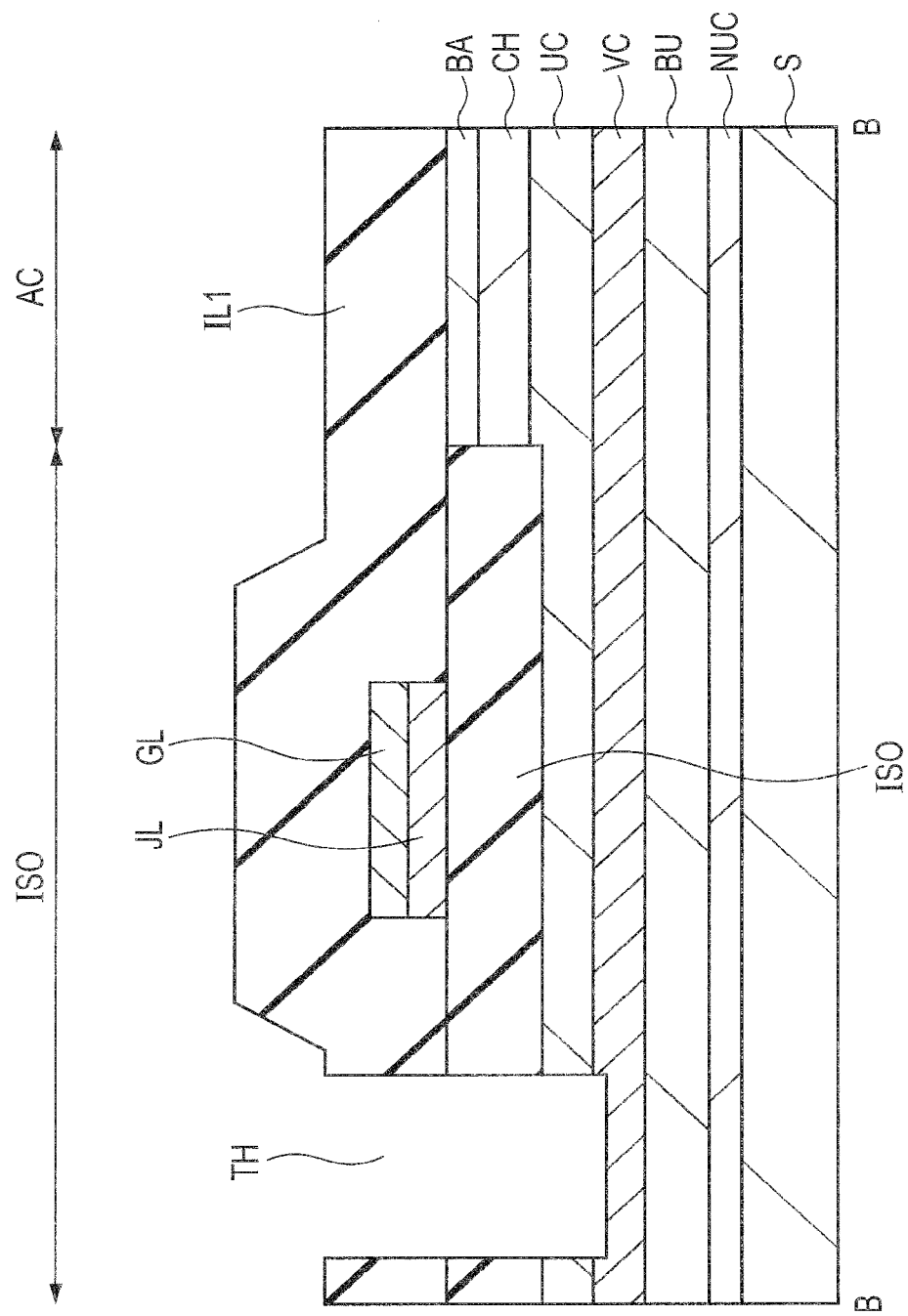
FIG. 54 is a cross sectional view showing the semiconductor device of Third Embodiment during a manufacturing step.
Figure 55:
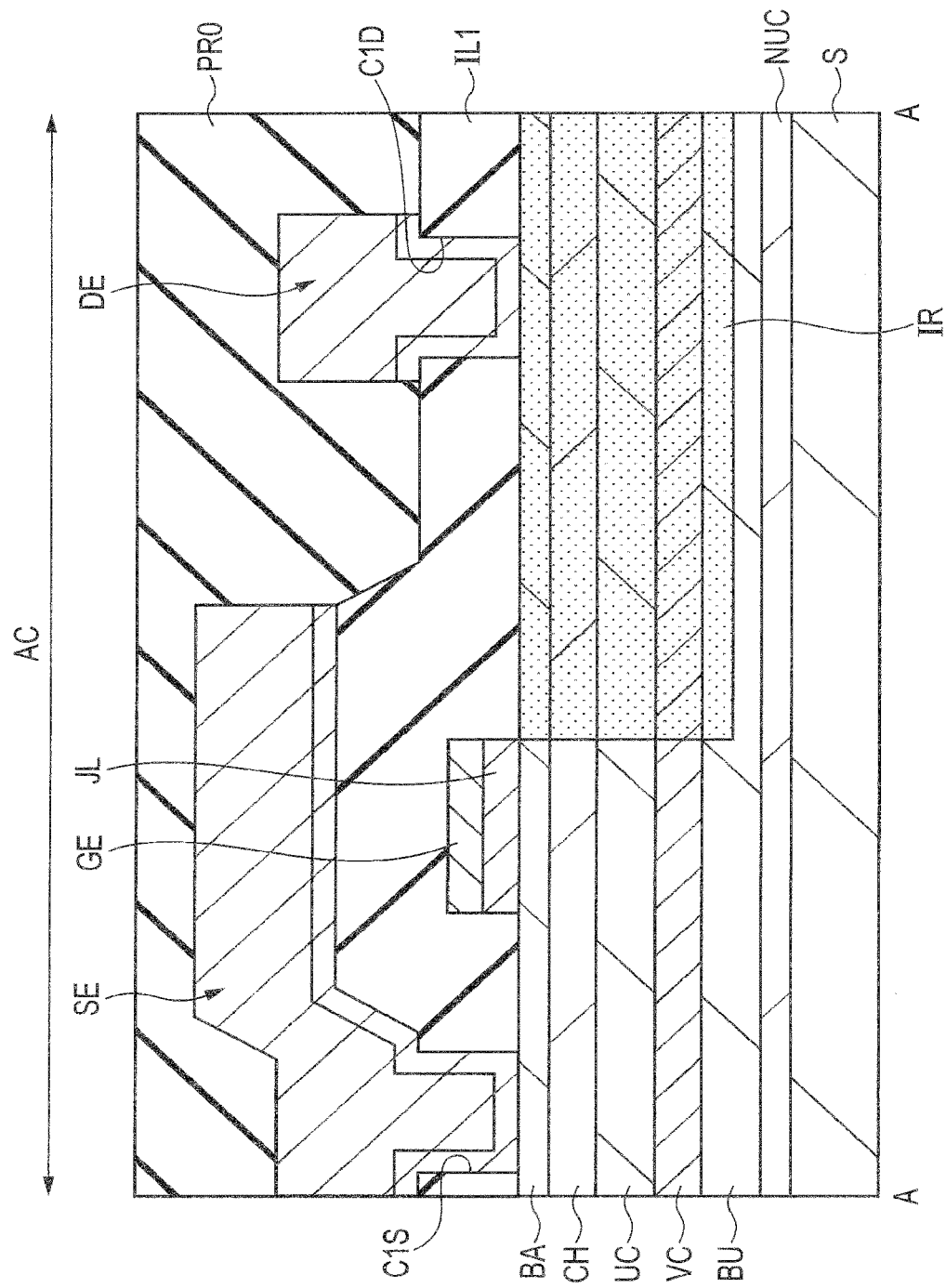
FIG. 55 is a cross sectional view showing the semiconductor device of Third Embodiment during a manufacturing step, and showing the manufacturing step following FIG. 53.
Figure 56:
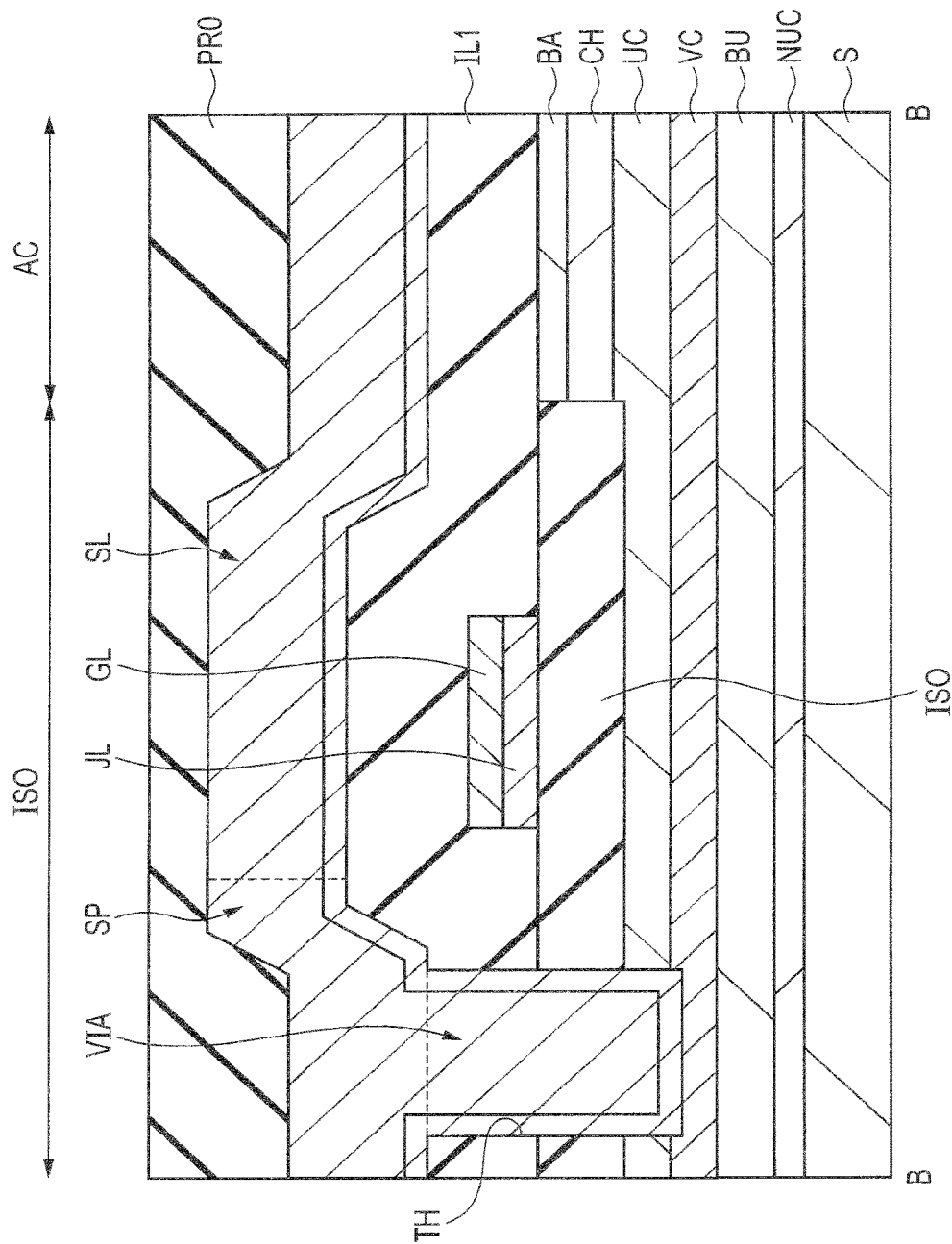
FIG. 56 is a cross sectional view showing the semiconductor device of Third Embodiment during a manufacturing step, and showing the manufacturing step following FIG. 54.

FIGS. 51 to 56 are each a cross sectional view showing the semiconductor device of the present embodiment during a manufacturing step. With reference to FIGS. 55 and 56 which are each a cross sectional view showing the final step of FIGS. 51 to 56, a description will be further given to the semiconductor device of Third Embodiment. Incidentally, the plan view of the semiconductor device of the present embodiment is the same as that of First Embodiment (FIG. 2), except for the trench (T or GLT). For example, FIG. 55 corresponds to the A-A cross section of FIG. 2, and FIG. 56 corresponds to a B-B cross section of FIG. 2. Incidentally, the configuration of the present embodiment is the same as that of First Embodiment, except for the gate electrode part. For this reason, a detailed description on the same configuration as that of First Embodiment will be omitted.

As shown in FIGS. 55 and 56, in the semiconductor device of the present embodiment, over a substrate S, there are sequentially formed a nucleation layer NUC, a buffer layer BU, a potential fixed layer VC, a channel base layer UC, a channel layer (also referred to as an electron transit layer) CH, and a barrier layer BA. Then, the semiconductor device of the present embodiment has a gate electrode GE formed over the barrier layer BA via a gate junction layer JL, and a source electrode SE and a drain electrode DE formed over the barrier layer BA on the opposite sides of the gate electrode GE, respectively. The semiconductor device is formed in an active region AC defined by the isolation regions ISO. Under the drain electrode DE, there is arranged a contact hole C1D serving as a coupling part between the drain electrode DE and the barrier layer BA. Under the source electrode SE, there is arranged a contact hole C1S serving as a coupling part between the source electrode SE and the barrier layer BA. Further, the drain electrode DE is coupled with the drain pad DP, and the source electrode SE is coupled with the source pad SP. Whereas, the gate electrode GE is coupled with the gate line GL (see FIG. 2).

Herein, the source electrode SE, the drain electrode DE, and the gate electrode GE are mainly arranged over the active region AC surrounded by the isolation regions ISO. On the other hand, the drain pad DP, the gate line GL, and the source pad SP are arranged over the isolation region ISO (see FIG. 2).

Then, under the source pad SP, there is arranged a through hole TH. The through hole TH includes a conductive film embedded therein, and forms the coupling part VIA. As described later, the coupling part VIA is electrically coupled with the potential fixed layer VC. Accordingly, the source electrode SE and the potential fixed layer VC are electrically coupled with each other via the source pad SP and the coupling part VIA. Further, over the source electrode SE and the drain electrode DE, there is arranged a protective film (also referred to as an insulation film, a covering film, or a surface protective film) PRO.

Further, in the present embodiment, an inactivated region IR is provided between the gate electrode GE and the drain electrode DE. The inactivated region IR reaches the potential fixed layer VC in the depth direction. Thus, the potential fixed layer VC doped with an impurity to produce a p type situated between the gate electrode GE and the drain electrode DE is inactivated by doping of an inactivating element, resulting in the inactivated region IR. As a result, it is possible to improve the drain breakdown voltage.

The p type potential fixed layer VC situated between the gate electrode GE and the drain electrode DE contains an inactivating element. Then, the content of the inactivating element in the p type potential fixed layer VC situated between the gate electrode GE and the drain electrode DE is larger than the content of the inactivating element in the p type potential fixed layer VC situated under the source electrode SE. The inactivating element is, for example, hydrogen (H) or fluorine (F). The activation ratio of the inactivated region IR is smaller than, and is preferably set at $\frac{1}{10}$ or less the activation ratio of the region under the source electrode SE.

Respective constituent materials for the substrate S, the nucleation layer NUC, the buffer layer BU, the potential fixed layer VC, the channel base layer UC, the channel layer (also referred to as the electron transit layer) CH, and the barrier layer BA are as described in First Embodiment.

As the gate junction layer JL, there can be used, for example, a GaN layer. Further, the thickness of the GaN layer can be set at a desirable thickness according to the objective characteristics, and is, for example, about 50 nm. As the materials for the gate junction layer JL, other than GaN, there can be used AlN, InN, or the like. Incidentally, the gate junction layer JL is preferably doped with a p type impurity. Examples of the p type impurity may include Be, C, and Mg.

Whereas, respective constituent materials for the gate electrode GE, the interlayer insulation film IL1, and the protective film PRO are as described in First Embodiment.

Further, respective constituent materials for the source electrode SE, the drain electrode DE, the source pad SP, the drain pad DP, and the coupling part VIA are as described in First Embodiment.

[Manufacturing Method Description]

Then, with reference to FIGS. 51 to 56, a description will be given to a method for manufacturing the semiconductor device of the present embodiment. In addition, the configuration of the semiconductor device will be made clearer.

Figure 51:
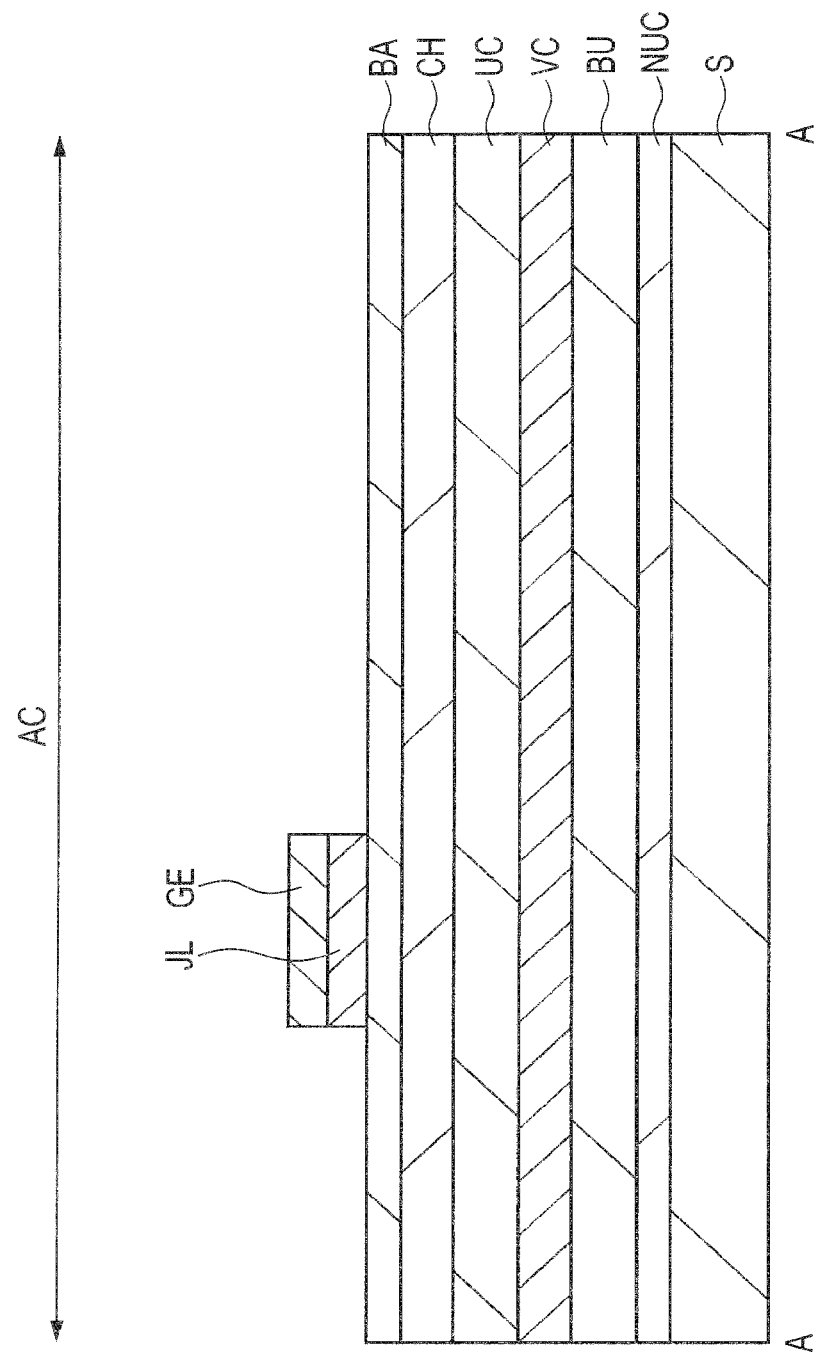
FIG. 51 is a cross sectional view showing the semiconductor device of Third Embodiment during a manufacturing step.

As shown in FIG. 51, over a substrate S, there are sequentially formed a nucleation layer NUC and a buffer layer BU. For these, the materials described in First Embodiment are used. Thus, the formation can be achieved in the same manner as in First Embodiment.

Then, over the buffer layer BU, as a potential fixed layer VC, for example, a gallium nitride layer (p-GaN layer) containing a p type impurity is epitaxially grown using the metal organic chemical vapor deposition method, or the like. For example, as a p type impurity, there is used magnesium (Mg). For example, while doping magnesium (Mg), a gallium nitride layer is deposited about 200 nm in thickness. The Mg concentration in the deposited film is set at, for example, about $5 \times 10^{18}$ (5E18) $cm^{-3}$.

Then, over the potential fixed layer VC, there are sequentially formed a channel base layer UC, a channel layer CH, and a barrier layer BA. For these, the materials described in First Embodiment are used. Thus, the formation can be achieved in the same manner as in First Embodiment. Then, in the same manner as in First Embodiment, there is formed an isolation region ISO.

Then, over the barrier layer BA, as a gate junction layer JL, for example, a gallium nitride layer (p-GaN layer) containing a p type impurity is epitaxially grown using the metal organic chemical vapor deposition method, or the like. For example, as a p type impurity, there is used magnesium (Mg). For example, while doping magnesium (Mg), a gallium nitride layer is deposited about 50 nm in thickness.

Then, over the gate junction layer JL, there is formed a photoresist film having an opening in the gate electrode formation region. Using the photoresist film as a mask, the gate junction layer JL is dry etched.

Figure 52:
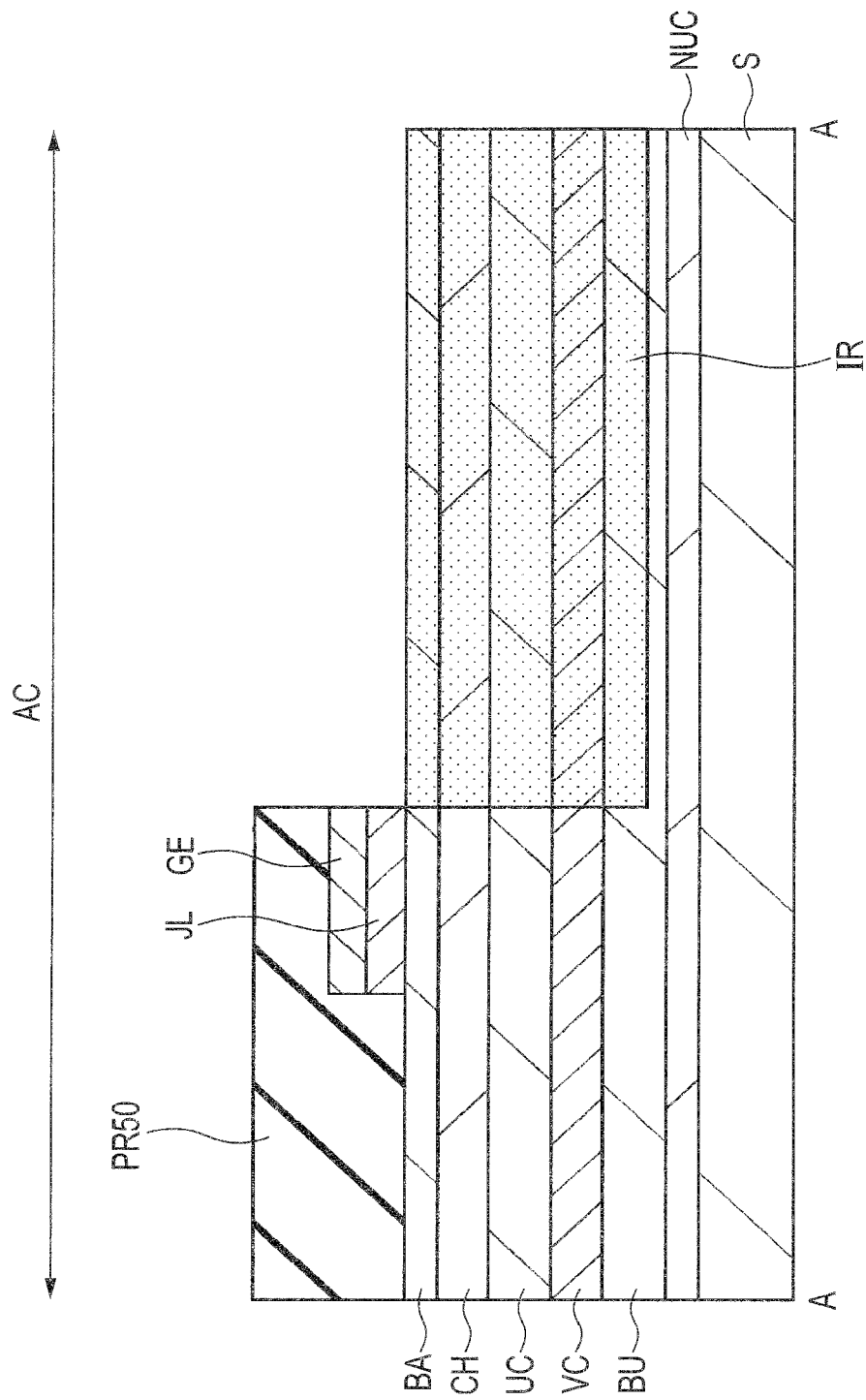
FIG. 52 is a cross sectional view showing the semiconductor device of Third Embodiment during a manufacturing step, and showing the manufacturing step following FIG. 51.

Then, as shown in FIG. 52, an inactivating element is ion implanted, thereby to form an inactivated region IR. For example, using a photolithography technology, there is formed a photoresist film PR50 having an opening in the formation region of the inactivated region IR. Using the photoresist film PR50 as a mask, an inactivating element is implanted into the potential fixed layer VC on one side of the gate electrode GE (on the right side in FIG. 52, or the drain electrode side). As a result, there is formed the inactivated region IR. Incidentally, herein, in consideration of diffusion of the inactivating element, there is shown the state in which an inactivating element is implanted into the lamination part of the potential fixed layer VC, the channel base layer UC, the channel layer CH, and the barrier layer BA situated on one side of the gate electrode GE.

Then, as shown in FIGS. 53 and 54, over the gate junction layer JL, there is formed a gate electrode GE. For example, over the gate junction layer JL, as a conductive film, for example, a TiN (titanium nitride) film is deposited with a film thickness of about 200 nm using a sputtering method, or the like. Then, the TiN film is etched, thereby to form the gate electrode GE.

Then, over the barrier layer BA including over the gate electrode GE, an interlayer insulation film IL1 is formed in the same manner as in First Embodiment.

Then, contact holes C1S and C1D, and a through hole TH are formed in the interlayer insulation film IL1 in the same manner as with First Embodiment.

From the bottom surfaces of the contact holes C1S and C1D formed in the step described above, the barrier layer BA is exposed. From the bottom surface of the through hole TH, the potential fixed layer VC is exposed.

Then, as shown in FIGS. 55 and 56, over the interlayer insulation film IL1 including the insides of the contact holes C1S and C1D, and the through hole TH, there is formed a conductive film, thereby to form a source electrode SE, a drain electrode DE, a source pad SP, a drain pad (DP), and a coupling part VIA. For these, the materials described in First Embodiment are used, and the formation can be achieved in the same manner as in First Embodiment.

Then, a protective film PRO is formed over the interlayer insulation film IL1 including over the source electrode SE, the drain electrode DE, the source pad SP, and the drain pad (DP) in the same manner as in First Embodiment.

By the steps up to this point, it is possible to form the semiconductor device of the present embodiment. Incidentally, the steps described above are examples. The semiconductor device of the present embodiment may also be manufactured by other steps than the steps described above.

Fourth Embodiment

In First Embodiment, the recess gate type semiconductor device was shown as an example. However, semiconductor devices with other configurations are also acceptable. For example, as in the present embodiment, there may be used a semiconductor device not having a gate insulation film under the gate electrode.

Below, with reference to the accompanying drawings, a semiconductor device of the present embodiment will be described in details.

[Structure Description]

Figure 57:
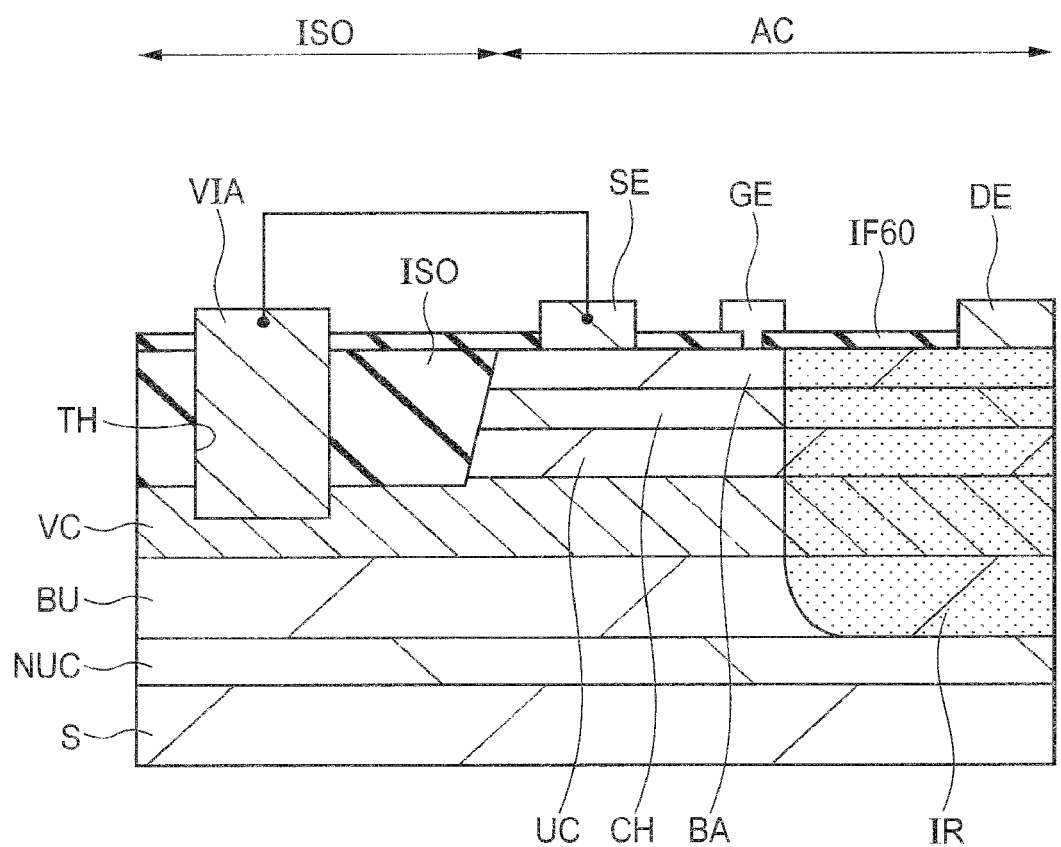
FIG. 57 is a cross sectional view schematically showing a configuration of a semiconductor device of Fourth Embodiment.

FIG. 57 is a cross sectional view schematically showing a configuration of the semiconductor device of the present embodiment. The semiconductor device (semiconductor element) of the present embodiment is a transistor using a nitride semiconductor. The semiconductor device can be used as a high electron mobility transistor (HEMT) type power transistor.

In the semiconductor device of the present embodiment, as with First Embodiment, over a substrate S, there are sequentially formed a nucleation layer NUC, a buffer layer BU, a potential fixed layer VC, a channel base layer UC, a channel layer (also referred to as an electron transit layer) CH, and a barrier layer BA. The nucleation layer NUC is formed of a nitride semiconductor layer. The buffer layer BU is formed of a single layered or multilayered nitride semiconductor layer doped with an impurity for forming a deep level in a nitride semiconductor. Herein, there is used a superlattice structure formed of a multilayer nitride semiconductor layer. The potential fixed layer VC is formed of a nitride semiconductor layer doped with an impurity to produce a p type with respect to a nitride semiconductor, and has a conductivity. The channel base layer UC is formed of a nitride semiconductor layer smaller in electron affinity than the channel layer CH, and smaller in average lattice constant in the substrate surface direction than the channel layer CH. The channel layer CH is formed of a nitride semiconductor layer larger in electron affinity than the channel base layer UC. The barrier layer BA is formed of a nitride semiconductor layer smaller in electron affinity than the channel layer CH, and smaller in electron affinity than the channel base layer UC.

The semiconductor device of the present embodiment has the gate electrode GE formed over the barrier layer BA, and the source electrode SE and the drain electrode DE formed over the barrier layer BA on the opposite sides of the gate electrode GE, respectively. The semiconductor device is formed in the active region AC defined by the isolation regions ISO.

On the channel layer CH side in the vicinity of the interface between the channel layer CH and the barrier layer BA, there is generated a two-dimensional electron gas (2DEG). By applying the gate electrode GE with a prescribed potential, it is possible to eliminate the two-dimensional electron gas (2DEG), resulting in the OFF state.

Herein, in the present embodiment, in the isolation region ISO, there is provided a coupling part (also referred to as a via) VIA penetrating through the isolation region ISO, and reaching the underlying potential fixed layer VC. The coupling part VIA is electrically coupled with the source electrode SE. Thus, the potential fixed layer VC is provided, and coupled with the source electrode SE. As a result, it is possible to reduce the fluctuations in characteristics such as the threshold potential and the ON resistance.

Further, in the present embodiment, an inactivated region IR is provided between the gate electrode GE and the drain electrode DE. The inactivated region IR reaches the potential fixed layer VC in the depth direction. Thus, the potential fixed layer VC doped with an impurity to produce a p type situated between the gate electrode GE and the drain electrode DE is inactivated by doping of an inactivating element, resulting in the inactivated region IR. As a result, it is possible to improve the drain breakdown voltage.

Figure 58:
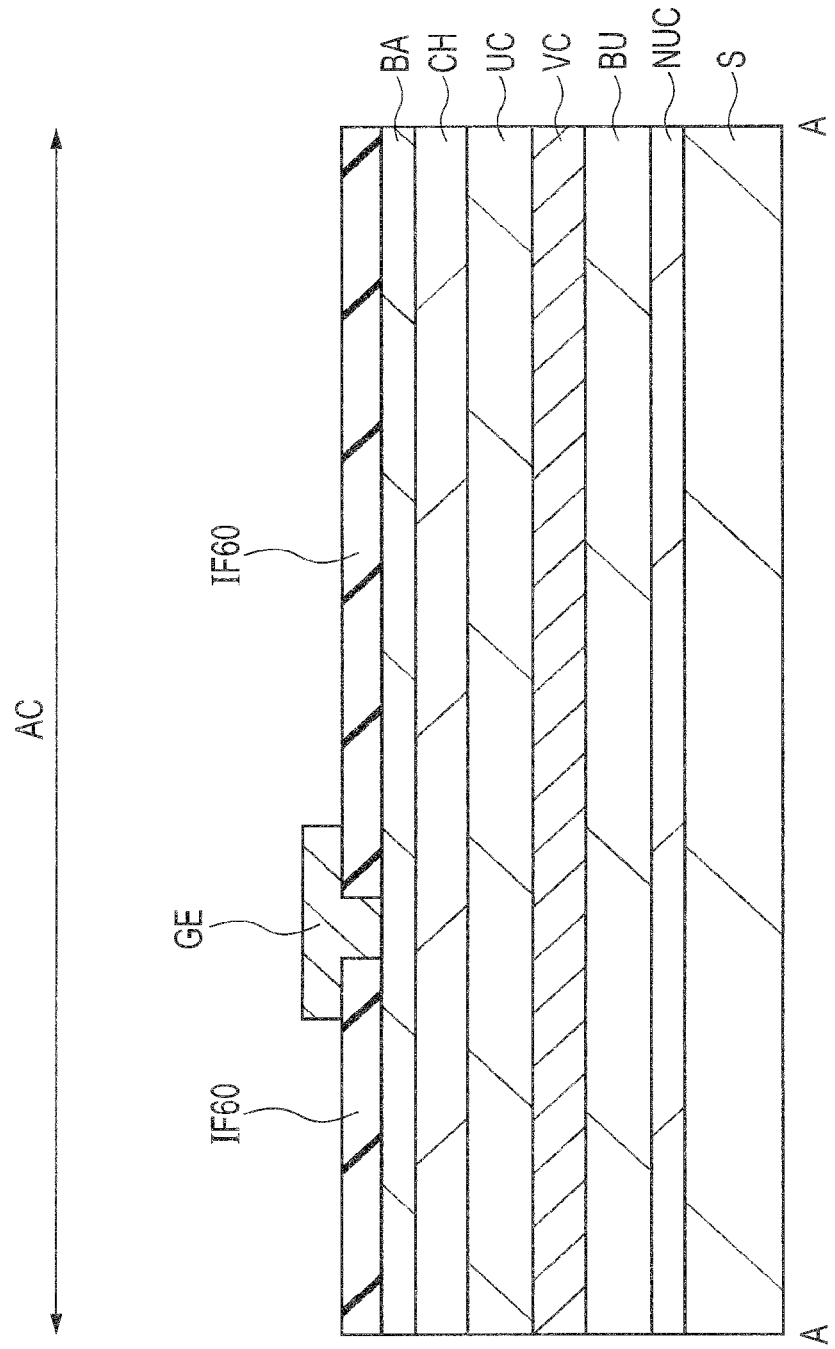
FIG. 58 is a cross sectional view showing the semiconductor device of Fourth Embodiment during a manufacturing step.
Figure 59:
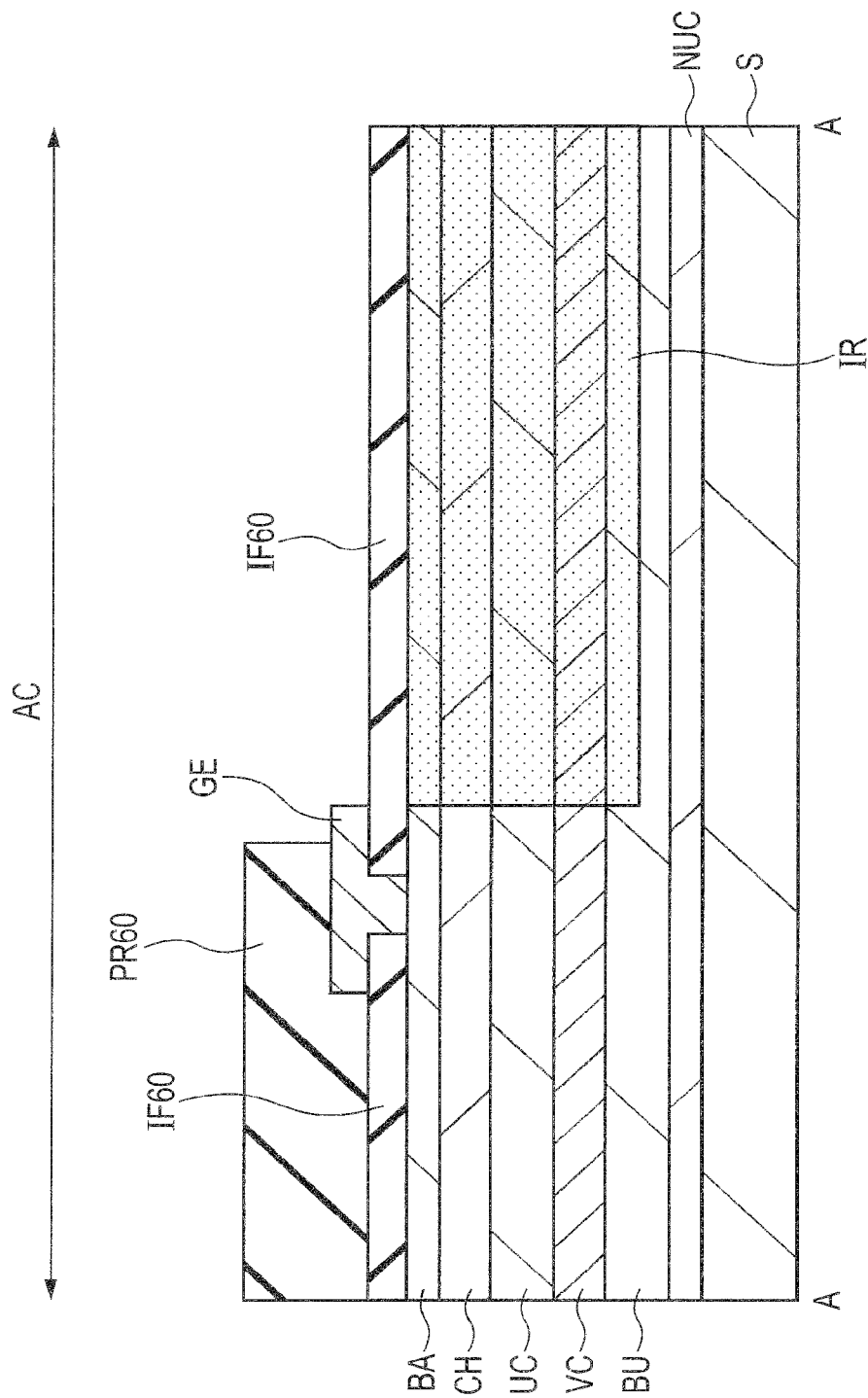
FIG. 59 is a cross sectional view showing the semiconductor device of Fourth Embodiment during a manufacturing step, and showing the manufacturing step following FIG. 58.
Figure 60:
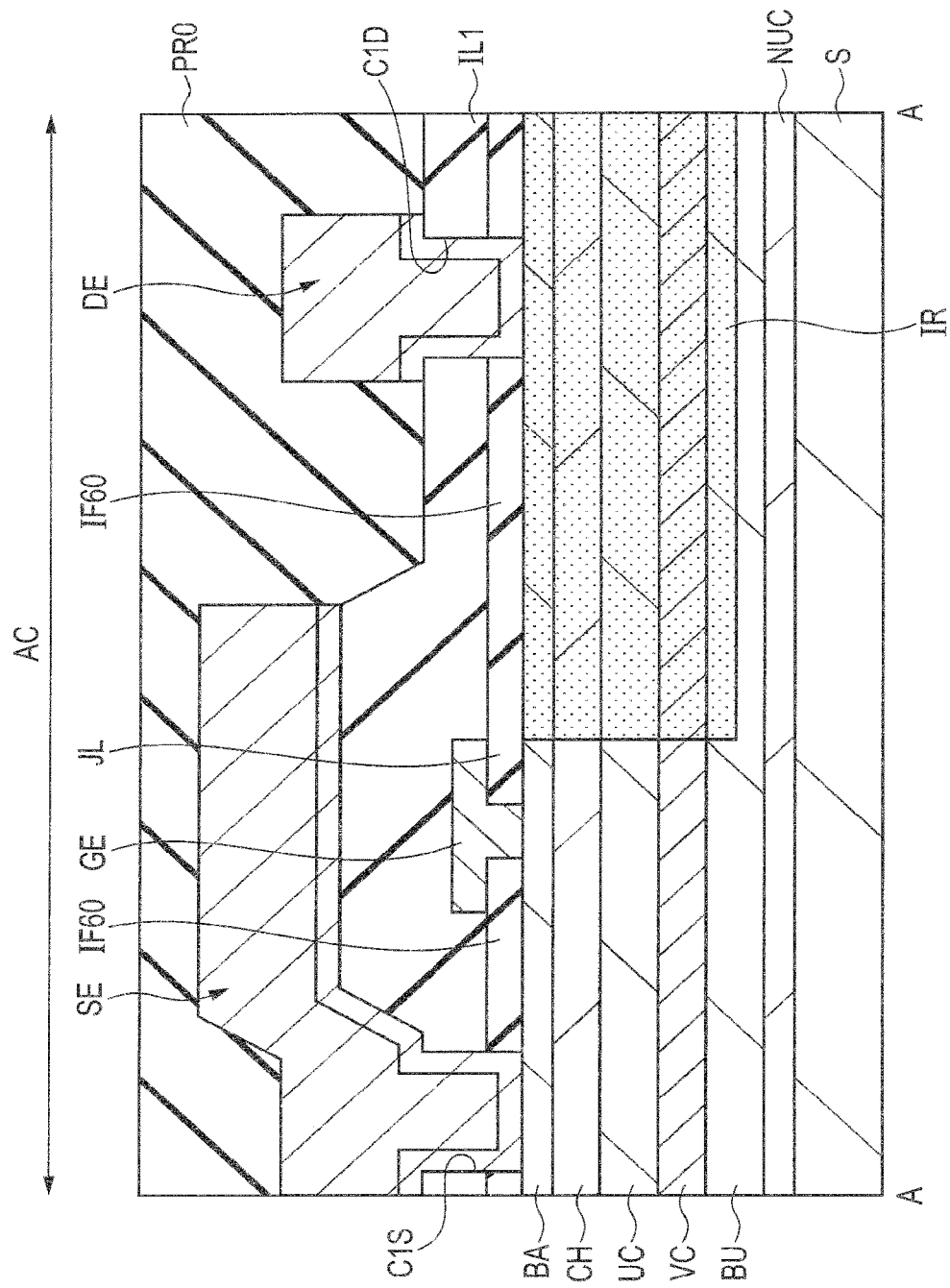
FIG. 60 is a cross sectional view showing the semiconductor device of Fourth Embodiment during a manufacturing step, and showing the manufacturing step following FIG. 59.

FIGS. 58 to 60 are each a cross sectional view showing the semiconductor device of the present embodiment during a manufacturing step. With reference to FIG. 60 which is a cross sectional view showing the final step of FIGS. 58 to 60, a description will be further given to the semiconductor device of Fourth Embodiment. Incidentally, the plan view of the semiconductor device of the present embodiment is the same as that of First Embodiment (FIG. 2), except for the trench (T or GLT). For example, FIG. 60 corresponds to the A-A cross section of FIG. 2. Further, the configuration of the present embodiment is the same as that of First Embodiment, except for the gate electrode part. For this reason, a detailed description on the same configuration as that of First Embodiment will be omitted.

As shown in FIG. 60, in the semiconductor device of the present embodiment, over a substrate S, there are sequentially formed a nucleation layer NUC, a buffer layer BU, a potential fixed layer VC, a channel base layer UC, a channel layer (also referred to as an electron transit layer) CH, and a barrier layer BA. Then, the semiconductor device of the present embodiment has a gate electrode GE formed over the barrier layer BA, and a source electrode SE and a drain electrode DE formed over the barrier layer BA on the opposite sides of the gate electrode GE, respectively. The semiconductor device is formed in an active region AC defined by the element isolation regions (ISO). Under the drain electrode DE, there is arranged a contact hole C1D serving as a coupling part between the drain electrode DE and the barrier layer BA. Under the source electrode SE, there is arranged a contact hole C1S serving as a coupling part between the source electrode SE and the barrier layer BA. Further, the drain electrode DE is coupled with the drain pad DP, and the source electrode SE is coupled with the source pad SP. Whereas, the gate electrode GE is coupled with the gate line GL (see FIG. 2).

Herein, the source electrode SE, the drain electrode DE, and the gate electrode GE are mainly arranged over the active region AC surrounded by the isolation regions ISO. On the other hand, the drain pad DP, the gate line GL, and the source pad SP are arranged over the isolation region ISO (see FIG. 2). Further, also in the present embodiment, as with First Embodiment, under the source pad SP, there is arranged a coupling part VIA (through hole TH).

Further, over the gate electrode GE, there is arranged an interlayer insulation film IL1. Over the source electrode SE and the drain electrode DE, there is arranged a protective film (also referred to as an insulation film, a covering film, or a surface protective film) PRO.

Further, in the present embodiment, an inactivated region IR is provided between the gate electrode GE and the drain electrode DE. The inactivated region IR reaches the potential fixed layer VC in the depth direction. Thus, the potential fixed layer VC doped with an impurity to produce a p type situated between the gate electrode GE and the drain electrode DE is inactivated by doping of an inactivating element, resulting in the inactivated region IR. As a result, it is possible to improve the drain breakdown voltage.

The p type potential fixed layer VC situated between the gate electrode GE and the drain electrode DE contains an inactivating element. Then, the content of the inactivating element in the p type potential fixed layer VC situated between the gate electrode GE and the drain electrode DE is larger than the content of the inactivating element in the p type potential fixed layer VC situated under the source electrode SE. The inactivating element is, for example, hydrogen (H) or fluorine (F). The activation ratio of the inactivated region IR is smaller than, and is preferably set at $\frac{1}{10}$ or less the activation ratio of the region under the source electrode SE.

Respective constituent materials for the substrate S, the nucleation layer NUC, the buffer layer BU, the potential fixed layer VC, the channel base layer UC, the channel layer (also referred to as an electron transit layer) CH, and the barrier layer BA are as described in First Embodiment.

Whereas, respective constituent materials for the gate electrode GE, the interlayer insulation film IL1, and the protective film PRO are as described in First Embodiment.

Whereas, respective constituent materials for the source electrode SE, the drain electrode DE, the source pad SP, the drain pad DP, and the coupling part VIA are as described in First Embodiment.

[Manufacturing Method Description]

Then, with reference to FIGS. 58 to 60, a description will be given to a method for manufacturing the semiconductor device of the present embodiment. In addition, the configuration of the semiconductor device will be made clearer.

As shown in FIG. 58, over a substrate S, there are sequentially formed a nucleation layer NUC and a buffer layer BU. For these, the materials described in First Embodiment are used. Thus, the formation can be achieved in the same manner as in First Embodiment.

Then, over the buffer layer BU, as a potential fixed layer VC, for example, a gallium nitride layer (p-GaN layer) containing a p type impurity is epitaxially grown using the metal organic chemical vapor deposition method, or the like. For example, as a p type impurity, there is used magnesium (Mg). For example, while doping magnesium (Mg), a gallium nitride layer is deposited about 200 nm in thickness. The Mg concentration in the deposited film is set at, for example, about $5 \times 10^{18}$ (5E18) cm$^{-3}$.

Then, over the potential fixed layer VC, there are sequentially formed a channel base layer UC, a channel layer CH, and a barrier layer BA. For these, the materials described in First Embodiment are used. Thus, the formation can be achieved in the same manner as in First Embodiment.

Then, over the barrier layer BA, as an insulation film IF60, a silicon nitride film is deposited using a sputtering method, or the like. Then, the insulation film IF60 is provided therein with an opening. Over the insulation film IF60 including the inside of the opening, there is formed a gate electrode GE. The gate electrode GE can be formed in the same manner as in First Embodiment.

Then, as shown in FIG. 59, an inactivating element is ion implanted, thereby to form an inactivated region IR. For example, using a photolithography technology, there is formed a photoresist film PR60 having an opening in the formation region of the inactivated region IR. Using the photoresist film PR60 as a mask, an inactivating element is implanted into the potential fixed layer VC on one side of the gate electrode GE (on the right side in FIG. 59, or the drain electrode side). As a result, there is formed the inactivated region IR. Incidentally, herein, in consideration of diffusion of the inactivating element, there is shown the state in which an inactivating element is implanted into the lamination part of the potential fixed layer VC, the channel base layer UC, the channel layer CH, and the barrier layer BA situated on one side of the gate electrode GE.

Then, as shown in FIG. 60, over the barrier layer BA including over the gate electrode GE, an interlayer insulation film IL1 is formed in the same manner as in First Embodiment.

Then, contact holes C1S and C1D, and the like are formed in the interlayer insulation film IL1 in the same manner as in First Embodiment. Then, over the interlayer insulation film IL1 including the insides of the contact holes C1S and C1D, there is formed a conductive film. As a result, there are formed a source electrode SE, a drain electrode DE, and the like (see FIG. 2). For these, the materials described in First Embodiment are used. Thus, the formation can be achieved in the same manner as in First Embodiment.

Then, a protective film PRO is formed over the interlayer insulation film IL1 including the source electrode SE, the drain electrode DE, and the like in the same manner as in First Embodiment.

By the steps up to this point, it is possible to form the semiconductor device of the present embodiment. Incidentally, the steps described above are examples. The semiconductor device of the present embodiment may also be manufactured by other steps than the steps described above.

Fifth Embodiment

In First Embodiment, in the isolation region ISO, there was provided the coupling part VIA. However, in the active region AC, there may be provided the coupling part VIA. For example, in the present embodiment, under the source electrode SE, there is provided the coupling part VIA.

Below, with reference to the accompanying drawings, a semiconductor device of the present embodiment will be described in details. Incidentally, the same configuration as that of First Embodiment will not be described.

Figure 61:
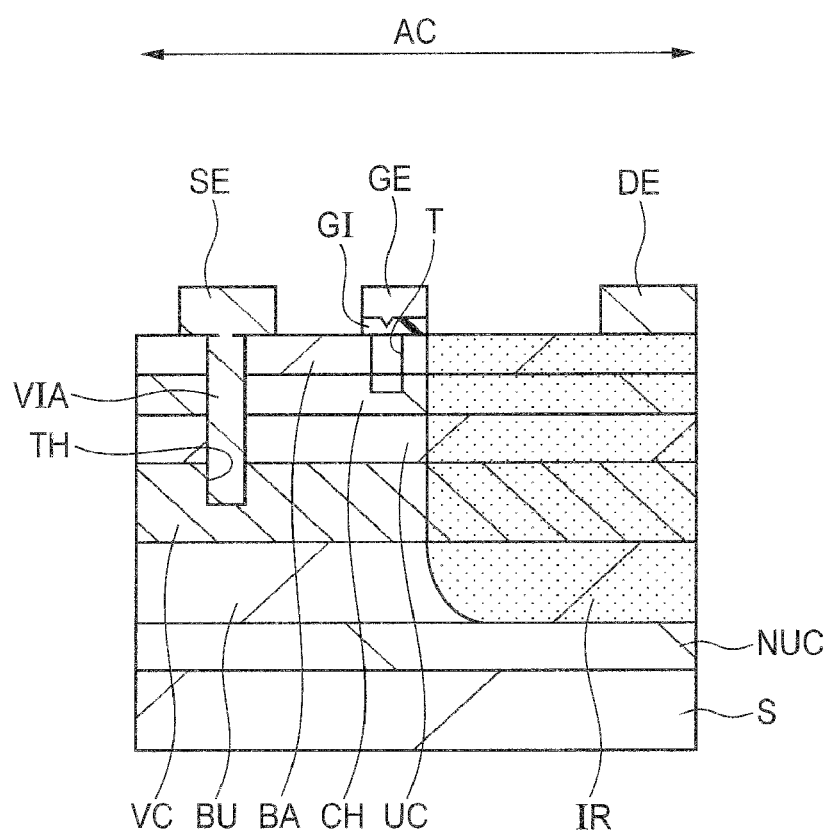
FIG. 61 is a cross sectional view schematically showing a configuration of a semiconductor device of Fifth Embodiment.
Figure 62:
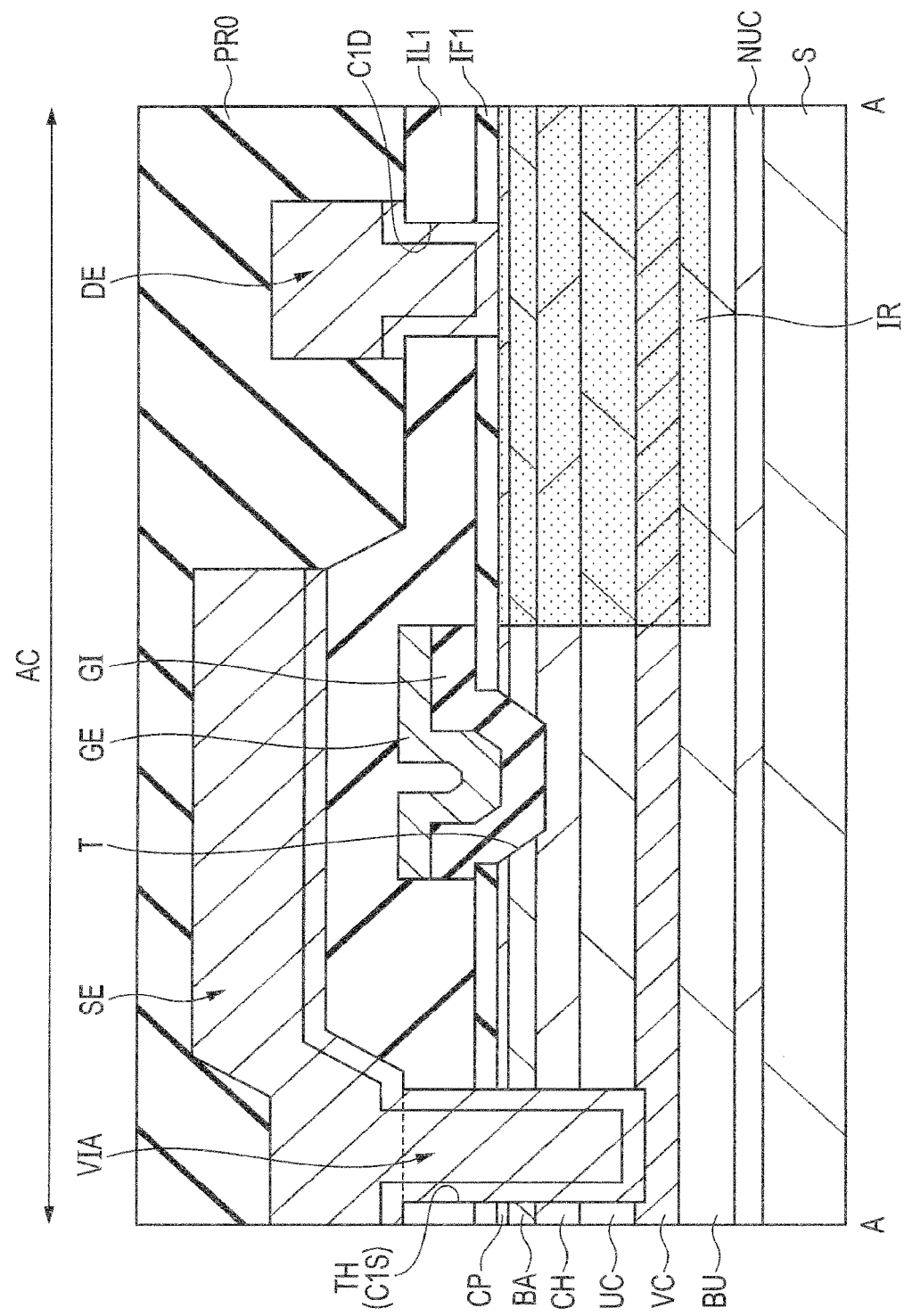
FIG. 62 is a cross sectional view showing a configuration of the semiconductor device of Fifth Embodiment.
Figure 63:
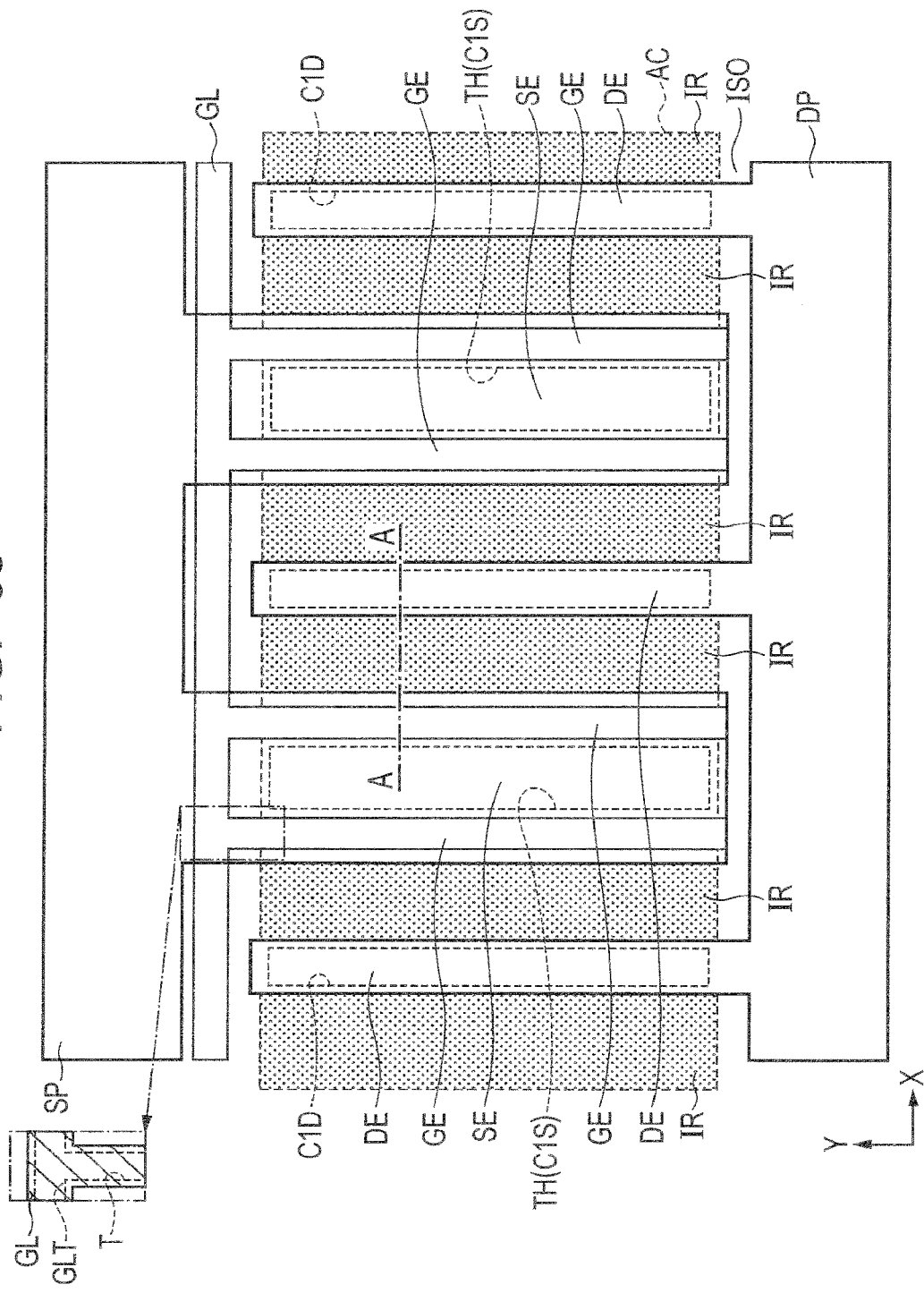
FIG. 63 is a plan view showing a configuration of the semiconductor device of Fifth Embodiment.

FIG. 61 is a cross sectional view schematically showing a configuration of the semiconductor device of the present embodiment. FIG. 62 is a cross sectional view showing a configuration of the semiconductor device of the present embodiment. FIG. 63 is a plan view showing a configuration of the semiconductor device of the present embodiment. The semiconductor device (semiconductor element) of the present embodiment is a MIS type field effect transistor using a nitride semiconductor. The semiconductor device can be used as a high electron mobility transistor (HEMT) type power transistor. The semiconductor device of the present embodiment is a so-called recess gate type semiconductor device.

In the semiconductor device of the present embodiment, as shown in FIGS. 61 to 63, under the source electrode SE in the active region AC, there is provided a coupling part (also referred as a via) VIA penetrating through the barrier layer BA, the channel layer CH, and the channel base layer UC, and the underlying potential fixed layer VC. The coupling part VIA is electrically coupled with the source electrode SE. Thus, the potential fixed layer VC is provided, and is coupled with the source electrode SE. As a result, as described in First Embodiment, it is possible to reduce the fluctuations in characteristics such as the threshold potential and the ON resistance. Further, the coupling part VIA is arranged in the active region AC in which electrons are conducted. For this reason, it is possible to fix the potential more effectively (see FIG. 63).

Further, in the present embodiment, an inactivated region IR is provided between the gate electrode GE and the drain electrode DE. The inactivated region IR reaches the potential fixed layer VC in the depth direction. Thus, the potential fixed layer VC doped with an impurity to produce a p type situated between the gate electrode GE and the drain electrode DE is inactivated by doping of an inactivating element, resulting in the inactivated region IR. As a result, it is possible to improve the drain breakdown voltage.

Figure 64A:
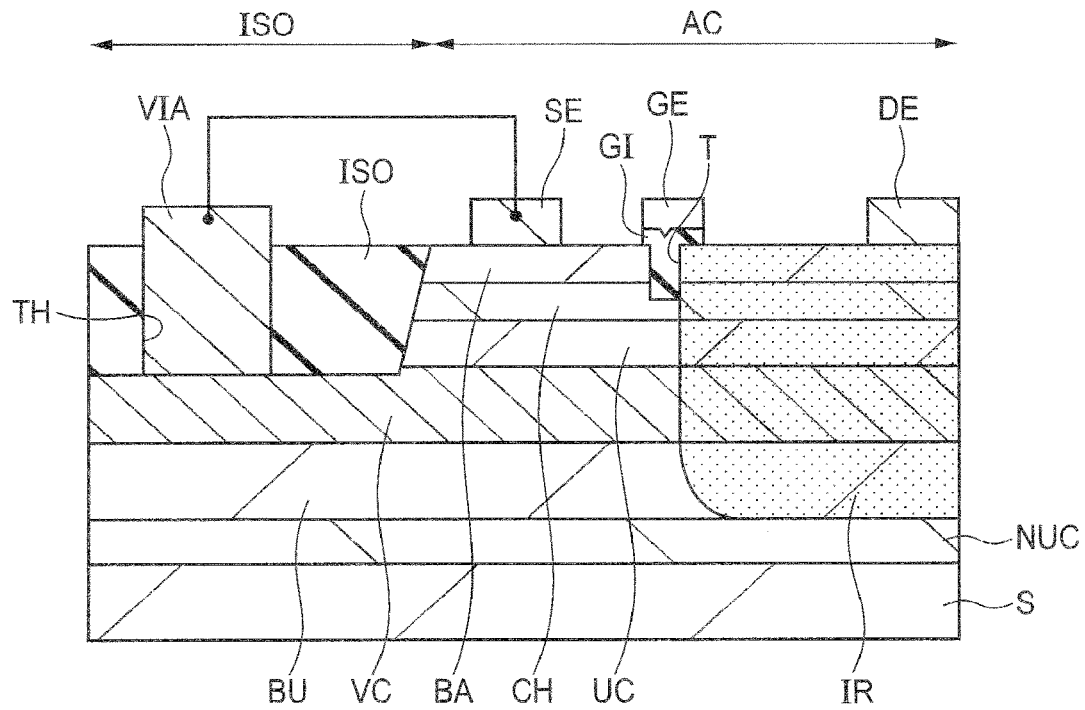
FIGS. 64A and 64B are cross sectional views schematically showing other configurations of the semiconductor device of Fifth Embodiment.
Figure 64B:
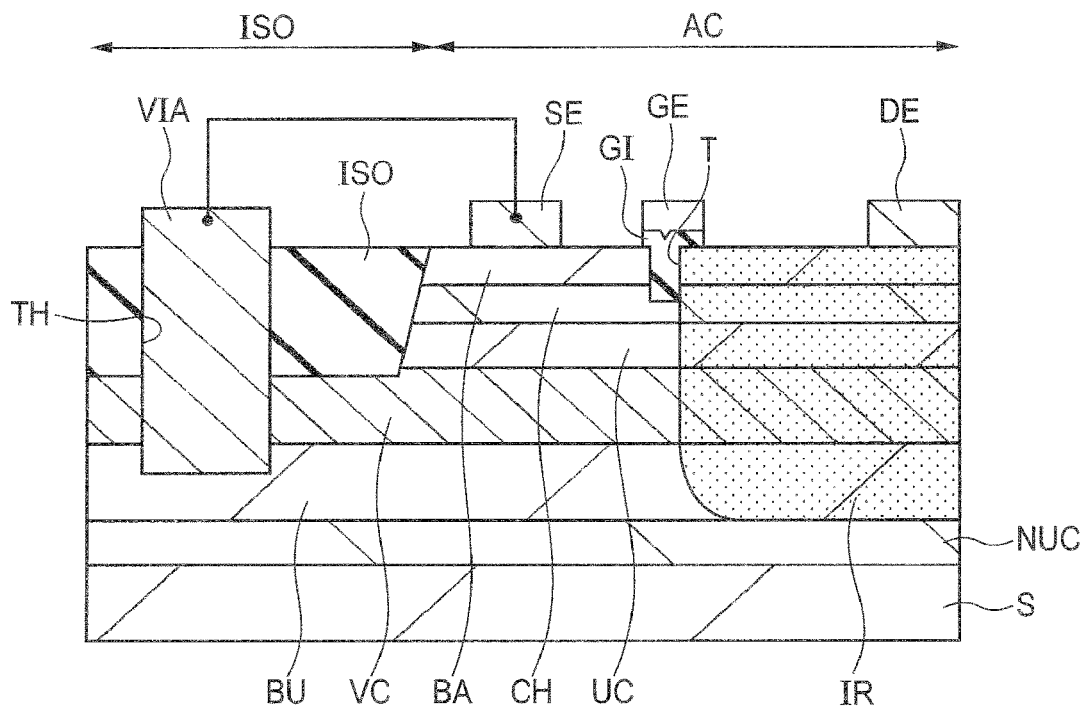

FIGS. 64A and 64B are cross sectional views schematically showing other configurations of the semiconductor device of the present embodiment. As shown in FIG. 64A, the following configuration is also acceptable: the bottom surface of the through hole TH is arranged at the top surface of the potential fixed layer VC; and the bottom of the coupling part VIA and the potential fixed layer VC are in contact with each other. Whereas, as shown in FIG. 64B, the following configuration is also acceptable: the bottom surface of the through hole TH in which the coupling part VIA is arranged, is arranged below the bottom surface of the potential fixed layer VC; and a part of the side surface of the coupling part VIA is in contact with the potential fixed layer VC. Thus, it is essential only that the coupling part VIA is arranged in such a manner as to be in contact with the potential fixed layer VC.

The semiconductor device of the present embodiment (FIGS. 61 and 64) can be formed by the same steps as those in First Embodiment, except for only changing the position or depth of the through hole TH.

Figure 65:
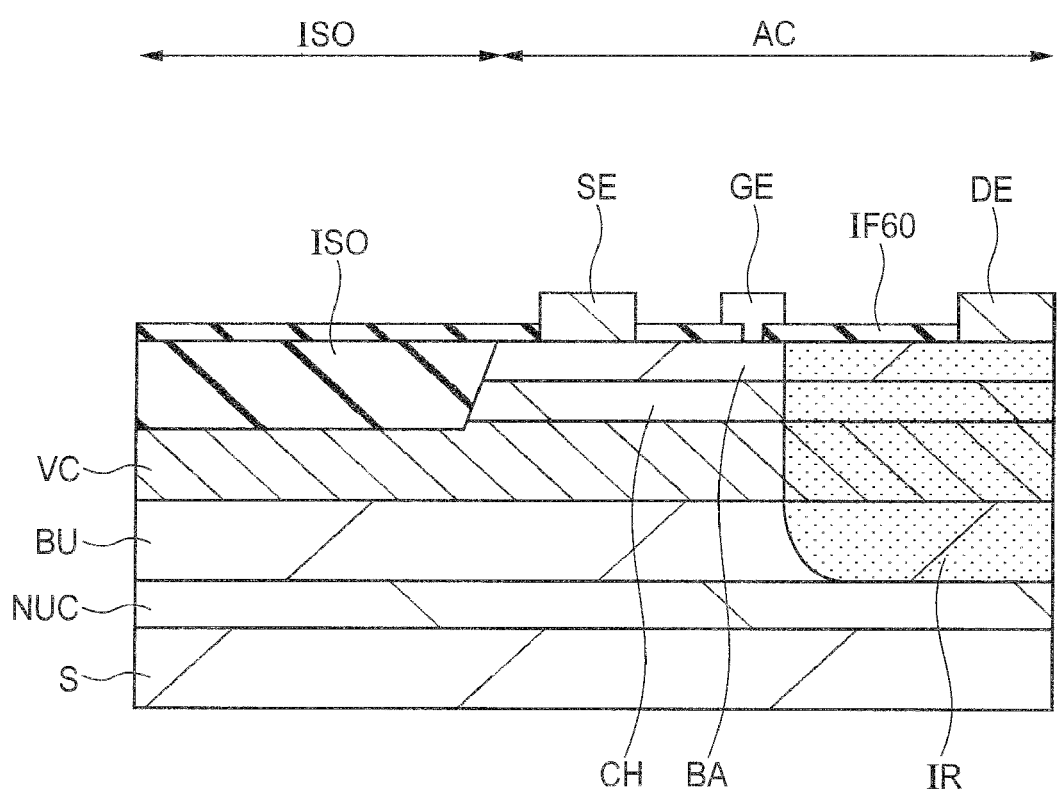
FIG. 65 is across sectional view schematically showing another configuration of the semiconductor device of Fifth Embodiment.

FIG. 65 is across sectional view schematically showing another configuration of the semiconductor device of the present embodiment. The semiconductor device shown in FIG. 65 is obtained by omitting the configuration of the channel base layer UC and the coupling part VIA from the semiconductor device shown in FIG. 57. Thus, the channel base layer UC and the coupling part VIA may be omitted (the same also applies to First Embodiment and the like). Whereas, in First Embodiment, or the like, as the potential fixed layer VC, a GaN layer was used, but an AlGaN layer may also be used. When an AlGaN layer is used as the channel base layer UC, the potential fixed layer VC and the channel base layer UC are formed of the same material. However, the potential fixed layer VC is doped with an impurity.

Up to this point, the invention completed by the present inventors was specifically described by way of embodiments. However, it is naturally understood that the present invention is not limited to the embodiments, and may be variously changed within the scope not departing from the gist thereof. For example, the configuration obtained by omitting the coupling part VIA described in Applied Example 3 of First Embodiment may be applied to the semiconductor devices of Second to Fourth Embodiments. Whereas, the coupling part VIA of First or Second Embodiment may be arranged under the source electrode SE in the active region AC as described in Fifth Embodiment. Further, the position of the bottom surface of the coupling part VIA of First or Second Embodiment may be changed as described in Fifth Embodiment. Alternatively, other than these, various combinations are possible in the configuration or the manufacturing step of each site described in each embodiment.

What is claimed is:

1. A semiconductor device, comprising:
a first nitride semiconductor layer formed over a substrate, and containing a p type impurity;
a second nitride semiconductor layer formed over the first nitride semiconductor layer;
a third nitride semiconductor layer formed over the second nitride semiconductor layer;
a fourth nitride semiconductor layer formed over the third nitride semiconductor layer;
a fifth nitride semiconductor layer formed over the fourth nitride semiconductor layer;
a gate electrode formed over the fifth nitride semiconductor layer; and
a first electrode and a second electrode formed over the fourth nitride semiconductor layer on the opposite sides of the gate electrode, respectively,
wherein the electron affinity of the third nitride semiconductor layer is larger than the electron affinity of the second nitride semiconductor layer,
wherein the electron affinity of the fourth nitride semiconductor layer is smaller than the electron affinity of the second nitride semiconductor layer,
wherein the first nitride semiconductor layer has an inactivated region between the gate electrode and the second electrode,
wherein the inactivated region is a region containing an inactivating element.

2. The semiconductor device according to claim 1,
wherein the inactivating element is hydrogen or fluorine.

3. The semiconductor device according to claim 1,
wherein the first nitride semiconductor layer is of a p type, and contains magnesium as a p type impurity.

4. The semiconductor device according to claim 3,
wherein the inactivating element is hydrogen.

5. The semiconductor device according to claim 1, having a coupling part for establishing a coupling between the first electrode and the first nitride semiconductor layer.

6. The semiconductor device according to claim 5,
wherein the substrate has a first region and a second region,
wherein the gate electrode, the first electrode, and the second electrode are formed in the first region,
wherein the second region is an element isolation region formed in the fourth nitride semiconductor layer and the third nitride semiconductor layer, and
wherein the coupling part is arranged in the inside of a through hole penetrating through the element isolation region, and the second nitride semiconductor layer, and reacting the first nitride semiconductor layer.

7. The semiconductor device according to claim 5, having a superlattice layer between the substrate and the first nitride semiconductor layer,
wherein the superlattice layer includes two or more laminates each of a sixth nitride semiconductor layer, and a seventh nitride semiconductor layer different in electron affinity from the fifth nitride semiconductor layer repeatedly arranged therein.

8. The semiconductor device according to claim 1,
wherein the fifth nitride semiconductor layer is of a p type, and contains magnesium as a p type impurity.

9. A method for manufacturing a semiconductor device, comprising the steps of:
(a) forming a first nitride semiconductor layer containing a p type impurity over a substrate,
(b) forming a second nitride semiconductor layer over the first nitride semiconductor layer,
(c) forming a third nitride semiconductor layer over the second nitride semiconductor layer,
(d) forming a fourth nitride semiconductor layer over the third nitride semiconductor layer,
(e) forming a fifth nitride semiconductor layer over the fourth nitride semiconductor layer,
(f) forming a gate electrode over the fifth nitride semiconductor layer,
(g) introducing an inactivating element into the first nitride semiconductor layer situated on one side of the gate electrode, and
(h) forming a first electrode over the fourth nitride semiconductor layer on the other side of the gate electrode, and forming a second electrode over the fourth nitride semiconductor layer on the one side of the gate electrode,
wherein the electron affinity of the third nitride semiconductor layer is larger than the electron affinity of the second nitride semiconductor layer, and
wherein the electron affinity of the fourth nitride semiconductor layer is smaller than the electron affinity of the second nitride semiconductor layer.

10. The method for manufacturing a semiconductor device according to claim 9,
wherein the inactivating element is hydrogen or fluorine.

11. The method for manufacturing a semiconductor device according to claim 9,
wherein the first nitride semiconductor layer is of a p type, and contains magnesium as a p type impurity.

12. The method for manufacturing a semiconductor device according to claim 11,
wherein the inactivating element is hydrogen.

* * * * *